United States Patent [19]
Buerger, Jr.

[11] Patent Number: 5,471,087
[45] Date of Patent: Nov. 28, 1995

[54] SEMI-MONOLITHIC MEMORY WITH HIGH-DENSITY CELL CONFIGURATIONS

[76] Inventor: Walter R. Buerger, Jr., 20769 Mesarica Rd., Covina, Calif. 91724

[21] Appl. No.: 375,383

[22] Filed: Jan. 17, 1995

Related U.S. Application Data

[63] Continuation-in-part of Ser. No. 265,329, Jun. 24, 1994, abandoned, which is a continuation-in-part of Ser. No. 105,464, Aug. 9, 1993, abandoned, which is a continuation-in-part of Ser. No. 769,850, Oct. 2, 1991, abandoned.

[51] Int. Cl.$^6$ .................................................. H01L 27/02
[52] U.S. Cl. .................. 257/532; 257/209; 257/529; 257/910; 365/96; 365/102; 365/103; 365/105; 365/149; 365/175; 365/187
[58] Field of Search ................... 365/149, 102, 365/103, 105, 175, 187, 96; 257/910, 306, 202, 208, 209, 529, 530, 532

[56] References Cited

U.S. PATENT DOCUMENTS

| | | | |
|---|---|---|---|
| 1,184,800 | 1/1965 | Ratsch | 365/175 |
| 3,387,286 | 6/1968 | Dennard | 340/173 |
| 4,672,410 | 6/1987 | Miura et al. | 357/23.6 |
| 4,683,486 | 7/1987 | Chatterjee | 357/23.6 |
| 4,739,134 | 4/1988 | Kogyo | 365/149 |
| 4,943,841 | 7/1990 | Yahara | 257/208 |

OTHER PUBLICATIONS

Richard C. Jaeger, Modular Series on Solid State Devices, vol. 5, pp. 136–138, Feb. 1990, Reading, Mass. (See Supplement BR for expansion).

(No Author), Tele-Tech & Electronic Industries, pp. 85 & 138–141, Nov. 1953, Bristol, Conn. (See Supplement AR for Expansion).

Shah et al, IEEE Journal of Solid State Circuits, pp. 618–626, Oct. 1986, New York, N.Y. (See Supplement AS for Expansion).

Banerjee et al, IEEE Transactions on Electron Devices, pp. 108–116, Jan. 1988, New York, N.Y. (See Supplement AT for Expansion).

*Primary Examiner*—Ngân V. Ngô

[57] ABSTRACT

A memory is formed from an array of switchless integrated circuit memory cells in a high-density configuration. These cells comprise a capacitor and two diodes in a configuration where one diode is used to charge one pole of the capacitor, and the other diode is used to discharge it from that same pole, over separate paired lines used respectively for charging and discharging, as well as reading. The other pole of the capacitor is tied to a single line used for both charging and discharging, and in support of reading. Drive and sense circuitry located at the periphery of the cell array is used to perform interconnect switching functions while writing or reading charges on cells in the array. Alternative high-density switched cell variations are also described. The cell arrays are fabricated on monolithic integrated circuits which are interconnected with one another by using a method which deposits and etches conductive material which links conductive traces between the monolithic dice. A method for excising and bypassing faults which occur during the fabrication process is provided.

10 Claims, 36 Drawing Sheets

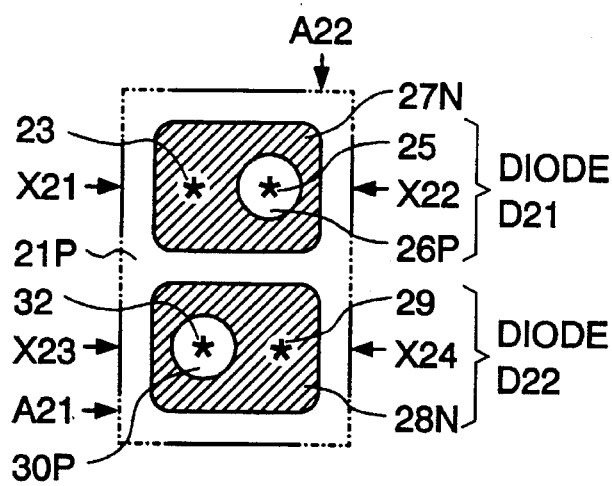
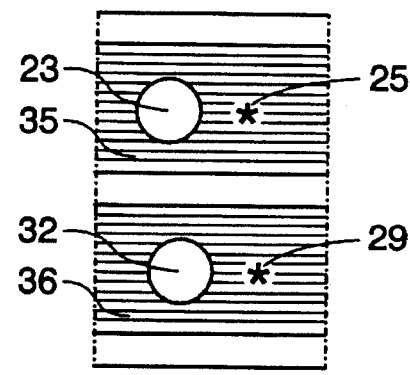
Fig. 2a  Fig. 2b
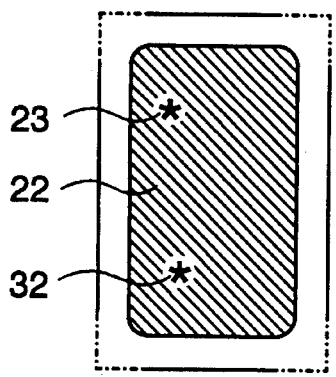
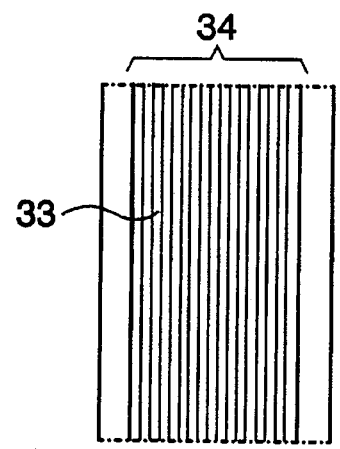
Fig. 2c  Fig. 2d
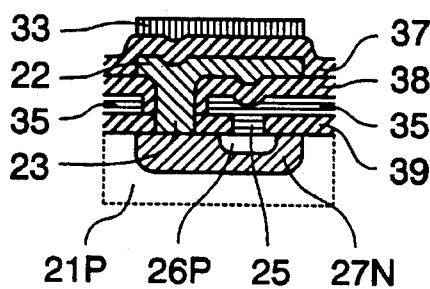
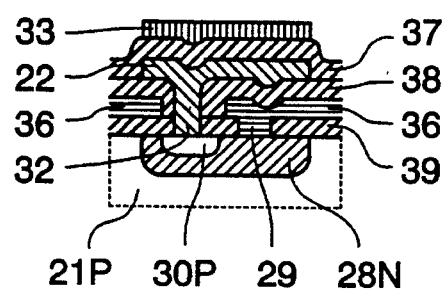
Fig. 2e  Fig. 2f

X111 →                    ← X112

111    112    114

113

Fig. 7a
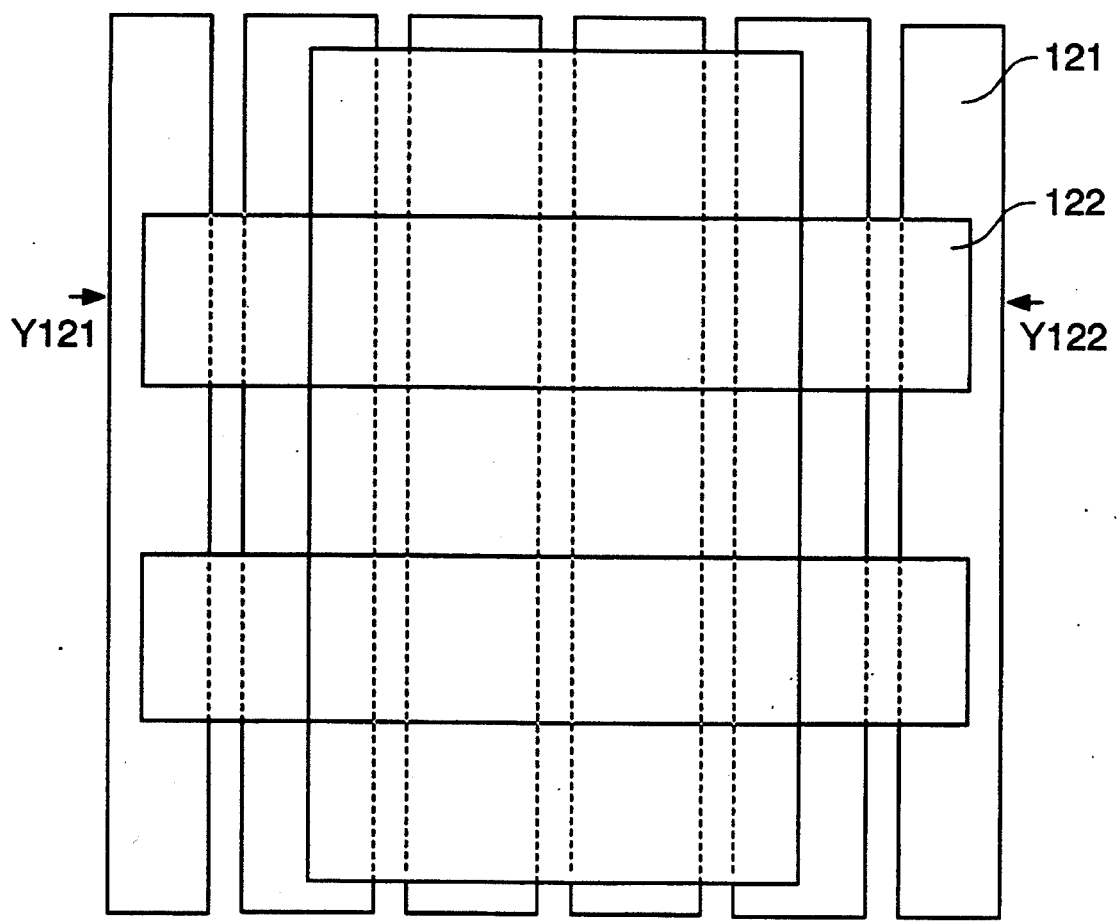
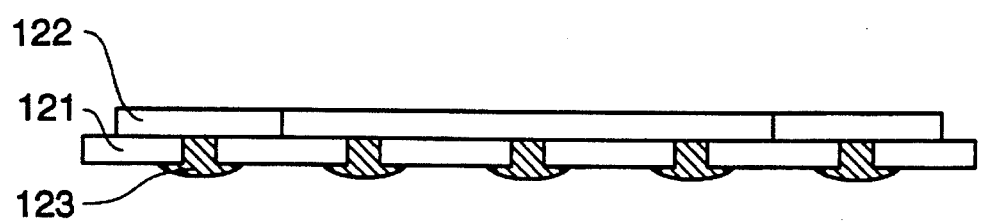
Fig. 7b

Fig. 8a
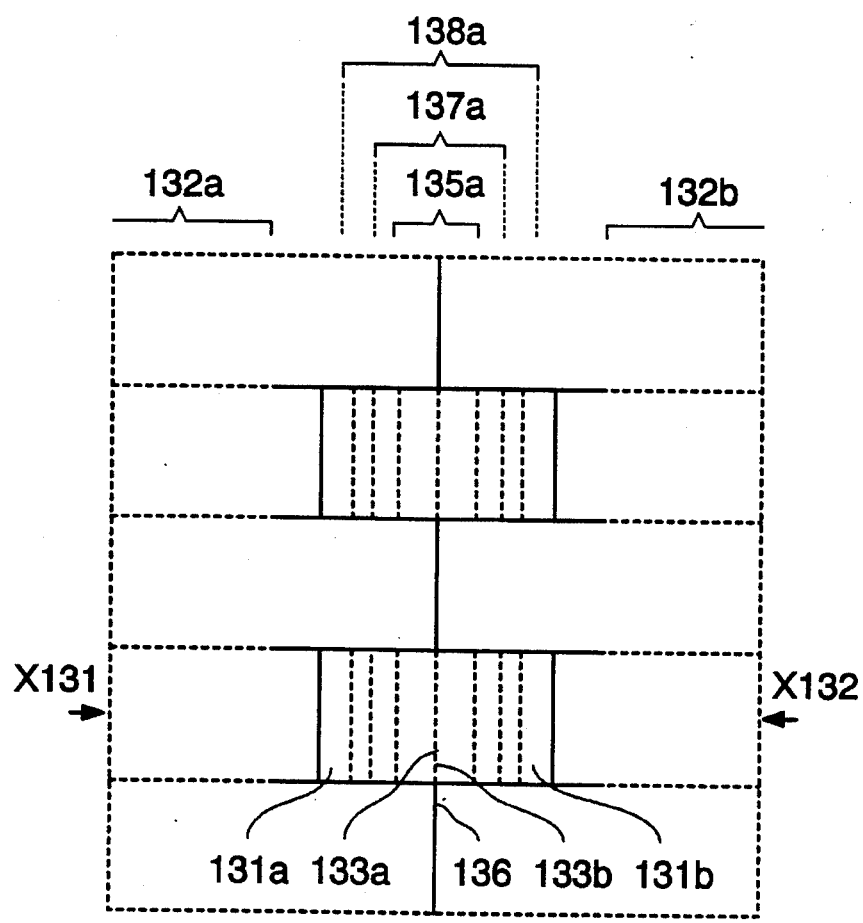
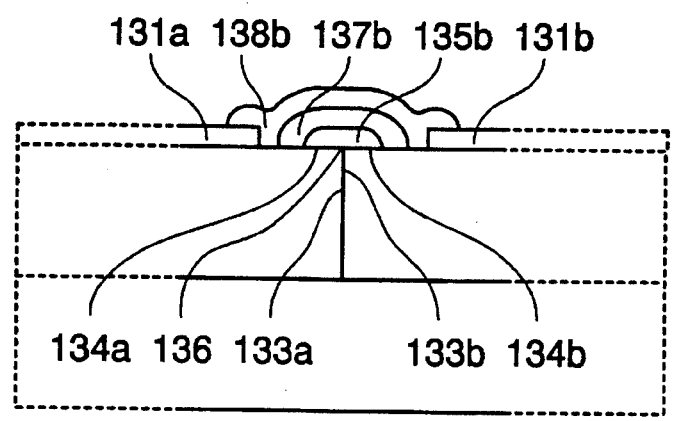
Fig. 8b

Fig. 12a
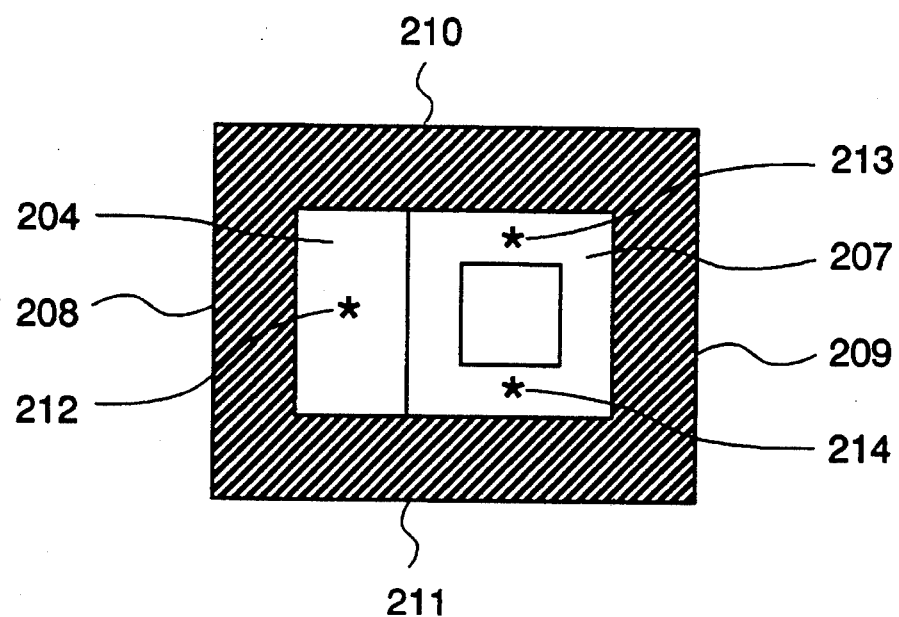
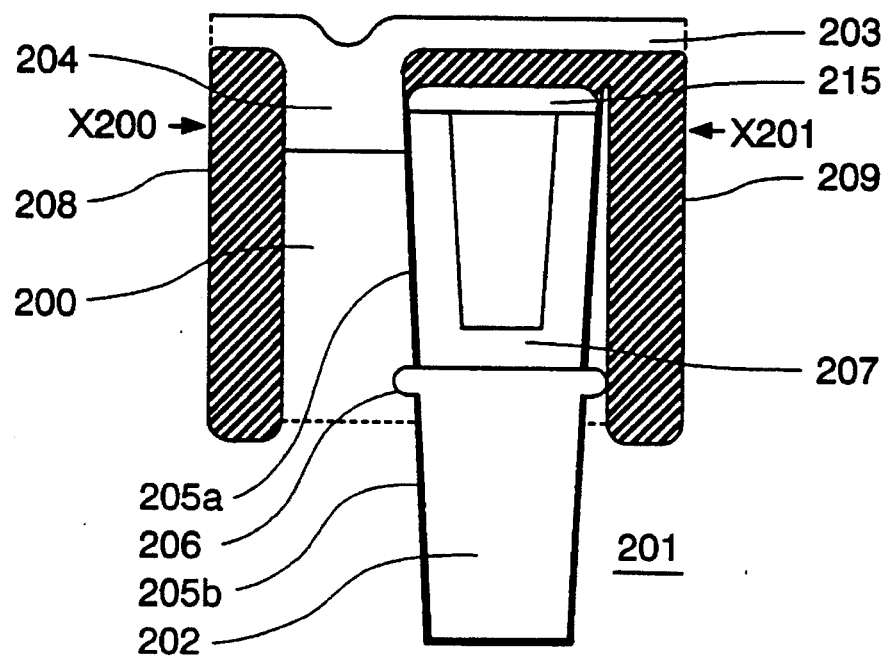
Fig. 12b

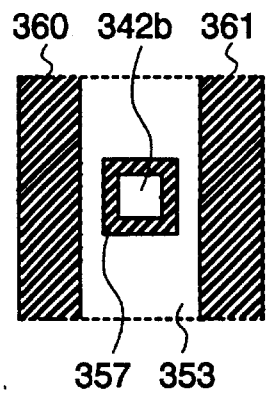
Fig. 13a
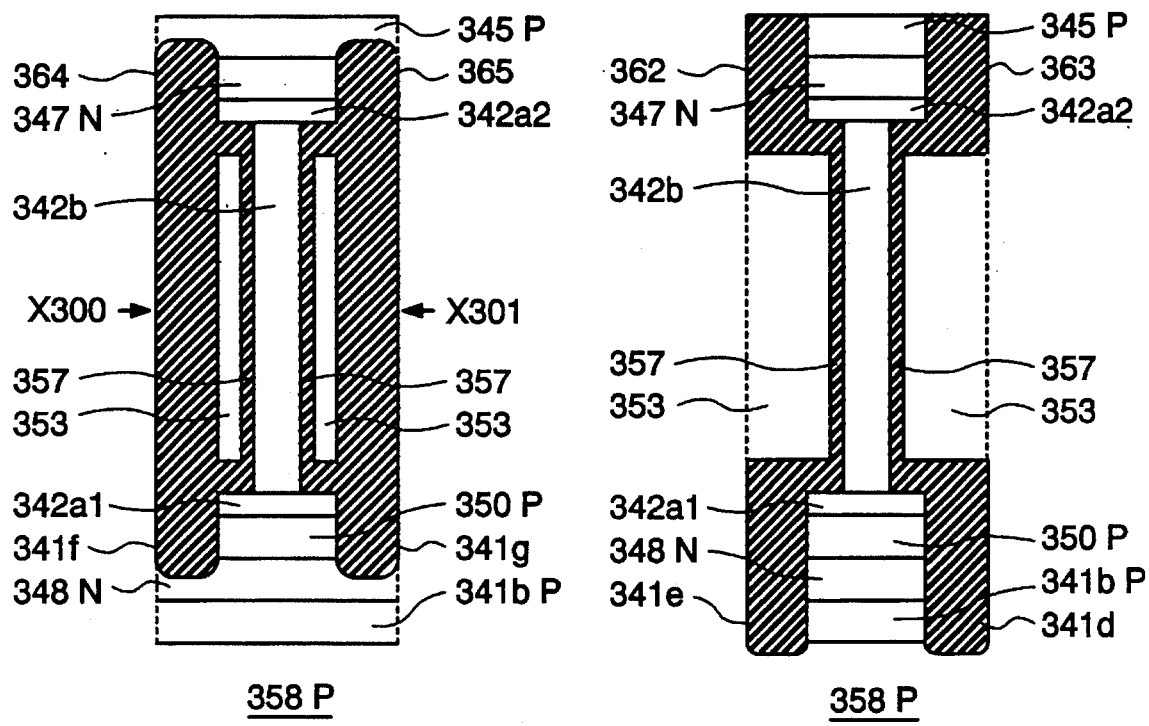
Fig. 13b
Fig. 13c

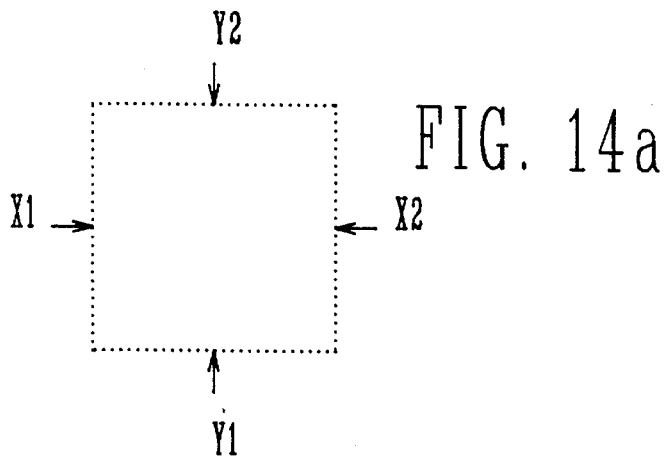
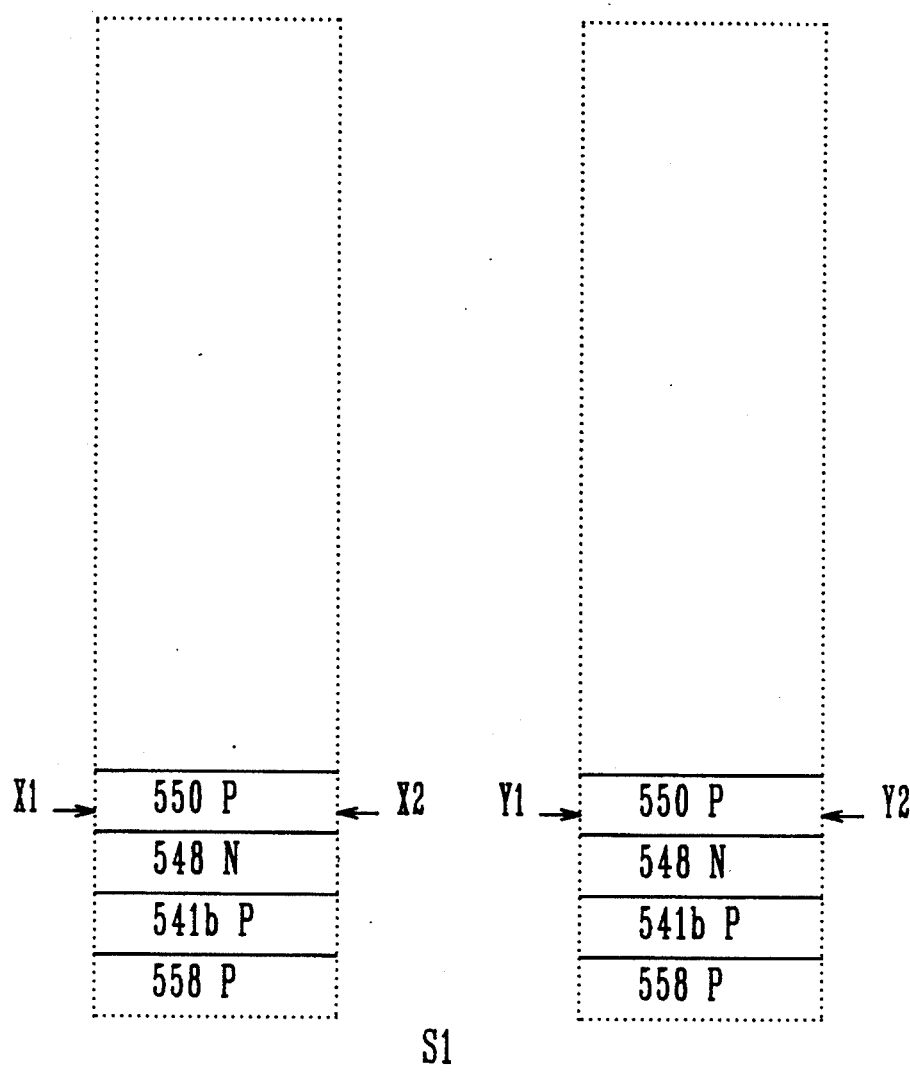
FIG. 14a
FIG. 14b
FIG. 14c

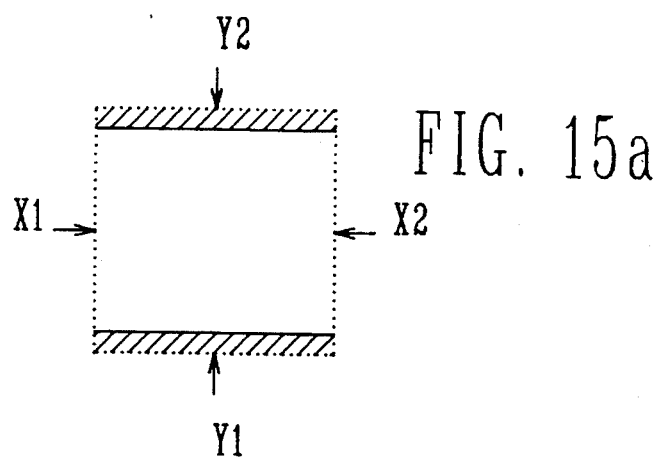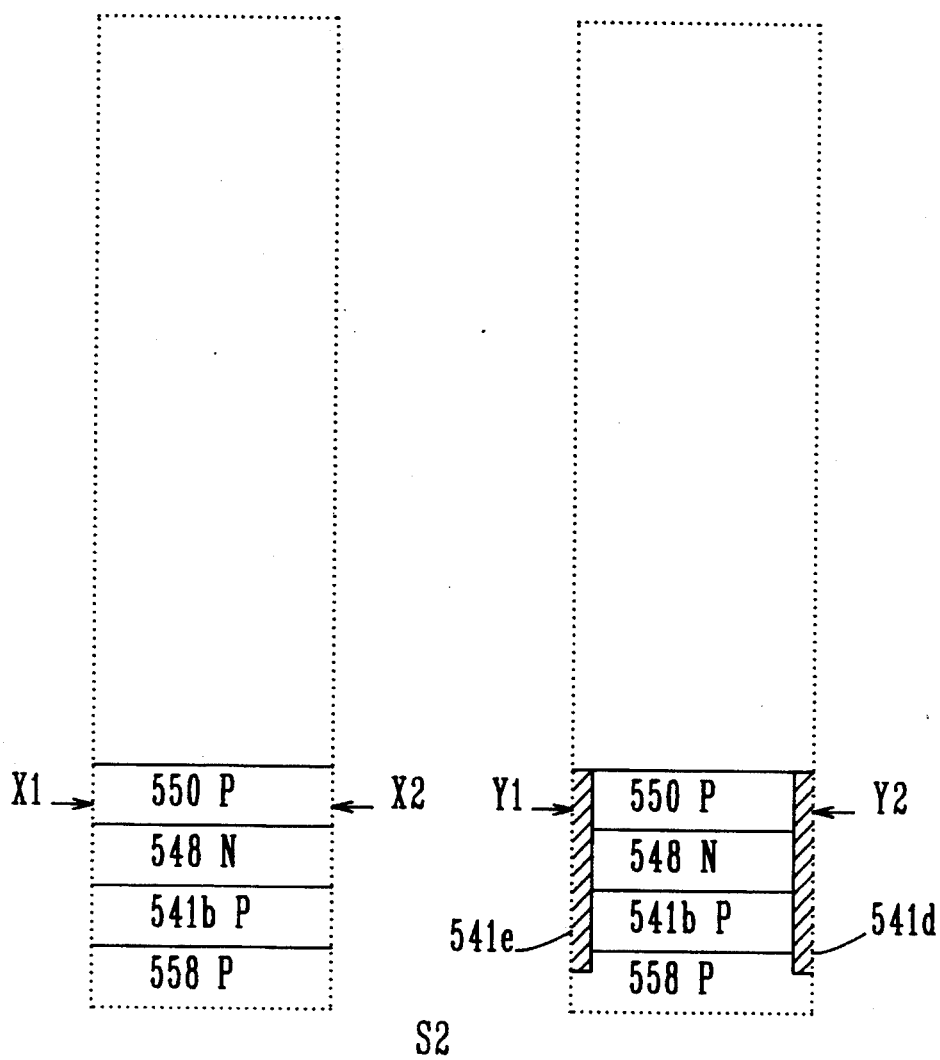

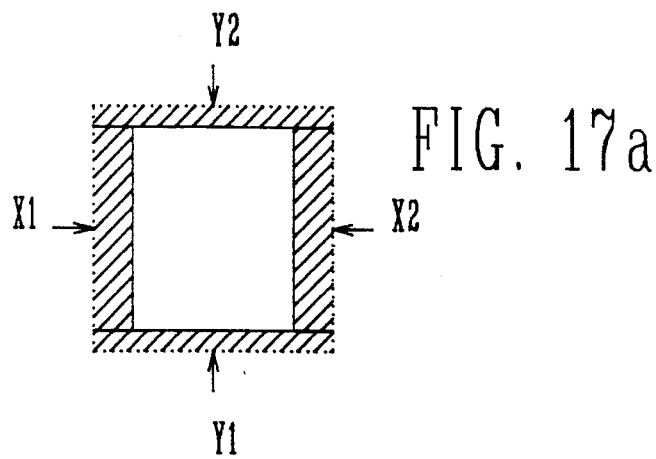
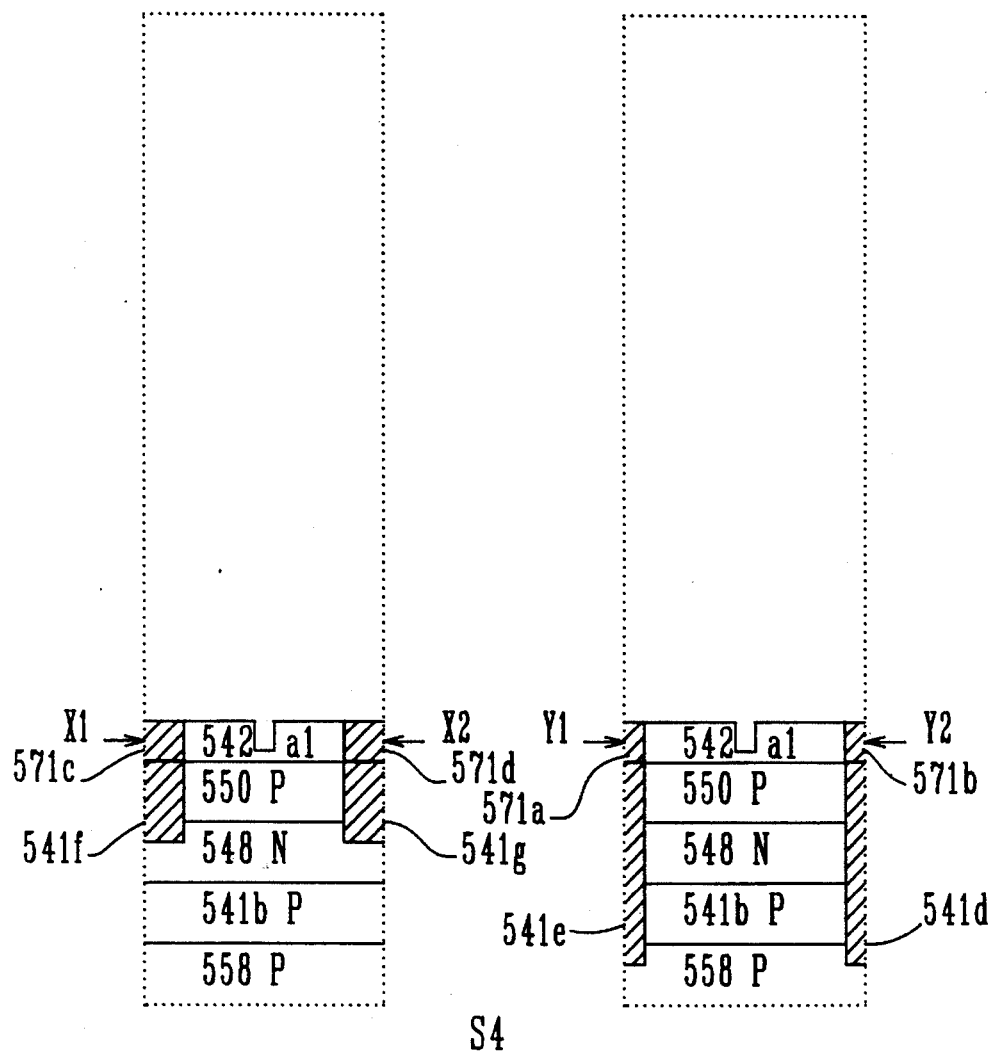
FIG. 17a
FIG. 17b    FIG. 17c

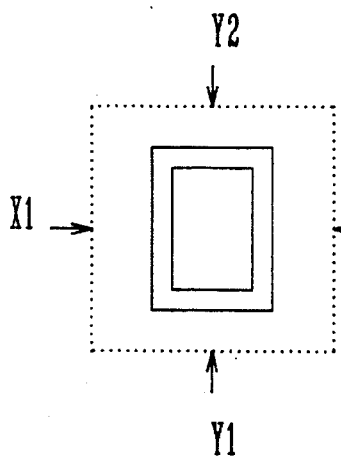
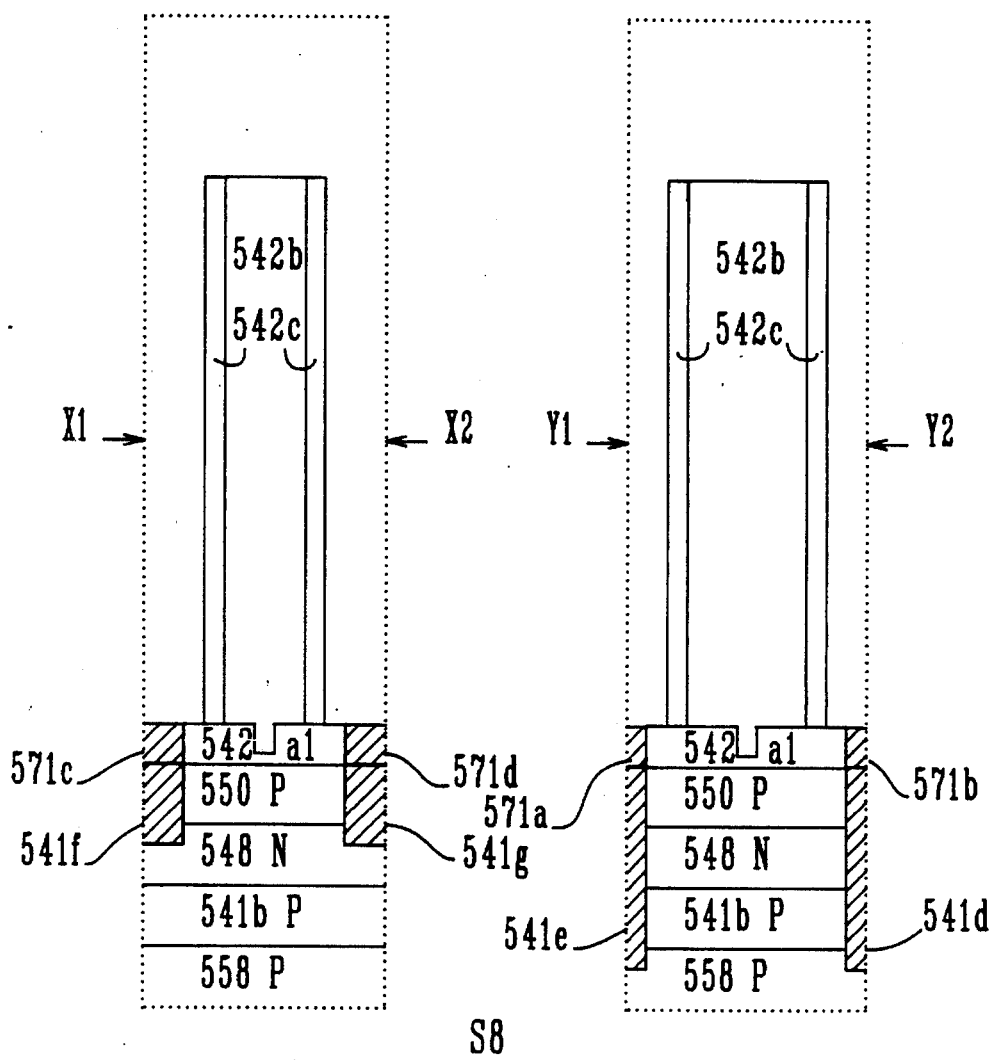
FIG. 21a
FIG. 21b   FIG. 21c

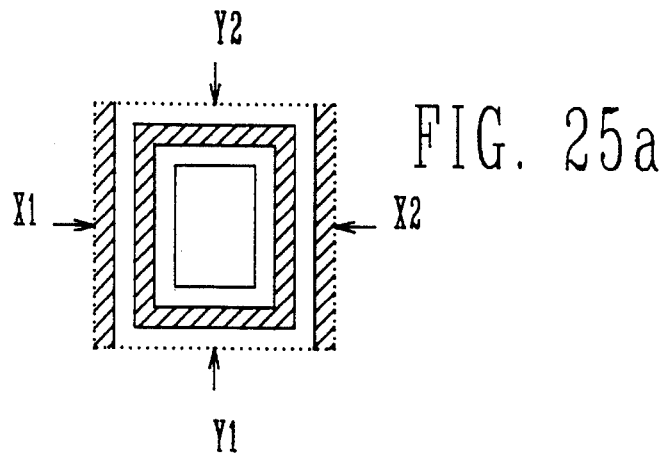
FIG. 25a
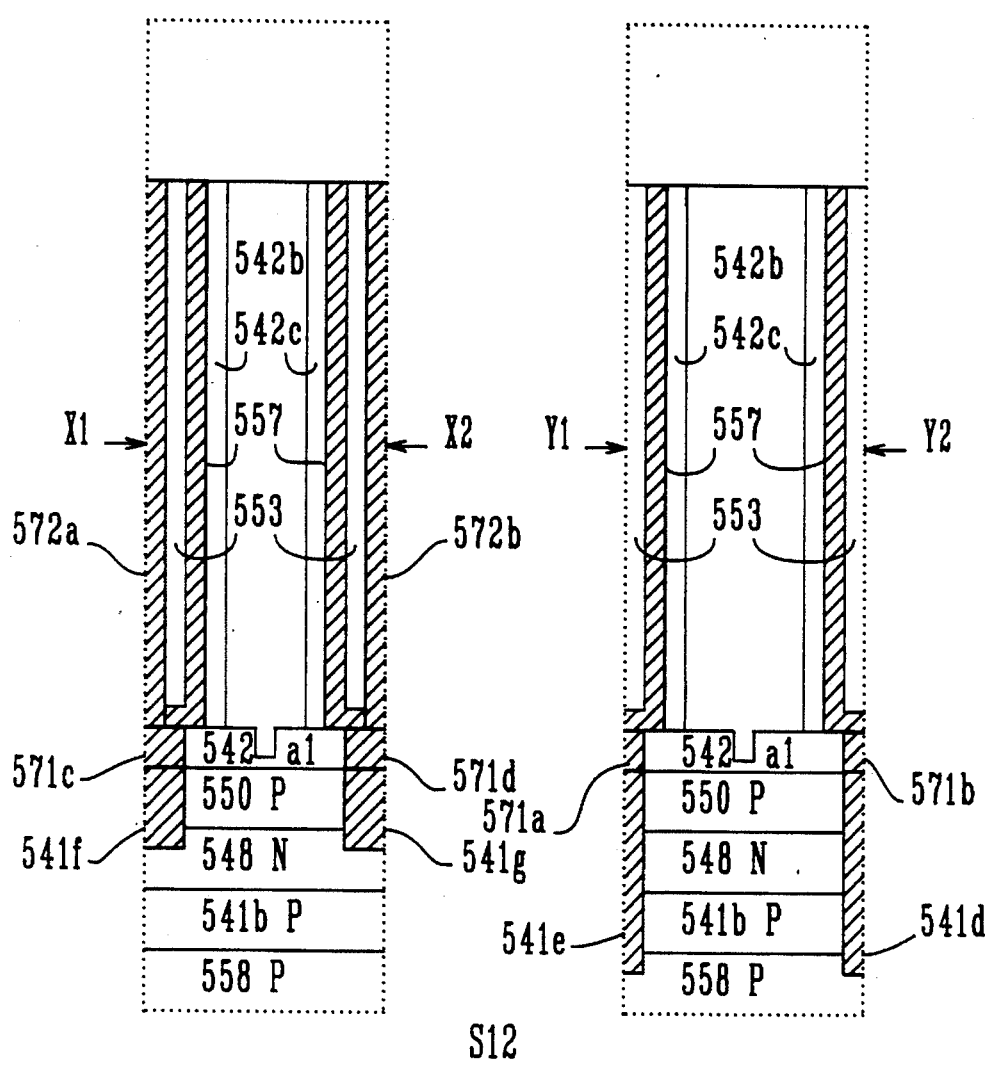
FIG. 25b
FIG. 25c

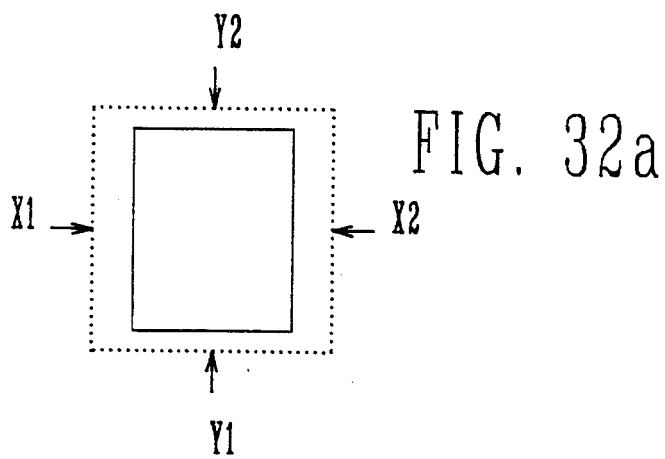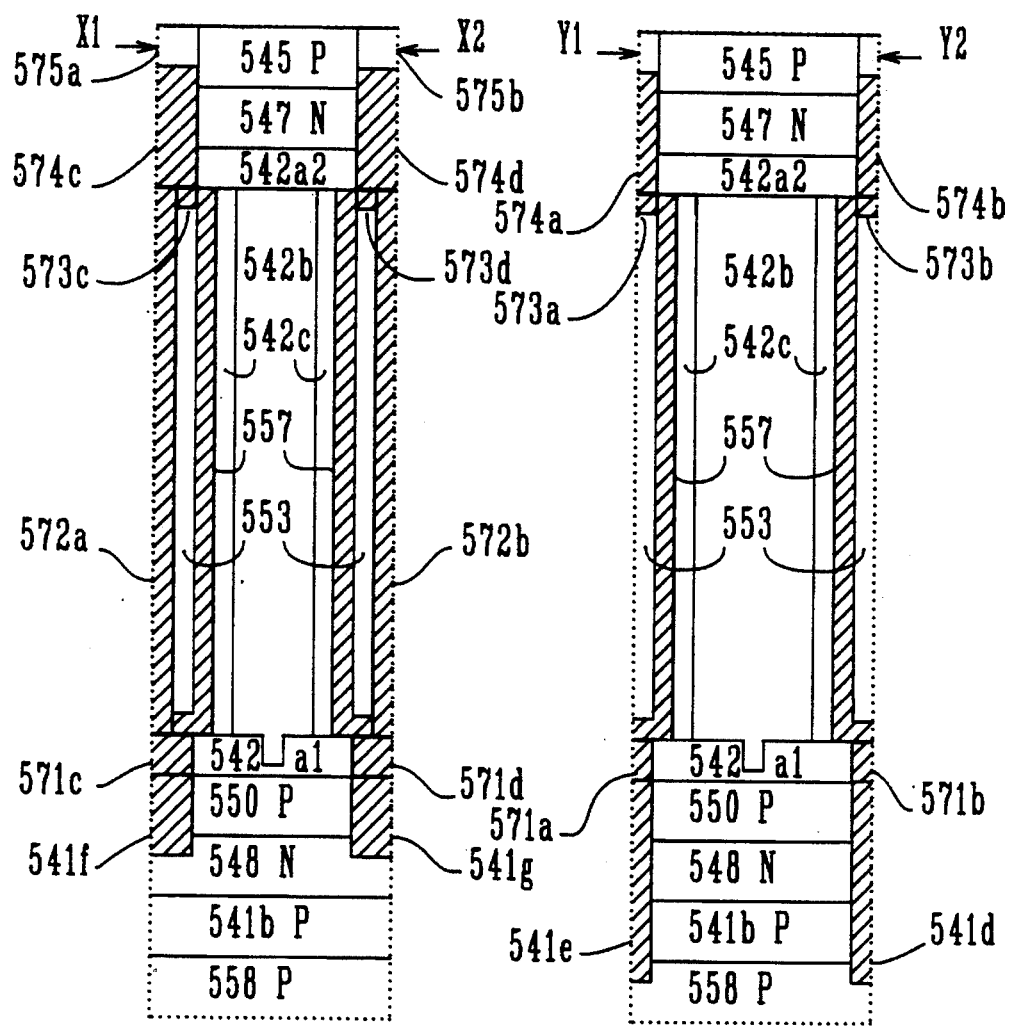

SEMI-MONOLITHIC MEMORY WITH HIGH-DENSITY CELL CONFIGURATIONS

This application is a continuation-in-part of application Ser. No. 08/265,329, filed Jun. 24, 1994, now abandoned, which is a continuation-in-part of application Ser. No. 08/105,464, filed Aug. 9, 1993, now abandoned, which is a continuation-in-part of application Ser. No. 07/769,850, filed Oct. 2, 1991, now abandoned, which application is a CONTINUATION IN PART of prior application and continuation in part, the original application having been filed Oct. 2, 1991, (U.S. Pat. Ser. No. 07/769,850), and the previous continuation in part having been filed Aug. 9, 1993, (U.S. Pat. Ser. No. 08/105,464).

BACKGROUND

The original diode-capacitor memory was proposed using tube diodes by A. W. Holt of the U.S. National Bureau of Standards as described in Tele-Tech & Electronic Industries, p. 85, November 1953. The original dynamic random access memory (DRAM) was the subject of U.S. Pat. No. 3,387,286, by R. H. Dennard entitled Field Effect Transistor Memory and issued Jun. 4, 1968. This latter type of memory has become ubiquitous in the computer industry, and many refinements to it have been proposed and developed.

The present floating cell semi-monolithic memory invention represents a DRAM design which is an improved alternative to the field effect transistor memory type of device, rather than an improvement based on or derived from the original field effect transistor memory design configuration. This design was originally disclosed to the U.S. Patent and Trademark Office in Disclosure Document No. 279072 received Apr. 12, 1991.

Field effect transistor memory DRAMs have been configured as computer memories by fabricating multiple DRAM integrated circuit dice which are typically interconnected by mounting the dice in separate integrated circuit packages such as the common dual-in-line-pack (DIP) and connecting the packages to one another on a printed circuit (PC) board, or by mounting the dice directly onto a hybrid substrate and connecting the dice to the substrate in the manner that the packaged dice were connected to the packages. These connection methods include gold ball and aluminum wedge wire bonding and flip chip bonding, for example.

The present invention provides an improved alternative to these prior interconnection methods by allowing what would have been internal portions of monolithic dice to be physically and electrically interconnected to one another in a manner which offers higher spatial density, higher yield of usable dice, and thus lower cost for a given total memory size.

Contemporary DRAMs use various techniques of substituting extra sub-blocks of memory which test good for other sub-blocks on a memory die which test bad. The nature of preferred embodiments of the present invention is such that it permits fault correction techniques which are not as practical in typical existing field effect transistor memory DRAM configurations.

SUMMARY OF THE INVENTION

In this invention, a floating cell memory structure provides a novel means of constructing dynamic random access memories (DRAMs) for applications such as computers. The floating cell memory structure is designed to gain special benefits from an inventive semi-monolithic integration (SMI) fabrication method when this method is used with inventive excise and bypass yield enhancement techniques.

A floating cell dynamic memory comprises repetitions of memory cells which are normally isolated (floating) from any circuit ground or B+ voltage source, unlike memory cells in conventional dynamic random access memories. Each of these cells comprises a capacitor and two diodes. For reading, writing or refreshing, individual cells are temporarily accessed by electronically switching them into drive or sense circuits. Switched connection occurs at the ends of pairs of nominally horizontal temporarily active circuit interconnection rows, which correspond to bit lines in a field effect transistor DRAM. One row in a pair is used for writing, and the other row in a pair is used for reading. Single nominally vertical temporarily active circuit interconnection columns are used in conjunction with these row pairs for both reading and writing. These columns correspond to word lines in a field effect transistor DRAM.

A floating cell memory is preferably constructed with a small number of columns and a large number of rows to allow control of reverse current feedback, and also to facilitate the subsequently described method of semi-monolithic integration. A limited number of reverse current isolating diodes are inserted at regular intervals along the rows, after which a booster amplifier (such as a field effect transistor circuit) is added to increase signal strength. The intervening booster amplifiers preferably are located on separate integrated circuit dice which are interconnected by the subsequently described semi-monolithic integration method.

The semi-monolithic integration (SMI) technology used to fabricate this memory is a new method for cutting apart individual monolithic integrated circuit dice, and then reconnecting them on a specially designed silicon substrate. This method of integration electrically and physically interconnects the previously separated integrated circuit dice using conductive traces deposited and etched over a filler material. This results in a hybrid-IC-like combination of previously separated circuit elements which are now electrically and physically rejoined to make them "semi-monolithic."

SMI provides an alternative to the use of bonding pads which are significantly larger than conductor traces on the integrated circuit dice, and which thus do not allow high density interconnection between monolithic dice. Contemporary dice interconnection techniques such as gold or aluminum wire bonding or flip chip solder bonding also require time consuming mechanical operations with significant bond failure risk (wire bonding), or even greater pad size with significant pad clearance requirements (flip chip solder bonding).

The SMI method is supplemented by a novel fault correction method which becomes practical with the new type of memory configuration. Interconnection row pairs which contain blemishes are excised near each end on the die by laser evaporation of conductive jumper traces. These traces link the memory rows to their continuations which go to the edge of the die. Conductive column traces leading to the blemishes are laser evaporated just before and after the blemish. This laser evaporation of column traces is more practical with a floating cell DRAM than with a field effect transistor DRAM. This is because evaporation of a floating cell column on both sides of a row fully isolates a cell from the rest of the circuit other than the row, whereas a field effect transistor DRAM would typically retain other connections to the rest of the circuit through common conductive layers such as the layer interconnecting the capacitors.

Two alternate bypass techniques are provided. Both techniques create special types of welded switch connections to interconnect conductive trace paths which bypass blemishes on the primary integrated circuit, followed by mechanical potting of the switch connection with an insulating filler such as silicon dioxide. The first technique uses electrostatic attraction of a laser melted annular ring to a partially melted base contact. The second technique uses electrostatic attraction and spark discharge welding of a double cantilever switching link. When one of these excise and bypass methods has been used, it is preferable when operating the memory to drive the columns simultaneously from both ends to gain access to the portions of columns both above and below the excised blemish area.

As an object of the invention, floating cell memories configured with short RC time constants combined with fast diodes (such as gold doped or Schottky) can permit memory access times significantly faster than conventional DRAMs, hence increasing computer speed.

As an object of the invention, floating cell memory cells can be designed to occupy less wafer area than conventional DRAM memory cells, resulting in more cells per given area of wafer, thus reducing integrated circuit die size.

As an object of the invention, more cells in less wafer area can also permit memories of a given size to be manufactured for less cost than conventional DRAMs.

As an object of the invention, the memory design lends itself to semi-monolithic integration which provides a means for interconnecting a significantly greater number of conductive traces than would be allowed by conventional hybrid integrated circuit technology. It also permits combining dice fabricated with different fabrication steps, thereby allowing one die to be totally dedicated to one fabrication process, and an interconnected die to a different fabrication process, thus not requiring both groups of fabrication steps to be performed on a single die's wafer. It accomplishes this by providing a means for continuing conductive traces from one monolithic floating cell memory die to the next, as well as between floating cell and booster dice. Due to the density of these traces, this would be impossible by contemporary hybrid integrated circuit techniques. Thus, this method can permit creation of larger memories in relatively small packages, at less total cost for processing.

As an object of the invention, excise and bypass yield enhancement works with semi-monolithic integration so that the combination allows nearly all the floating cell memory dice fabricated to be usable, except for the blemish areas themselves and their associated short rows, thus providing improved yield.

BRIEF DESCRIPTION OF THE DRAWINGS

The FIG. 2 group (FIGS. 2a, 2b, 2c, 2d, 2e and 2f) depict an embodiment of a floating cell memory cell. FIGS. 2a, 2b, 2c and 2d are top views. Respectively they show: the lower diode structures (FIG. 2a), the next higher conductive layer of row traces (FIG. 2b), the next higher conductive layer showing a capacitor lower plate (FIG. 2c), and the highest conductive layer showing a column trace (FIG. 2d) which also serves as the upper plate of the capacitor of FIG. 2c. FIGS. 2e, and 2f are two vertically expanded sectional views.

FIGS. 7a and 7b are respectively top and sectional views of semi-monolithic integrated upper dice and lower substrates showing lower substrate strips attached with epoxy to orthogonal upper dice strips.

FIGS. 8a and 8b are respectively top and sectional views of two monolithic dice interconnected across the kerf along their edges in abutment by the semi-monolithic integration method.

FIGS. 12a and 12b are respectively top cross-sectional and side views of an FET type DRAM cell requiring a minimal amount of lithographic resolution and registration.

FIGS. 13a, 13b and 13c are respectively a top sectional and two side sectional views of a columnar cell structure which may be fabricated with expansion or contraction in either axis.

FIGS. 14a, 14b and 14c are respectively a top sectional and two side sectional views of a first step in the fabrication of a columnar cell structure, which may be fabricated with expansion or contraction in either axis, where three epitaxial layers have been grown over a substrate.

FIGS. 15a, 15b and 15c are respectively a top sectional and two side sectional views of the results of a next subsequent step in the fabrication of the columnar cell structure, where trenches have been etched and filled.

FIGS. 17a, 17b and 17c are respectively a top sectional and two side sectional views of the results of a next subsequent step in the fabrication of the columnar cell structure, where an ohmic contact layer has been added which is bounded by filled trenches.

FIGS. 21a, 21b and 21c are respectively a top sectional and two side sectional views of the results of a next subsequent step in the fabrication of the columnar cell structure, where the most recently added layer has been vertically etched.

FIGS. 25a, 25b and 25c are respectively a top sectional and two side sectional views of the results of a next subsequent step in the fabrication of the columnar cell structure, where the remaining vertical gaps have been filled with insulator.

FIGS. 32a, 32b and 32c are respectively a top sectional and two side sectional views of the results of a next subsequent step in the fabrication of the columnar cell structure, where a conductor has been deposited and etched back so as to fill the etched back areas above the previously deposited insulator.

FIGS. 37c and 37d indicate various sub-regions of the cell structure.

DESCRIPTION OF THE PREFERRED EMBODIMENT

Figure 1:
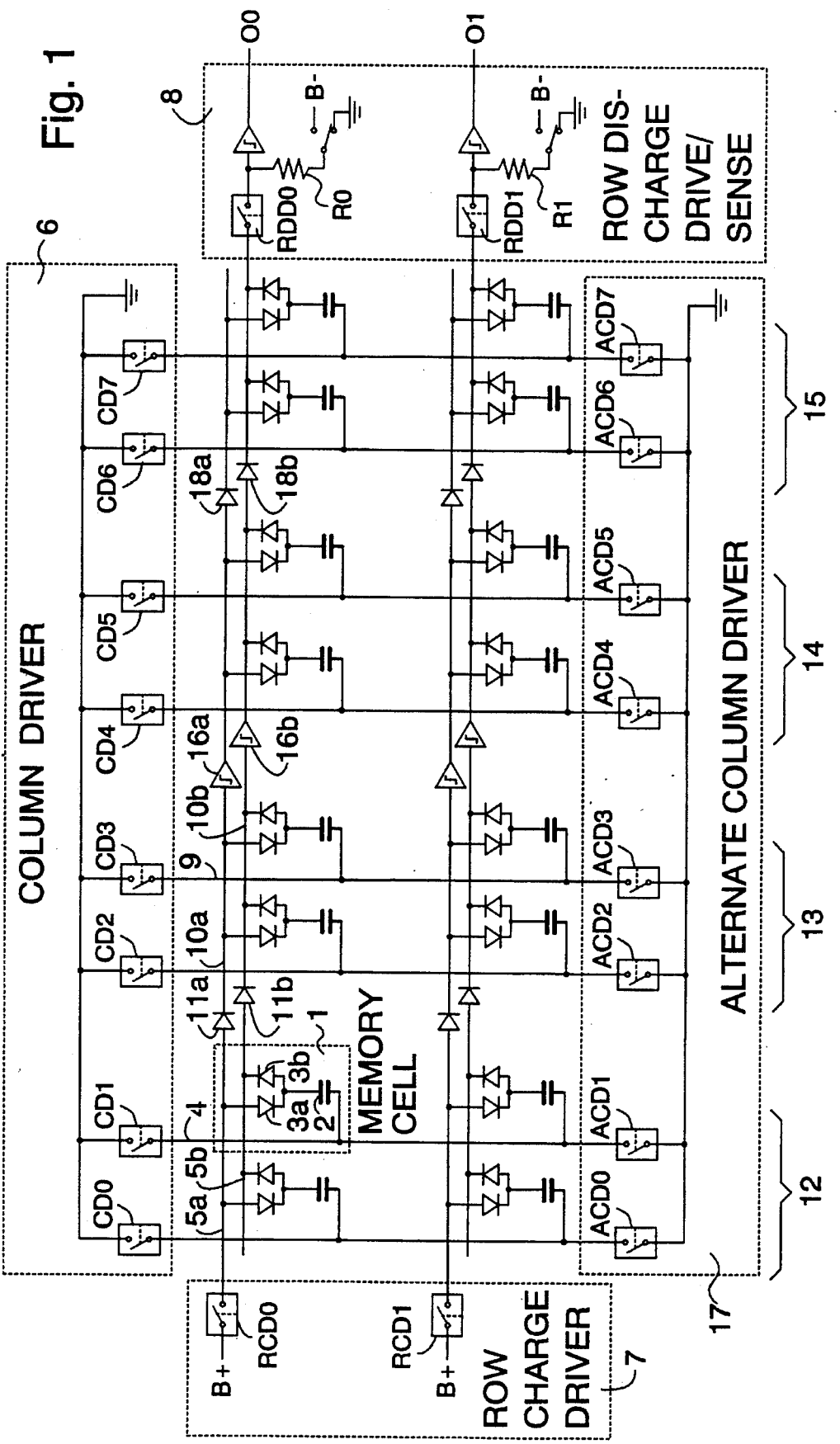
FIG. 1 is a schematic diagram showing an array of floating cell memory cells with their array expansion, drive and sense circuits.

As shown in FIG. 1, an embodiment of a floating cell memory comprises an orthogonal X-Y array (matrix) of memory cells made up of capacitors 2 and diodes 3a and 3b, where the lower (per FIG. 1) plates of the capacitors 2 are connected to conductive columns 4 (shown nominally as "columns" for discussion purposes), and the upper (per FIG. 1) plates of the capacitors 2 are connected to conductive row pairs 5a and 5b (shown nominally as "rows" for discussion purposes) through the diodes 3a and 3b. For each conductive row pairs 5a and 5b, the diodes 3a for one row 5a of the pair all allow current to flow into the capacitors 2 to charge them, and the diodes 3b for the other row 5b of the pair all allow current to flow out of the capacitors 2 to discharge or reverse charge them. The memory is programmed (written) to store nominal "1's" by grounding a single column 4 through a switch of column driver 6, and exerting a positive polarity on one or more of the rows 5a through one or more switches of row charge driver 7, to cause a charge to be placed on the thus addressed capacitor(s) 2. The memory is programmed (written) to store nominal "0's" by switching a single column 4 to ground through a switch of column driver 6, and grounding or reverse charging the one or more selected rows 5b–10b through row discharge drive 8, thus discharging or reverse charging the thus addressed capacitor(s). Reading is accomplished by having threshold sensitive sensing amplifiers, which are connected to the discharge drive switches of 8, sense the state of charge by sensing voltage or current on their associated rows 5b–10b during a discharging or reverse charging operation. This is accomplished by either sensing a voltage drop across a resistance found or placed somewhere in the circuit, or by sensing current directly through a current sensitive device, such as a bipolar transistor (with standard support circuitry). As a variation, the selected cells can be caused to make readable changes in status by grounding the charge line to equal a nominal "1," to be compared against discharging to a negative voltage to equal a nominal "0." In all charge, discharge or reverse charge and associated sense operations, the circuit for the respective addressed capacitors is closed by electrically connecting an end of the selected cell's (or cells') row(s) to the selected cell's (or cells') column through column driver 6 and row drivers 7 or 8 via the common ground connection, or via polarities exerted which are referenced to it. However, in the subsequently described embodiments, there is a noteworthy difference between whether or not the columns are on the top conductive layer of an integrated circuit, since this changes the fabrication flexibility available to increase the columns' conductance.

Charge sense amplifier voltage signal sensing inputs may be located across voltage dropping resistors located in the charge discharge circuit at either end of the row discharge electronic switches, at either end of the row charge electronic switches, or at either end of the column drive electronic switches, or elsewhere along the rows, columns or row/column interconnecting circuitry. The high impedance amplifier voltage sensing inputs are connected so that each amplifier's signal input and reference input are across a low resistance series resistor or low resistance circuit section which continues in series with the charge or discharge current flow (as shown in FIG. 1, where the amplifier reference input is not shown, but is connected to ground of B–). As an alternative sensing configuration, one end of an additional high resistance resistor connects to B+, ground, B–, or some other voltage reference, while the other end of this high resistance resistor connects to the sense amplifier input. In this configuration, the sense amplifier input and resistor end are also connected to the charge or discharge path, on the side of the aforementioned series resistor (added next to the electronic switch to create a voltage drop in the current path) which is not connected to the amplifier's reference input or to a static potential, or otherwise at an electronic switch end or elsewhere where a voltage variation will occur when a selected cell is charged or discharged, due to the aforementioned series resistance elsewhere in the circuit causing a voltage variation across the resistance when a charge state was present in the selected cell, or when a discharge state was present, depending on the voltage reference used. Where the aforementioned series resistors are added to create a voltage drop to be read by the voltage sensing sense amplifiers, those resistors may be placed elsewhere in the circuit, as long as the voltage drop occurs and can be read. Where the aforementioned charge sense amplifiers are described sensing a voltage drop across a series resistance, a bipolar transistor circuit or similar current sensing amplifier may be substituted for the amplifier and resistor described, where the current sensing amplifier is installed in line with the current flow along the charge/discharge path for a given cell being read.

The X-Y memory is typically addressed by standard random access techniques. The basic modular unit of memory cells shown would preferably be fabricated on a monolithic integrated circuit. Power and ground connections for the active components in FIG. 1 must obviously be supplied as required, although these are not shown in FIG. 1 since they are peculiar specific drive and amplifier circuits selected for a given application. (Note: The previously described polarities can obviously be reversed, with the diodes on the negative side of the capacitors).

Because reverse current through the diodes 3a and 3b can cause charge transfer between memory cells 1 over time, the array is preferably configured as elongated in the axis of the columns 4, and shortened in the axis of the rows 5a and 5b to create a relatively small number of columns 4, and large number of rows 5a and 5b. This configuration limits reverse current conduction to a limited number of loop closures through any row 5a and 5b back to a given capacitor 2 on that row 5a or 5b. Additional groups of columns 9 and rows 10a and 10b can be added beside an initial group of columns 4 and rows 5a and 5b as follows: If between the column/row groups 12 and 13 each row is connected through to the next column/row group by a diode 11a or 11b pointing in the current flow direction for that row, then if the connecting diodes 11a and capacitor diodes 3a all point toward the capacitors 2 when viewed from one end of the row, then the capacitors 2 can be charged through those diodes 3a (and 11a, for cells which are to the right of 11a) when their respective columns are grounded. If the connecting diodes 11b and capacitor diodes 3b all point outward from the capacitors 2 when viewed from one end of the row, then a capacitor 2 along that row can be discharged/read by closing the circuit from the discharge/read capable end 8 of the row 5b –10b to the end of a selected grounding column through column driver 6. By using these row-continuation diodes, additional column/row groups can be reasonably isolated from adjacent groups as far as reverse current is concerned, since the added diodes (such as 11a, 11b, 18a and 18b) provide a large additional increase in reverse current resistance when charge tries to bleed through the available reverse current loops. The number of reverse current reducing diodes added increases the number of diode voltage drops (Vbi) added, and thus the total number of diodes a charging and discharging/reading operation sequence passes through reduces the voltage available to be read in the end. Thus, to maximize memory size, it is desirable to program with the maximum charge voltage and discharge reverse voltage that the circuit can reliably handle, if one is to be able to charge and read out through as many column/row group separating diodes (such as 11a, 11b, 18a and 18b) as possible.

If larger size memories are desired, rows of the aforementioned diode expanded X-Y memories can be linked through booster amplifiers 16a and 16b which substitute for the diodes after a predetermined number of column/row groups has been reached. This allows a signal which has been weakened by too many diode voltage drops to have its amplitude restored before continuing through subsequent groups of diode drops. Booster amplifier 16a and 16b circuits an be constructed on separate monolithic dice, and connected either directly or via a lower substrate to the column/row memory group using the subsequently described semi-monolithic integration technique to effectively extend conductive row traces from monolithic circuit to monolithic circuit, or from monolithic circuit to lower substrate via fabrication of the semi-monolithic traces on down-sloping beveled edges precision machined on the monolithic circuits to slope down toward contact with the lower substrate.

Preferably, diode expanded row pairs 5a and 5b are charged 7 from one end of a row in a pair, and discharged 8 from the other end of the alternate row in the pair to allow the number of diode voltage drops to remain consistent for various elements along the row when the number of diode voltage drops for charging and discharging any given cell is combined.

Refresh of each memory cell in the array is required to be performed periodically. Preferably, each refresh cycle refreshes a column of cells at a time. Traditionally, the refresh process is thought of as a read operation from one or more cells, followed by a write of the information read, back into the same cells. More accurately, the refresh operation requires processing the stored charge in each cell through a threshold, and then returning this thresholded value to the cell at the level of charge originally placed in the cell. Thus, the charge in a cell tends to bleed down over time (or, in the floating cell memory, the discharge state also tends to bleed up), but is restored to its original value by the refresh operation prior to bleeding past the threshold level. Because faster versions of a floating cell memory tend to require significantly more frequent refresh cycles than with a field effect transistor (FET) DRAM, it is desirable that the refresh operation be as rapid as possible so as to leave the maximum amount of time available for regular read and write operations, thus permitting the average (mean) time for read or write operations to be competitive with or improved over that of the conventional FET DRAM. To accomplish this, the thresholded output of each row discharge/sense amplifier of 8 is connected through an electronic switch (not shown) to the input (driven) end of its paired charge row 5a– 10a. These connections can be by means such as conductive linkages off the die, insulated parallel conductors running over an insulator below the die, or insulated parallel conductors running through or above the upper layers of the die. Or, the row discharge drive/sense circuits of 8 can be positioned at the same end of the row pairs as the row charge drivers 7 (rather than at the opposite end), with a direct link between the sense amplifiers and the charge drivers through the aforementioned added electronic switches. However, this comes at the expense of either not using the reverse current reduction diodes such as 11a or 11b, or booster amplifiers such as 16a or 16b, or alternatively using them, but requiring selection of system parameters which tolerate unpredictability of however many diode voltage drops (Vbi) will occur within a selected charge/discharge circuit which uses reverse current reduction diodes. When a given row discharge drive electronic switch of 8 discharges a cell associated with as selected column 4 over its associated discharge row line 5b, a pulse of output charge (associated with a nominal "1") or discharge (associated with a nominal "0") is fed to the input of the row discharge drive electronic switch's associated sense amplifier of 8. This results in the sense amplifier output transitioning from a high impedance state to a charging state if a nominal "1" was present, or failing to do so if a nominal "0" was present. In the event a nominal "0" was present, a high impedance is continually fed to the input end of associated row line 5a. In the event a "1" was present, the full (restored) charge state voltage output of the sense amplifier is fed through the added electronic switch onto row 5a, to be returned to the cell through its associated charging diode 3a. The slight time delay of sense amplifier response to transition to the charge state, then return to the high impedance state, is calibrated so as to allow sufficient time to charge the cell with the "1" pulse output. Whether the system is operating between a positive charge (equal to "1") and ground (equal to "0"), or a reverse charge (equal to "0"), the discharging operation which feeds each row pair's associates sense amplifier temporarily brings that row's selected cell to a full "0" charge level, just prior to conditionally recharging to a full "1" charge level, in cases where a "1" was read. This entire refresh operation can be accomplished in a somewhat extended version of a single standard read or write cycle, while avoiding the time delay of a regular read followed by a regular write operation. When attempting to optimize memory speed, pipelining or "FIFOing" (first-in-first-out shifting) the address decoding words from a random access input to make sequential addresses available at intermitently increased internal speed in the memory circuit can create a configuration where the refresh operations appear transparent outside the memory circuit, and where throughput is maximized by not requiring comparatively rapid cell access capability to be wasted by allowing idle periods where cells could have been accessed, but were just left sitting while waiting for an address request to be decoded.

The diode-capacitor cell structures disclosed herein are electrically equivalent to the structures disclosed in the aforementioned Tele-Tech and Electronic Industries article (page 85, et seq. November 1953, by A. W. Holt). Hence, the diode-capacitor cell structures disclosed herein can be substituted for those of the Tele-Tech article, and the method of operation used in the Tele-Tech article is equally applicable to the diode-capacitor cell structures disclosed herein. The diode-capacitor cell structures disclosed herein are just smaller and solid-state.

In any embodiment of the memory cells (such as the embodiments shown in the subsequently described FIGS. 2, 3 and 4 groups), materials which increase the capacitance of the capacitors (such as tantalum plate(s) with a tantalum oxide insulator), rather than the common materials mentioned (such as aluminum or doped polysilicon plates with a silicon dioxide insulator), may be used to improve circuit performance and overcome capacitance deficiencies created by a circuit design engineer's selection preference of some otherwise desirable engineering parameters which are accompanied by such deficiencies. Where aluminum is used, the conventional practice of use of barrier layers (such as tungsten, for example) is the preferred means of preventing degradation of the aluminum and adjacent materials.

The FIG. 2 group (FIGS. 2a, 2b, 2c, 2d, 2e and 2f) depicts a species embodiment of a floating cell memory cell. FIGS. 2a, 2b, 2c and 2d are top views. Respectively they show: the lower diode structures (FIG. 2a), the next higher conductive layer showing a section of a pair of row traces (FIG. 2b), the next higher conductive layer showing a capacitor lower plate (FIG. 2c), and the highest conductive layer showing a section of a column trace (FIG. 2d) which also serves as the upper plate of the capacitor of FIG. 2c. FIG. 2e is a cross-sectional view taken between points X21 and X22 on FIG. 2a. FIG. 2f is a cross-sectional view taken between points X23 and X24 on FIG. 2a. Features of the single cell depicted in the FIG. 2 group can be easily cross-referenced to the cell features depicted in FIG. 1. Reference numbers above 20 refer to features of the FIG. 2 group. Reference numbers below 20 refer to the features of FIG. 1. The cell shown represents one unit of a two dimensional array (matrix). The part of the cell above point A21 and to the left of point A22 (FIG. 2a) is stepped and repeated vertically and horizontally as many times as desired to make up the chosen size of the array. The portions shown below point A21 and to the right of point A22 represent portions which are then added respectively to the lowest and rightmost cells in the array to make the array complete. The portion of the column 4 in the area of a single cell is shown as upper conductive layer 33. This column conducts charge to and from the bottom plate of capacitor 2, which in FIG. 2e and 2f is shown as the top conductive layer of the cell. When this cell is vertically stepped and repeated, the resulting column takes the form of a continuous ribbon of conductive material such as doped polysilicon or aluminum which conducts charge to and from the cells in the column, and simultaneously forms one plate of each capacitor in each cell in the column. The dielectric of capacitor 2 is embodied here by insulating layer 37 which is made of a suitable material such as silicon dioxide. The upper plate of capacitor 2 is embodied in the conductive (such as aluminum) layer 22 which is formed below the insulating layer 37. This layer is insulated from structures formed below by layer 38 which is again an insulating material such as silicon dioxide.

In these and subsequent FIGS., diodes are described as P doped material abutting N doped material. In standard current practice semiconductor diodes are constructed by forming junctions which create a depletion region. A common version is the silicon based P+, N, N+ doping relationship, where frequently the P+ region is created above the N region in an epitaxial layer grown above an N+ silicon substrate. Gold doping is a common method of increasing speed. Shotky diodes using aluminum for the P+ side of the junction are a well known variation. A variety of materials and dopings can be used to construct semiconductor diodes. Depending on application requirements such as speed and reverse current leakage relationships, various diode fabrication specifications may be desired by the design engineer to meet specific performance objectives. Because diode design and fabrication is a well known art, the P and N designations have been used here to specify junctions which function as diodes, not to indicate specific materials or doping relationships which will vary according to standard options and engineering preference. Likewise, dopings for conductive silicon substrates and depositions of polysilicon are engineering options based on standard practice and considerations such as conductivity desired and available fabrication capabilities.

Diodes (3a and 3b in FIG. 1) are formed in the lower levels of the embodiment. They are diode isolated from the rest of the circuit by P type region 21P, which is biased below ground or the lowest system voltage in the standard manner. Diode 3a (FIG. 1) is shown as diode D21 and is formed in what is shown as the upper portion of FIG. 2a, and which is surrounded on the sides and underneath (per FIG. 2e) by diode isolation region 21P. The cathode 27N of diode D21 is formed of N type material in the round cornered rectangular zone indicated in FIG. 2a. The anode 26P of diode D21 is formed of P type material which is surrounded to the sides and below by the material of cathode 27N. Diode 3b is shown as diode D22 and is formed in what is shown as the lower portion of FIG. 2a in a round cornered rectangular region surrounded horizontally (per FIG. 2a) and underneath (per FIG. 2f) by the diode isolation material of region 21P. The cathode 28N of this diode surrounds its anode 30P in a similar manner to diode D21's construction. Writing a positive charge on the capacitor lower plate 22 through diode D21 is accomplished by exerting a positive voltage on conductive row line 35 which contacts (at 25) P type section 26P of diode D21 through a hole in insulating layer 39, this layer 39 being made of a material such as silicon dioxide. The charge path continues from P region 26P to N type section 27N, through contact point 23 (through a hole in insulator 39, and through an insulator edged hole in row 35), to the capacitor lower plate 22. The capacitor lower plate 22 is discharged (through an insulator edged hole in row 36, and through a hole in insulator 39) through contact point 32, to anode 30P and cathode 28N of diode D22 through its contact point 29 through a hole in insulator 39 to row line 36, which is used for discharging and sensing. Discharging may be to ground, or if the discharging drive circuit (as in 8 with 6) connects the lower row line 36 to a negative (B−) voltage, a reverse charge may be placed across the plates of the capacitor. This latter method provides an alternative way to get the additional charge storage advantages that would be available with a higher capacitor breakdown voltage, but where a capacitor with less breakdown voltage is actually used.

Although an array of cells of the type shown in the FIG. 2 group can be based on various material combinations which allow the integrated construction of diodes and capacitors in a stepped and repeated array, preferred fabrication on a silicon substrate is as follows: A P type silicon wafer is used as a substrate for subsequent fabrication steps. For a given ell, diode cathodes 27N and 28N are formed within the P type surrounding region 21P by a standard method such as masked diffusion or ion implantation of N type dopants, or by forming an N type layer above the P layer and isolating the cathodes with reach-through diffusion of the surrounding P type material. In the event a Shotky junction is desired, an aluminum )or equivalent) embodiment of capacitor lower plate 22 or row 35 may form the P part of the junction, and the need to form the anode 30P or 26P is thus eliminated. Diode anodes 26P and 30P are formed by a similar method within the respective cathode regions 27N and 28N. An insulating layer 39 of silicon dioxide is deposited above the diodes, and masked and etched to allow connection points 23, 25, 32 and 29 for the upper conductive materials to contact the lower diodes. A first conductive layer (such as aluminum making ohmic contact with the appropriately doped N+ or high enough P silicon diode surfaces) is deposited so as to interconnect charging row 35 at contact point 25 to diode D21 anode 26P, and also to interconnect lower discharging row 36 at contact point 29 to diode D22 cathode 28N. This layer is then masked and etched per FIG. 2b to form the row traces. This same masking and etching step also etches holes through the row traces to allow insulation and feed through of the subsequent conductive layer which makes contact with the diodes at locations 23 and 32. The insulating layer 38 of silicon dioxide is then deposited over the wafer and masked and etched so as to allow the previously described contacts at locations 23 and 32. A conductive layer 22 such as aluminum making ohmic contact with the appropriate doped (N+ or high enough P) silicon diodes is deposited so as to interconnect from contact point 23 above diode D21 cathode 27N to contact point 32 above diode D22 anode 30P, and is masked and etched per FIG. 2c to leave an area which just covers the upper D21 and lower D22 diode and the intervening space in between. This conductive region thus forms the jumper connection between contact points 23 and 32, as well as forming the lower plate of the capacitor. This cell's capacitor plate 22 is isolated by its surrounding etched region from the like plates of the stepped and repeated surrounding cells. Layer 37 is an insulative (such as silicon dioxide) deposition over the wafer surface which covers above and in between the lower capacitor plates 22, and which does not require masking and etching. A third conductive (such as aluminum) layer is deposited over this insulating layer 37, and masked and etched to form the columns 33 which are of the width shown 34, this width isolating the columns from the columns stepped and repeated on either side, and which continue unbroken vertically from cell to cell so as to interconnect them. The portion of these columns directly over the aforementioned plates 22 serves an additional function as the upper plate of each cell's capacitor. A passivation layer of silicon dioxide (not shown) would normally be deposited above the third conductive layer in accordance with standard practice.

Figure 3A:
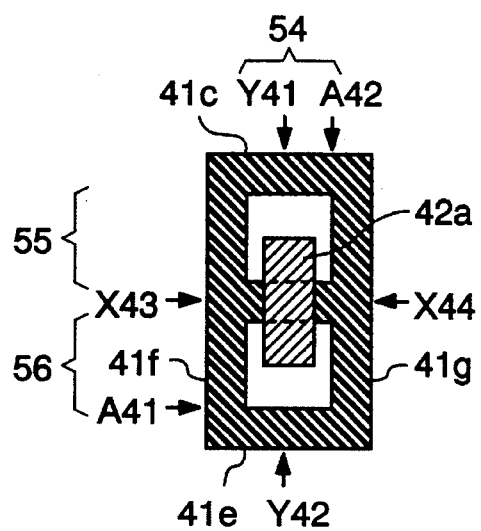
FIGS. 3a, 3b and 3c are respectively a top and two vertically expanded sectional views of a single floating cell memory cell embodiment which uses trench technology to isolate memory cells and their components, and to form capacitors.
Figure 3B:
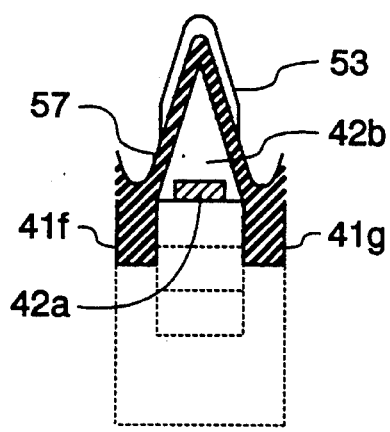
Figure 3C:
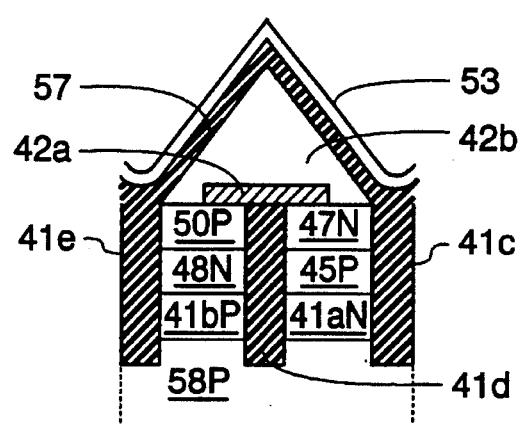

FIGS. 3a, 3b and 3c depict a memory cell species embodiment analogous to the one shown in the FIG. 2 group, which uses trench technology for part of the cells' isolation and to increase the capacitance of the capacitor. FIG. 3a is a top view. FIG. 3b is a cross-sectional view taken between points X43 and X44 on FIG. 3a. FIG. 3c is a cross-sectional view taken between points Y41 and Y42 on FIG. 3a. Analogous numbered features in FIGS. 3a, 3b and 3c can be cross-referenced to the numbered features of the FIG. 2 group by subtracting 20 from the designation numbers. Column lines and upper plates 53 of the capacitors are now corrugated and the lines follow up and down between tops and bottoms of corrugated capacitor structures. Each cell column line/plate 53 is insulated from the other plate 42b by insulation layer 57. First plate 53 is made of a conductive material such as doped polysilicon. Insulating layer 57 is made of a material such as silicon dioxide. The pyramid shaped second plate 42b of the capacitor is made of a conductive material such as doped polysilicon. To form a conductive linkage between the two diodes, conductive jumper 42a is created above and in ohmic contact with the appropriately doped (such as N+ and high enough P) upper portion of the diodes from aluminum, or other suitable material.

To charge the capacitor, current is fed into the cell from a positive voltage source over P type row/anode 45P, through N type cathode 47N, and through ohmic contact to jumper 42a's ohmic contact with plate 42b, while other plate 53 is driven to a lower (such as ground) potential. To read or discharge the capacitor, the charge flows from appropriately (preferably P+) doped plate 42b, partially through ohmic contact to jumper 42a to its ohmic contact with anode 50P, and partially through plate 42b's like-material contact with P type anode 50P, into N type row/cathode 48N to be linked through driven circuitry to column/plate 53, thereby completing the circuit. Discharging may again be to a negative potential s with the embodiment of the FIG. 2 group. The bottom of charging diode 45P/47N is diode isolated from the substrate by the additional N type layer 41aN which runs the length of the row along with the P type row/anode 45P. Diode 48N/50P is isolated from the substrate at P type layer 41bP, which is connected to lower substrate 58P which is negatively biased in the standard manner. FIG. 3c depicts this combination. The lower substrate may be doped to match 41bP, thereby eliminating the need to separately fabricate the 41bP layer. As shown in FIG. 3c, the isolating layers, row layers, and capacitor interfacing layers are physically formed in an elongated row pair as mesa-like structures which are isolated (in the view of FIG. 3a) above, in between and below the row pair by trenches filled with an insulator such as silicon dioxide. While the diode isolating and row layers are continuous ribbon like strips isolated by trenches 41c, 41d and 41e, the upper diode layers 47N and 50P which interface to the capacitors are isolated between cells by continuous vertical shallow trenches 41f and 41g, as shown in FIG. 3b.

As with the previously discussed species embodiment, the cell shown in FIGS. 3a, 3b and 3c can also be fabricated with alternate materials, but a preferred silicon based embodiment is as follows: The following processes are performed on a P type substrate 58P. A first mask is used to form the deep trenches 41c, 41d and 41e using a suitable means such as reactive ion etching. These isolation trenches have the option of tolerating somewhat jagged paths (as viewed from the top per FIG. 3a). Thus, the opportunity exists to use lithographic techniques where reduced resolution may result in trenches which are not perfectly straight and smooth, but which statistically will reliably be wide and deep enough to accomplish the desired insulating function. A next masking step is used to form by means such as diffusion or ion implantation N type diode isolation layer 41aN, P type anode 45P, and N type cathode 47N which, in a horizontal step and repeat from the cell shown in FIG. 3a, would form a continuous ribbon-like three layered strip. In an array, this horizontal strip is stepped and repeated above and below the cell of the example under discussion, as well. A next masking allows a similar diffusion or ion implantation of P type diode isolating layer 41bP, N type cathode 48N and P type anode 50P. Alternatively, the silicon regions where layers 41aN-45P-47N and 41bP-48N-50P are to be formed can independently be etched away, and refilled with the appropriate dopings by selective epitaxy. In the event a Shottky junction is desired, the subsequently described jumper 42a (of aluminum or equivalent) may be extended to form the P part of the junction by covering the silicon region where the top of anode 50P would have been, but with the need to form anode 50P eliminated, and with cathode 48N extended to include the region where anode 50P is shown in FIG. 3c. If ion implantation is used with the preceding two masking operations, then it is preferable to oxidize the walls of the trenches formed, and fill the remaining inner portions of these trenches with a metal such as aluminum to provide a straggle blocking effect. This metal can be subsequently removed by such means as reactive ion etching to improve cell performance, if desired. The trenches are then masked as required and filled with an insulator such as silicon dioxide. A next masking and etching operation is used to cut the shallow trenches 41f and 41g, which are then filled with an insulating material such as silicon dioxide. Conductive material 42a (such as an aluminum based material selected for the purpose of making an ohmic contact with the two appropriate doped upper diode surfaces) is deposited over the wafer. A next masking operation is followed by etching this deposition to form the jumper connection 42a shown in the FIG. 3 group. A thick deposition of conductive material such as P+ type polysilicon which can make ohmic contact with the jumper 42a and which also makes conductive (such as same type material) contact with P type diode anode 50P is then deposited on the wafer. This thick deposition is then masked with a mask suitable for angle wall trenching (such as an erodable mask), then V shaped columns and rows are etched in the 42b material to cut away the material vertically and horizontally between the stepped and repeated unetched portions, where the insulator (such as silicon dioxide) filling the trenches is available to help stop the V selective etching process from going too deep. These remaining unetched portions take the appropriate form of four-sided pyramids (one for each cell), the base of each of which covers the diodes at 47N and 50P, with the pyramids pointing away from the diode structure as shown in FIG. 3c. To maximize capacitance in the trench capacitor, it is desirable to maximize the height of the capacitor pyramid structure. Furthermore, it is desirable (to whatever degree possible with available fabrication capabilities) to truncate the pyramid shape at the top, and make the sides as steep as possible (in one axis, or preferably both axes, not shown) to maximize surface area in the trench capacitor. Insulating layer 57 is then formed across the surface of the wafer by means such as silicon oxidation, deposition of silicon dioxide, or use of some other insulating material. Further deposition of a conductive layer 53 of a material such as doped polysilicon forms the final conductive layer of the structure. A metal such as aluminum may be used as an alternative material to the polysilicon, or over the polysilicon. This layer is then etched into columns over the stepped and repeated cell array by a next masking and etching step. To reduce resistance in the columns, this layer of conductive column material is preferably deposited thickly and reactive ion etched (RIE) for trench isolation between the columns. An example of this would be a thick deposition of aluminum, RIE trench etched, using insulating layer 57 constructed of silicon dioxide as a convenient RIE stop, using standard selective etchants (such as carbon tetrachloride) for this case. A passivation layer (such as silicon dioxide, not shown) is preferably added as well, in accordance with standard practice. The lower capacitor plate 22 of the FIG. 2 group can be deposited to the same depth as plate 42b of the FIG. 3 group using a similar suitable conductive material, or overlay of conductive material. Preferably, a deposition and masked etching of a selective RIE stop (such as silicon dioxide) to cover the region between the laterally adjacent lower capacitor plates is accomplished first, to serve the purpose of the aforementioned RIE stop of the FIG. 3 group description. This structure can then be trench etched to form the peaks or related upper structures described for the FIG. 3 group capacitors, and the columns/upper plates can be formed in a manner such as the peaked or filled peaked manner of the capacitor upper plate and column forming options described for the FIG. 3 group embodiment (which respectively increase the capacitance of the capacitor, and lower the resistance in the columns), if this is desired or necessitated by engineering choices made regarding other associated circuitry. Likewise, the trench formed peaked structures of the FIG. 3 group capacitors can be formed flat (in the manner of the FIG. 2 group) using either a version of jumper 42a which is enlarged to cover the appropriately doped (ohmic contact) diode tops below it, or using an additional deposited material with the overlap coverage of 42b to create a lower nominally "flat" capacitor plate (with a slight upward bulge in the middle if the jumper is underneath), and with the insulator and upper plate formed above in the manner of 37 and 33 of the FIG. 2 group.

Figure 4A:
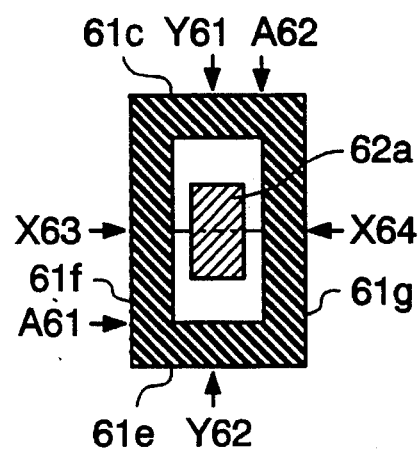
FIGS. 4a, 4b and 4c are respectively a top and two vertically expanded sectional views of a single floating cell memory cell embodiment which uses depletion regions created by ion implantation to create three dimensional diode isolation of memory cells and their components.
Figure 4B:
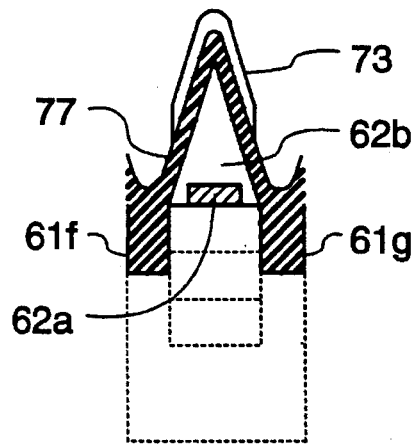
Figure 4C:
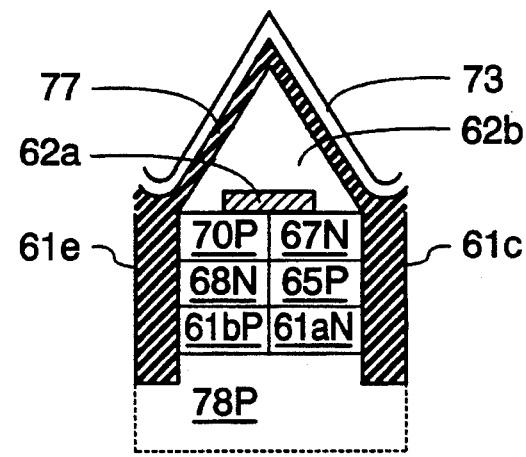

FIGS. 4a, 4b and 4c depict a species embodiment which is a variation on the cell shown in FIGS. 3a, 3b and 3c, where most of the structures remain the same. FIG. 4a is a top view. FIG. 4b is a cross-sectional view taken between points X63 and X64 on FIG. 4a. FIG. 4c is a cross-sectional view taken between points Y61 and Y62 on FIG. 4a. FIGS. 4a, 4b and 4c can be cross-referenced to the numbered features of FIGS. 3a, 3b and 3c by subtracting 20 from the designation numbers. The prior embodiment's deep trench 41d isolating the rows has been eliminated.

When a given cell is charged over its associated row/ anode 65P, that charge flows into capacitor plate 62b through cathode 67N and jumper 62a, but also into N type sections 61aN and 68N. Conveniently, these overflow sections other than 67N are diode isolated by junctions with P type sections from transmitting the charge to the capacitor of any cell other than the one selected. When the capacitor is discharged from plate 62b through jumper 62a into P type anode 70P, that charge also spreads to N type cathode 67N of the selected cell. The charge in the selected cell's cathode 67N is blocked by P type diode junction isolation from progressing to anode 65P. However, the charge of cathode 67N is free to conduct back into jumper 62a and lower plate 62b to be drawn off eventually during the discharge process through anode 70P. When charging the capacitor of this cell, it is preferable to place the charge on both the charge and discharge row lines. When discharging, it is likewise preferable to bring the charge line to or below the lower operating voltage of the cell array to prevent stray charge from the charge line from finding its way into the selected cell while attempting to completely discharge it. As with the earlier embodiments, discharging may be to voltages below ground.

The fabrication steps for FIGS. 4a, 4b and 4c are the same as those for FIGS. 3a, 3b and 3c except as follows: Diode sections 61aN, 65P, 67N, 61bP, 68N and 70P are preferably formed by ion implantation. Implantation depth and width is controlled by masking and beam intensity to implant doping concentrations in the middle regions of the sections shown. Diode junctions are formed vertically at the planes where the majority carrier concentrations change from one implant doping type to the other type. Masking and implant operations are also designed to control lateral straggle between sections 61aN and 61bP, 65P and 68N, and 67N and 70P so as to create depletion regions at these junctions as well, resulting in depletion regions between all these numbered segments at their junctions.

A number of design alternatives for creating DRAM cells within and around a single vertical trench hole have been described. Examples include: Shah et al, IEEE Journal Of Solid-State Circuits, October, 1986, starting p. 618; Miura et al, U.S. Pat. No. 4,672,410, Jun. 9, 1987; Chaterjee, U.S. Pat. No. 4,683,486, Jul. 28, 1987; Banerjee et al, IEEE Transactions On Electron Devices, Jan. 1, 1988, starting p. 108. When bit and word line trace contacts are added to these concentric structures, photolithographic resolution and registration requirements cause these structures to possess a significant amount of detail (i.e. lithographic design groundrule resolvable elements) in the forming of contact traces, elements directly beneath contact traces, and connections between upper traces and lower elements, while lower traces find their way around these connections. FIG. 12a (a top cross-sectional view taken between points X200 and X201 on FIG. 12b) and FIG. 12b (a side view) depict an embodiment which reduces the number of lithographic groundrule squares needed to permit contact with the minimal exposed areas around the bit and word line contact points, while allowing single unbroken width traces to continue from cell to cell in the memory array in a non-cross-point fashion. The in-trench structures shown are based on the in-trench structures of the aforementioned Banerjee article, but where the trench surrounding structures have been replaced on three of the four sides of the trench with a thin (potentially ragged lithography) rectangular surrounding insulating trench. FIGS. 12a and 12b depict a P type epitaxial layer 200 above a P+ type silicon wafer 201, in which is etched a trench hole. The trench hole contains N+ polysilicon plug 202 at the top of which is buried lateral contact 206, which is insulated from N+ gate electrode 207 which is part of N+ polysilicon word line 215. These structures are insulated around the walls of the trench from the P and P+ material in which the trench is etched by an oxide layer 205a and 205b, where lateral contact and source 206 is oxide undercut etched through this oxide layer. Drain 204 is part of N+ bit line 203. Thin trenches 208, 209, 210 and 211 surround the cell. Locations 212, and 213 or 214 are necessary contact points between the traces and underlying elements, which limit the photolithographic resolution and registration options. The resulting top cross-sectional view of FIG. 12a permitted by this relationship of elements permits the desired reduction in size of the cell for a given lithographic resolution capability, while maintaining sufficient vertical dimensions (in the axis of the trench hole) to allow depletion regions of the source and drain not to interfere with the switching operation of the inversion layer which is formed over the gate region between them. This invesion layer forms around the circumference of the gate region 201 for convenience of manufacture, where its primary useful conducting path along 205a is directly between the drain and source shown on the left side of the trench in FIG. 12b.

The cell structure depicted in the FIG. 3 group can be modified to a single column embodiment. FIGS. 13a, 13b and 13c respectively depict cross-sectional top, and two side views of a single column floating cell memory cell. The numbers from the FIG. 3 group have been in effect retained by adding 300 to them. The cross-section of FIG. 13a is taken between X300 and X301 on FIG. 13b, and at 90 degrees at the same height on side view 13c. As with the other similar FIG. views, FIGS. 13a, b and c center on a common axis. In this embodiment, the output diodes and conductive N type traces are on the bottom as before, but the capacitor above them has been converted to a tube configuration. Epitaxy is the preferred method for forming these lower diodes in this case. However, if ion implantation is used, as an example, to create the three layers of the PNP structure shown in FIGS. 13b and c, an at least 3 micron thick p-layer with an impurity concentration of 10 exp 18 per cubic centimeter of boron can first be epitaxially deposited, followed by an implant of phosphorous with an energy of 1,300,000 electron volts and a dose of 2×10 exp 14 atoms per square centimeter, followed by a conventional activation anneal cycle of 30 minutes at 1,000 degrees C. This results in a buried n-layer between p-layers at a depth of 1 to 2 microns with the phosphorous concentration varying between 10 exp 18 per cubic centimeter at the junctions, and 6×10 exp 18 per cubic centimeter at the center of the n-layer. A thin insulative layer such as silicon dioxide is deposited above the diodes, and small holes are etched in this layer to make contact with the contact plates 342a1 above the diodes. A thick layer of heavily doped polysilicon is deposited above this layer. Isolation trenches 360 and 361 are etched in the polysilicon on each side of where the capacitor holes will be etched, and then these isolation trenches are filled with an insulator such as silicon dioxide. Each cell's capacitor is constructed in a hole which is reactive ion etched into the deposited doped polysilicon. Each hole is surrounded on two opposite sides by the isolation walls, and on the other two opposite sides by the remaining polysilicon. After the capacitor holes have been etched, the inner portion of each hole is coated with a thin layer of doped polysilicon which connects the doped polysilicon between the isolation trenches to form continuous conductive column traces 353 between the isolation trenches. The doped polysilicon lining the holes is then partially oxidized or coated with a thin layer of an insulator 357 such as silicon dioxide. A subsequent masking and deposition step fills the remaining interior of these holes with a conductive material 342b such as heavily doped polysilicon which makes ohmic contact with the lower contact plates. Alternatively, the lower or subsequently described upper contact plates can be deleted, and the conductive filling material can be doped to match the diode material exposed where the plate would have been. Diodes and conductive row traces above the thus created capacitors are formed from doped polysilicon using standard polysilicon diode construction techniques. These upper diode structures are constructed as an inverted version of the lower diode structures, with the thin insulative layer and contact holes on the bottom, and with the upper isolating sidewall trenches 362, 363, 364 and 365 formed parallel with the lower diode analogous structures. Trenches 364 and 365 are etched separately, then partially filled with an insulator such as silicon dioxide, then the upper portion filled with a conductor such as heavily doped polysilicon which matches the doping type of element 345. Thus, an array of cells is created with row pairs and columns at right angles to each other, but with the row pairs split above and below the columns, rather than beside each other. The fabrication technique shown for the cell of FIGS. 14a, b and c through FIG. 34a, b and c are applicable to the aforementioned cell as well.

When fabricating cells of the type shown in the FIG. 13 group, trench etching by such means as reactive ion etching would be the conventional means of forming the trenches indicated. When one or a small number of cells are being fabricated, various conventional options are available to determine or approximate the depth of the trench being cut. For example, monitoring of the progressing trench depth can be done with conventional contour profile measurement equipment, so as to ascertain the depth of the etch from intermittent measurements taken as the trench etch progresses, thereby increasing the precision of the trench cut. Or, if a lower yield is acceptable, a timed etch cycle can be used where errors in the etch depth may result in a lower yield. However, when fabricating larger groups of cells, addition of a stop layer of a material of alternate selectivity (such as a silicon dioxide stop layer when trench etching silicon) may be helpful. For example, if a layer of silicon dioxide is deposited above lower metal layer 342a1, and a via (contact) hole is etched in this layer directly below what will become the center of capacitor electrode 342b, then subsequent trench etching to form the capacitor electrode 342b can utilize this silicon dioxide layer as a convenient stop layer, while the capacitor electrode 342b being formed will still be able make contact to lower metal layer 342a1 through the aforementioned via (contact) hole in the stop layer. This same technique can be used between metal layer 342a2 and the upper end of capacitor center electrode 342b, as well as with the analogous structures of the FIGS. 14 through 34 groups. Where wet etch techniques are desired for fabrication steps, such stop layers are particularly easy to select against the material being etched.

For those not skilled in the art of three-dimensional fabrication who desire to fabricate these structures, it should be noted that VMOS V-etching techniques are probably the most common conventional techniques for interfacing three-dimensional integrated circuit structures such as these to conventional planar peripheral structures, where this is desired.

The embodiment of the FIG. 13 group can be constructed in an alternative form as follows: The upper diode structures above the capacitor are deleted. The capacitor structure can be formed as shown, or can be alternatively formed in the manner of the FIG. 3 group, where the FIG. 13b capacitor would be converted to the style of FIG. 3b's capacitor structure, and the view of FIG. 13c would incorporate the view of the capacitor of FIG. 3c, with the capacitor shrunken in the horizontal axis so that the peak would be above 50P, and the edge that was above trench 41c would now be over trench 41d, trenches 41e and 41d now corresponding to trenches 341e and 341d respectively. Contact plate 42a may not be required in this structure if material 42b is type matched to the semiconductive material below it. Alternative capacitor structures listed for the FIG. 3 group may also be used here as alternatives. The lower semiconductive layers 350, 348 and 341b are now appropriately doped and spaced (with respect to the doping) to form a transistor, rather than back to back diodes. These layers may be respectively P-N-P as shown, or N-P-N (not shown). In fabrication, isolating trenches 341e and 341d are extended downward to allow an additional diode isolating layer of opposite doping (N type for the P-N-P version shown, P type for the N-P-N version not shown) to be formed below the 341b layer. Isolating trenches 341f and 341g are also extended downward just past the junction between 348 and 341b. These trenches are then filled with an insulating material such as silicon dioxide. This results in a structure with elongated traces on the bottom made up of 341b and the lower diode isolating material which run the width of the cell array between the long isolating trenches, below repetitions of 350 over 348 which are surrounded on all sides by isolating trenches. A further trench etching of the middles of the isolating trenches which are now dividing the 350s over 348s from the adjacent 350s over 348s in the axis perpendicular to the previously mentioned lower 341b and lower isolating material elongated traces (i.e. running along the plane of the wafer above and orthogonal to the lower traces) is performed, followed by a filling with doped polysilicon which matches the 348 doping, or other suitable conductive material. This polysilicon is then etched again from the top (or limited in the deposition height) and then covered with an insulator such as silicon dioxide. This results in a structure where the bottom elements 341b and lower isolating elements form continuous strips which are trench isolated on each side in a first axis, the 348 elements interconnected by doped polysilicon from continuous strips which are trench isolated on each side and which run along an orthogonal axis above the lower strips, and 350 elements isolated on all sides which are located above the 348 elements. In this embodiment, the 341b elements serve as transistor emitters, the 348 elements serve as transistor bases, and the 350 elements serve as transistor collectors. One of these transistors allows charge to flow into a capacitor above it by causing current to flow from emitter to base in the normal transistor manner by causing such current to flow over the 341b line and orthogonal 348 line which intersect within the thus selected transistor, while placing an increased potential on the capacitor connecting line leading to the outside plate of the capacitor by reverse biasing the collector side of the transistor. The selected transistor allows charge to flow out of the capacitor above it by reversing the potential across its capacitor connecting line and the base line (the capacitor connecting line running orthogonal to the base line), and drawing charge back out of the capacitor through the (per FIG. 13 group reference) now forward biased P-N junction of 350 and 348 in a manner similar to inverted active operation of the transistor. An additional diode may optionally be added below each 341b element where the upper portion of the diode is doped with the same type material as the 348 layer, and the lower portion of the diode is doped with the same type material as the 341b layer, thereby allowing a lower P-N junction with appropriate doping levels to feed current to.P type emitter 341b for the doping types indicated in the FIG. 13 group reference. This additional diode serves to limit leakage current flowing back out of the transistor. When the additional diodes are used, trench isolation on all sides of the stacked diode-transistor structure should continue down from just above the junction of 341b and 348, to just below the P-N junction in the lower diode. In this case, the trace that conducts current to the transistor/capacitor is also the lower element of the diode as in the FIG. 3 group example, rather than being also the emitter of the transistor.

In the foregoing specification: Capacitor portions 42b can be constructed of a metal such as aluminum, rather than the doped polysilicon shown. Silicon nitride can be used to fill trenches isolating diodes. Trench isolating material which insulates diodes can be a trench insulative coating such as silicon dioxide with an opaque material such as aluminum deposited between diodes to reduce light transmission. Lower regions of silicon or polysilicon conductive traces are typically highly doped to insure good conductivity. Where one diode is shown, more than one diode structure may be used to reduce reverse current leakage at the expense of an additional Vbi voltage drop. The top mounted capacitor types described for the FIGS. 3 and 4 groups can be mounted above a FET to form DRAM cells, where the outer plate 53 is continuous over the plane of the wafer.

Figure 35:
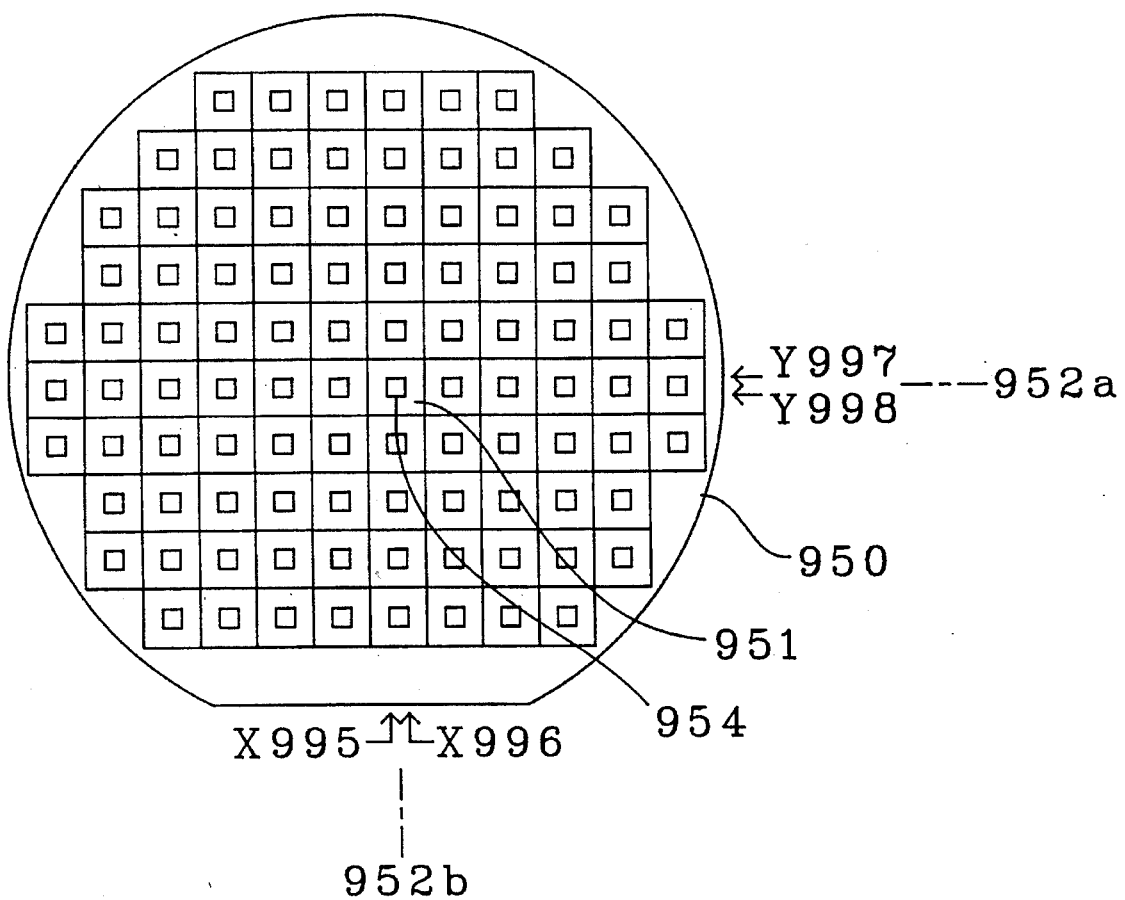
FIG. 35 is a top schematic view of an integrated circuit wafer showing a number of integrated circuit dice thereon, where each die depicts a schematic region where a memory cell array exists.
Figure 36:
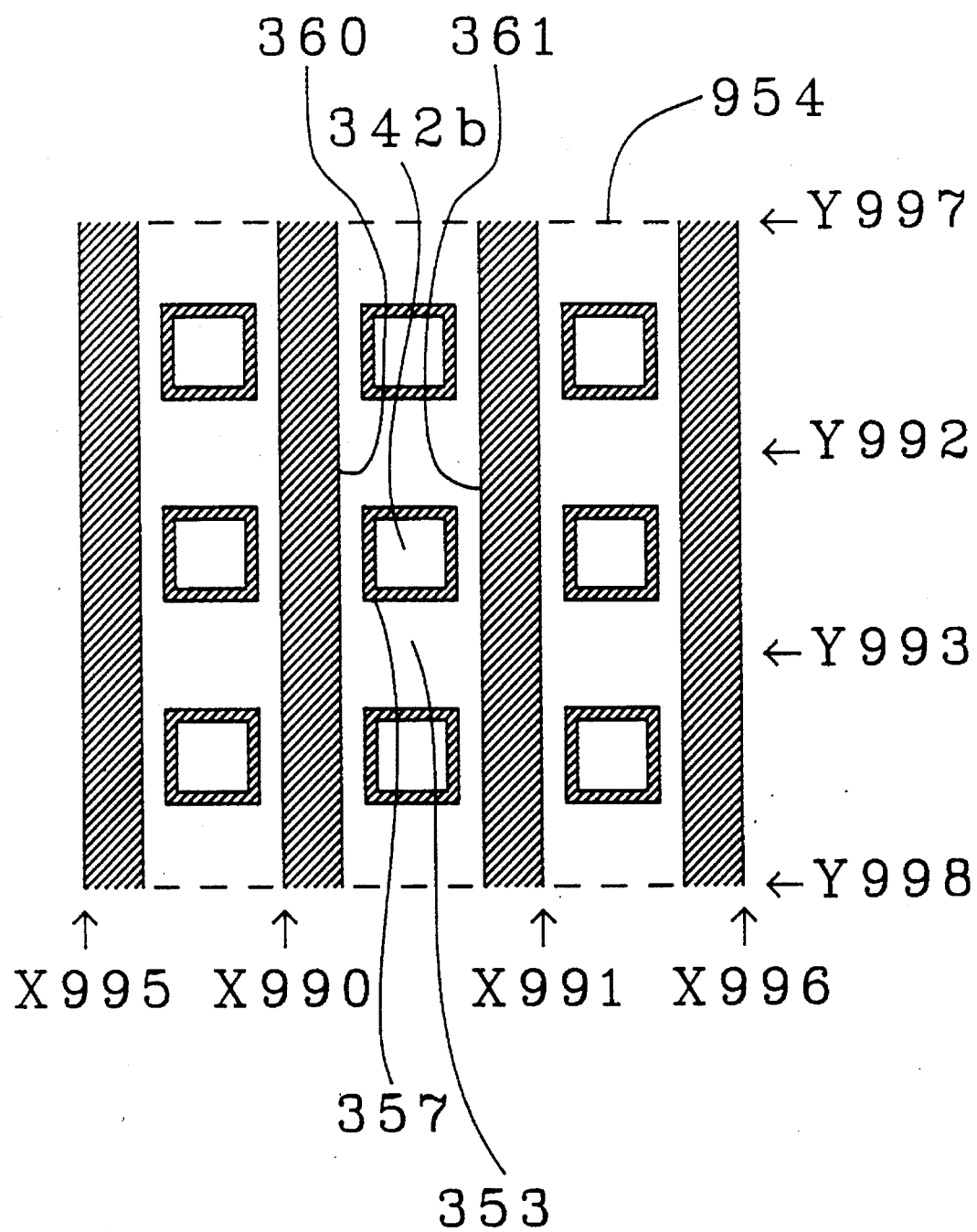
FIG. 36 is a top sectional view of a memory cell array.
Figure 37A:
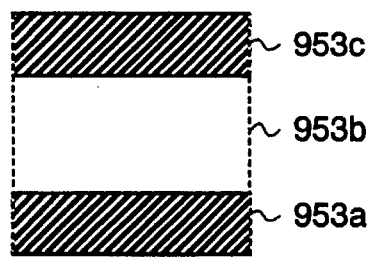
FIGS. 37a, 37b, 37c and 37d are respectively a top sectional view of a mask, and a top sectional and two side sectional views of a columnar cell structure.
Figure 37B:
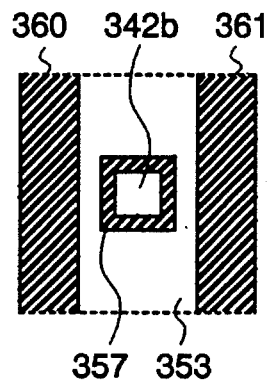

FIGS. 35, 36 and 37a, b, c and d depict the relationships between columnar memory element structures, their subregions, fabrication methods, and the greater integrated circuit structures of which they are a part. FIGS. 37b, c and d repeat the structures of FIGS. 13a, b and c, respectively, but also include descriptive information regarding subregions.

FIG. 35 depicts a semiconductor wafer 950 having a general plane which is predominate (shown by the plan intercepting axes 952a and b) and containing a number of integrated circuit dice, such as the integrated circuit die shown at 951. Each of these integrated circuit dice contains a memory 954 as shown between X995–X996, and Y997–Y998 of FIG. 35, and also in FIG. 36, which is an array which takes the form of a matrix (as shown for 954 in FIG. 36) of electronic integrated circuit memory element structures, or "elements" (one of which is shown in FIG. 36 between X990–X991, and Y992–Y993, and as FIG. 37b, c and d), these electronic integrated circuit memory element structures (elements) being memory cells. A memory such as that shown as 954 may be composed of one or more such electronic integrated circuit memory element structures (elements). A 2-by-1 or 2-by-2 element memory can sometimes be built more easily than the 3-by-3 element memory shown as 954, but larger memories are typically more desirable.

Figure 37C:
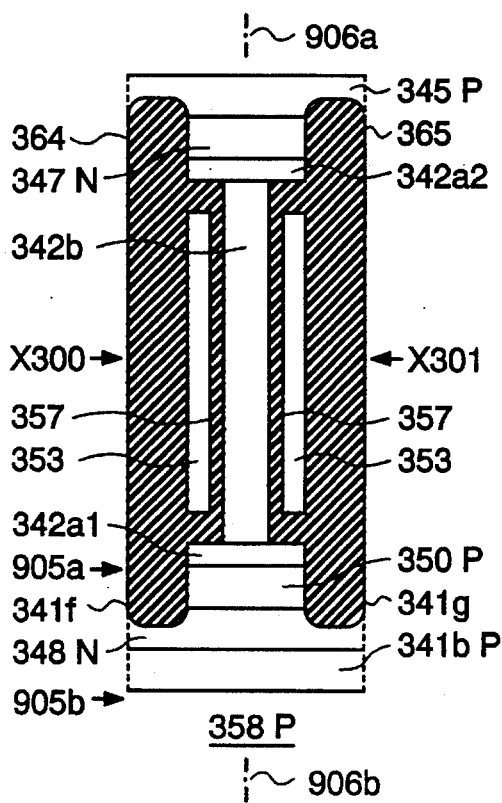
Figure 37D:
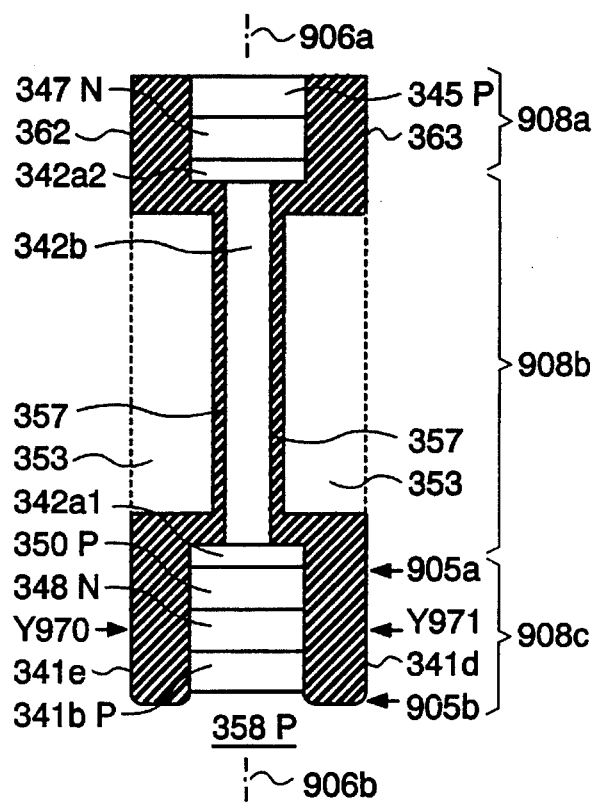

Fabrication process steps to create these electronic integrated circuit memory element structures include the use of at least one mask. In the structure shown in the FIG. 37 group, a number of masks would normally be used. As an example of the use of a mask, FIG. 37a represents a conventional mask for trench etching which is made from a material which is dissimilar to and selectable from the material below it which is to be etched, where region 953b protects a center area between unmasked regions 953a and c, where unmasked region 953a permits the trench etching of trench 341e, and unmasked region 953c permits the trench etching of trench 341d (as shown in FIG. 37d), where these trenches 341e and 341d are later filled. Trench associated portions 953a and c of the mask shown in FIG. 37a typically would extend to other cells above and below the shown FIG. 37a, and analogous upward and downward extending masks and mask extensions would be to each side of the mask shown, to create additional cells to each side of the cell shown, if a larger array of cells were being constructed. The mask of FIG. 37a is substantially in the general plane of the integrated circuit die (i.e., the aforementioned general plane of the wafer). As shown for FIGS. 37c and d, the region from 905a down to 905b represents a region of substantially perpendicular extension of the aforementioned mask, where features are etched so as to extend down perpendicular to the mask, into the material below it. This mask would be placed at the height of 905a to allow etching of trenches 341e and 341d (a different mask would be used to etch trenches 341f and 341g). A cross-section of the resulting trenches where the structure reflects only the features of the mask can be taken between Y970 and Y971.

FIGS. 37b, c and d contain the same structure shown in FIGS. 13a, b and c, respectively. This structure is supplemented in the FIG. 37 group with the aforementioned mask example (FIG. 37a) and with descriptions of features and elements of this structure, as follows:

This structure contains at least a plurality of electronic integrated circuit components which are semiconductor devices, shown here as semiconductor diodes 345P–347N and 350P-348N in the regions 908a and c, respectively.

The mask of FIG. 37a, any other masks used to create each memory element structure, and the aforementioned substantially perpendicular extensions of such masks are oriented around a central axis which is substantially perpendicular to each such mask. This central axis is indicated as being through axis symbols 906a and b.

The various electronic integrated circuit components of the structure are stacked in a column (as shown for 908a, b and c) which is perpendicular to the general plane of the die, and the central axis of each electronic integrated circuit component is substantially centered around the central axis 906a and b, which as previously mentioned is substantially perpendicular to the general plane which is predominant on the integrated circuit die.

These electronic integrated circuit components 908a, b and c are stacked in component relationship of an architectural column comprising at least one component in the upper capital component 908a position of at least one component type, at least one component in the central component 908b position of at least one component type, and at least one component in the lower base component 908c position of at least one component type.

The shown electronic integrated circuit memory element structure comprises conductive means (345P and 348N as extended) for both reading and writing to said electronic integrated circuit memory element structure.

Central structural portions (such as 342b) of said components (908b in this case) are bounded at least at some point in the fabrication process by trenches (360 and 361 in this case, for example) extending in at least one axis of the general plane which is predominate.

Pairs of filled trenches (paired relative to each memory element structure) define the substantially perpendicular extensions of the aforementioned mask, as well as of other masks which would be used to create the other filled dividing trenches extending in the various axes, and each such pair of trenches bounds a downward extension from the region of the mask plane (between the trenches) which includes solid material in the finished structure. Structure features 353, 357 and 342b are such solid material for the mask shown in FIG. 37a.

If viewed from the top, the superposing of the aforementioned bounding trench pairs which bound in at least one planar axis for each component, allows definition of a central region of the stacked structure which is substantially oriented around the common vertical axis 906a–906b. (Other internal structural features tend to be oriented around this vertical axis as well.) Hence, these trenches (such various trench pairs) act as edges which define a center (in at least one axis) of each said central structural portion.

It will therefore be apparent that these edges may also extend in the aforementioned at least one axis of said general plane which is predominate when the aforementioned trenches are extended for such reasons as bounding additional portions of memory cell structures.

It will therefore be apparent that for a given memory cell structure, the centers (between these edges) substantially coincide with or substantially cross through the aforementioned central columnar axis shown as 906a–906b for the cell shown in FIGS. 37b, c and d.

It is important to remember that the aforementioned trenches may be (and typically will be) filled with solid material in subsequent fabrication process steps (subsequent to the etching of the trenches).

As shown in FIGS. 37b, c and d, the previously described electronic integrated circuit memory element structure includes conductive means for both reading and writing (continuous conductive lines 345P and 348N) which are located at both upper (in the region of 908a) and lower (in the region of 908c) portions of the aforementioned architectural column, as well as such conductive means in the middle portion of the aforementioned architectural column (continuous conductive line 353 in the region of 908b).

Figure 5:
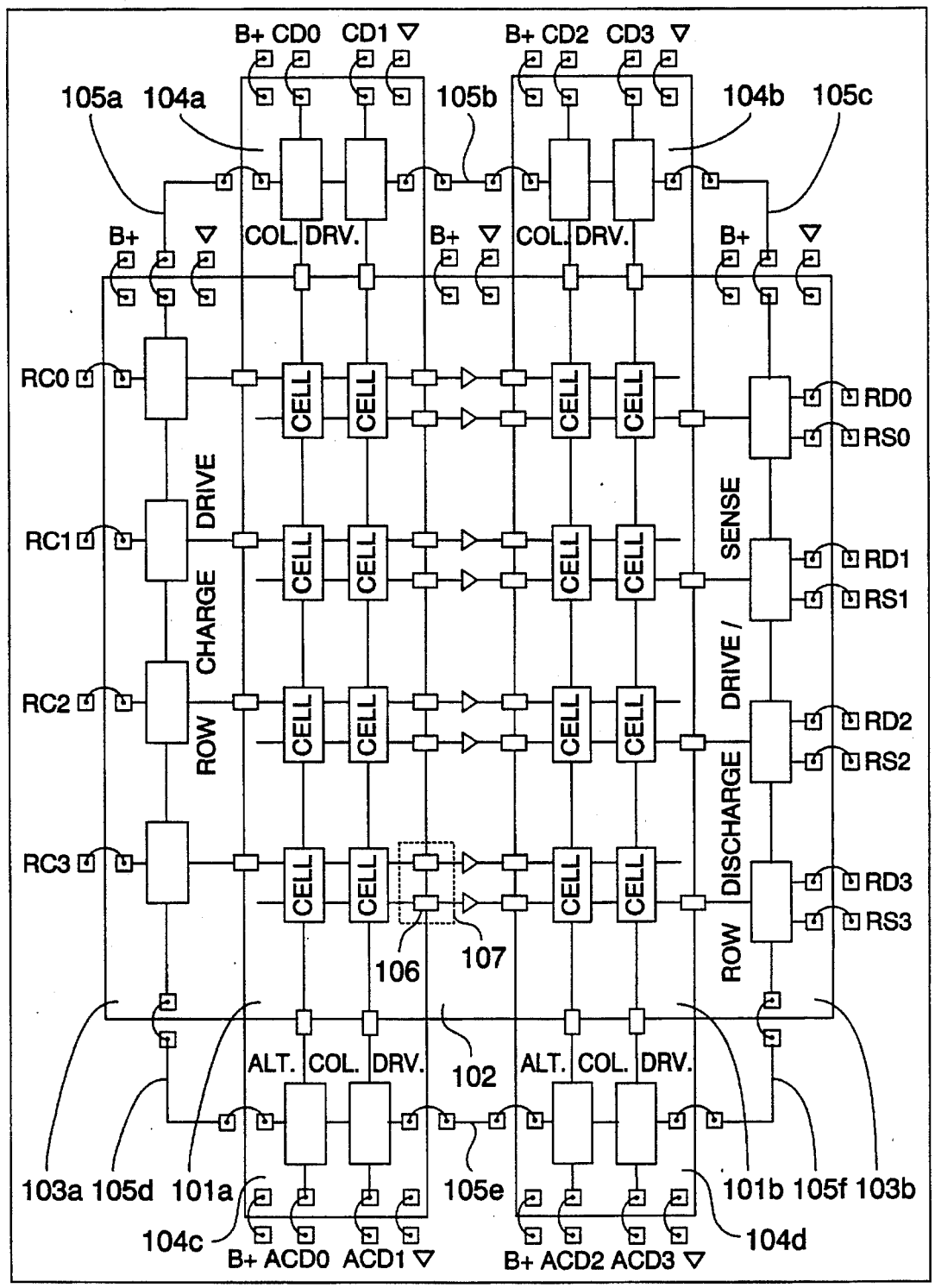
FIG. 5 is a top view of a semi-monolithic integrated memory assembly.

FIG. 5 depicts an embodiment of the circuitry shown in FIG. 1, but with four rows of cells intersecting each column, rather than just two rows as shown in FIG. 1. As shown in FIG. 5, a means of physically connecting circuit traces 106 (per FIGS. 8a and 8b) which connect monolithic integrated circuitry such as the circuitry described in FIG. 1 (but with FIG. 5 including the row reverse current feedback reduction diodes of FIG. 1, now shown, as part of each cell array die), is as follow: The semi-monolithic integration (SMI) method is used to connect floating cell memory monolithic circuit dice (such as 101a) to booster amplifier monolithic circuit dice (such as 102), which in turn connect to other floating cell memory monolithic circuit dice (such as 101b) sequentially to create a hybrid circuit comprising alternating columnar ribbons of side-by-side memory and booster dice. This creates a large size X-Y memory where drivers for charging and discharging/sensing memory cells via the rows can be interfaced to the rows at either end of the hybrid X-Y memory formed by the SMI method. Long columnar ribbon-shaped dice may be added at each side end of the memory booster dice group to interface row drive and sense circuits 103a and 103b, and short dice can be added at the tops and/or bottoms of the columnar ribbons to add column drive circuits 104a and 104b, and alternate column drive circuits 104c and 104d. Random access selection circuits may be combined to be monolithic with the driver circuits, or may in turn be SMI attached to the driver circuits. Column drive circuits 104a and 104b which connect the memory columns to a common bus 105a, b, c, d, e and f through solid-state switches may be fabricated as part of the column/row memory monolithic circuits, but preferably are fabricated separately as shown in FIG. 5 and SMI attached to the ends of the memory monolithic circuits. This allows the different fabrication processes for the memory cells and drive/sense circuits to be applied to separate dice, to reduce cost. For the SMI process to create reliable electrical connections, it is preferable that the SMI connected dice be attached to a lower substrate which is of the same material as the monolithic circuits (such as silicon over silicon), as follows.

SMI is accomplished with special design and fabrication techniques. All the monolithic dice used are rectangular. All such dice are cut from wafers which have been machined to the same thickness, this thickness having been machined to be uniform across the plane of each wafer. All such dice are precision sawed by a method such as diamond sawing so as to minimize die edge kerf irregularities and to achieve jig grinder-like cutting precision.

Figure 6A:
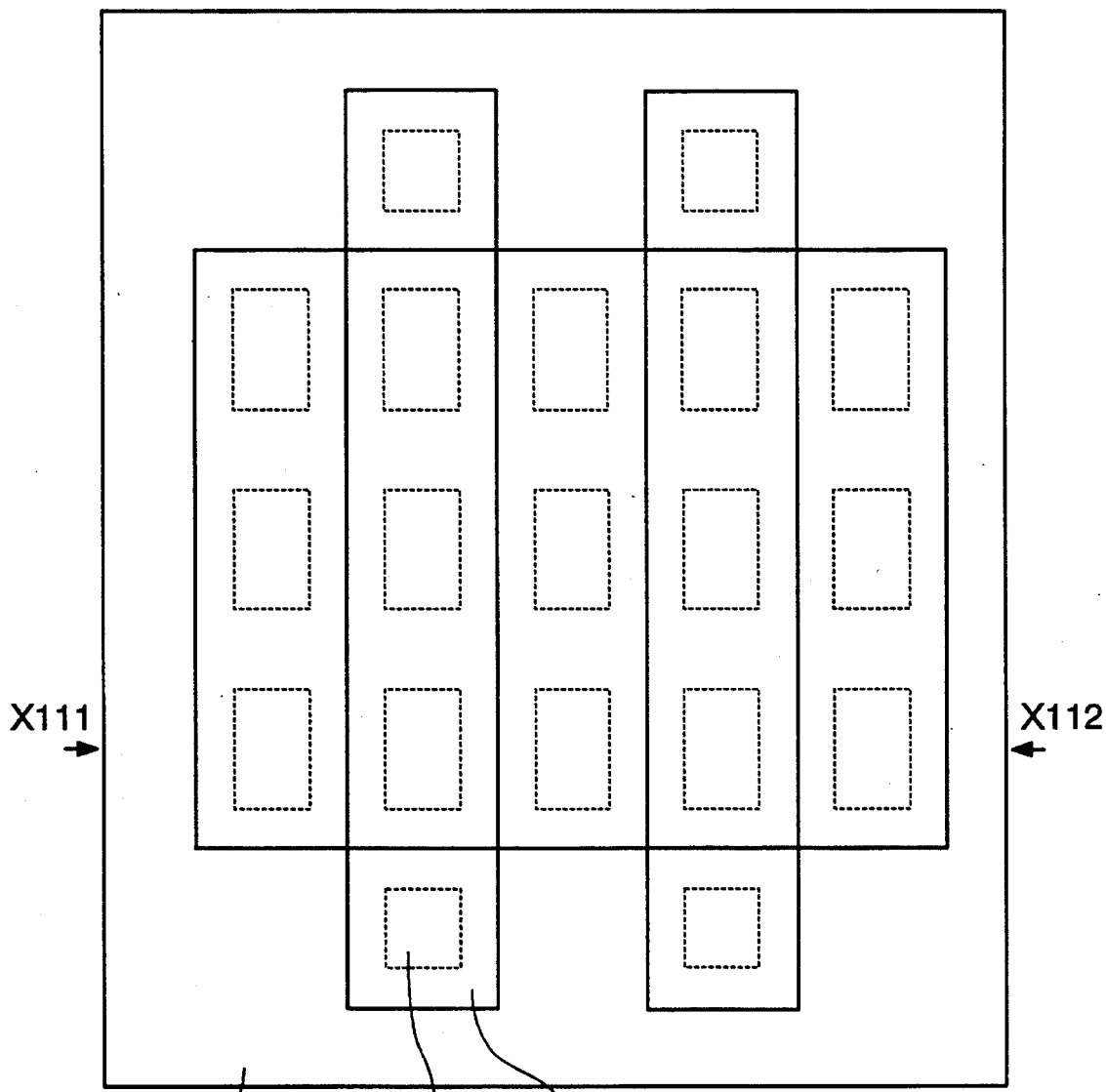
FIGS. 6a and 6b are respectively top and sectional views of semi-monolithic integrated upper dice and a lower substrate showing attachment holes filled with epoxy.
Figure 6B:
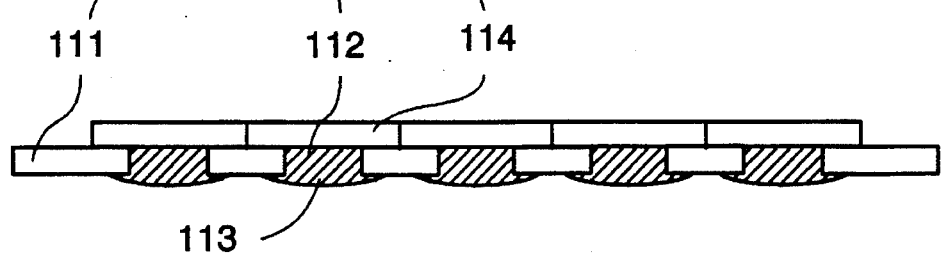

Lower substrates used are preferably of the same type of material as the dice (typically silicon) to permit matching thermal expansion characteristics, although less expensive material (such as silicon created by less expensive processes) can sometimes be used where the application permits it. As shown in FIGS. 6a and 6b, substrates 111 may be monolithic pieces of precision cut silicon wafers with holes 112 cut or etched in them. These holes 112 are then filled with a bonding agent 113 such as epoxy. This allows permanent attachment between the SMI dice 114 and the lower substrate 111. Alternatively, as shown in FIGS. 7a and 7b, cross strips of silicon 121 may be joined to the undersides of the SMI dice 122 by filling in the gaps between the silicon strips with a similar bonding agent 123. Either method allows the SMI dice to be pre-positioned on a precision flat surface prior to the SMI interconnection process. The first method is preferred for mechanical (and thus electrical) durability in the resulting SMI circuit. The second method is preferred where it is desired to use less silicon in the lower substrate level 121 and eliminate the expense of forming holes 112 through the lower substrate 111 by etching or other means in the event that such means are not available or convenient. If cost permits, a third continuous silicon substrate (not shown) can be added below the cross strips 121 to unify the structure with a flat continuous surface, if the bonding agent is not allowed to extend below the lower surface of the second level down cross strips, rather than as shown.

FIGS. 8a and 8b respectively depict a top and sectional view (taken between points X131 and X132) which expand and add detail to the pair of SMI links depicted in region 107 of FIG. 5. As shown in FIGS. 8a and 8b, dice to be connected are fabricated with trace continuations 131a and 131b made from a conductive material such as doped silicon or polysilicon (or a metal) extending from contact with the central (operating) portions 132a and 132b of each dice. These trace portions 131a and 131b extend out toward the edges 133a and 133b of each die where interconnection is to take place. The abutting circuits to be SMI connected are masked 135a so as to expose only the edges 134a and 134b of the dice to be connected. A filler 135b which covers the kerf 136 is then added over the unmasked (non-trace) region 134a and 134b. Selective epitaxial silicon is desirable for this step in some applications due to its ability to grow laterally as well as vertically, thus crossing the kerf. If the kerf is straight and smooth enough, this masking and filler step can be skipped. The abutment region is then masked again to a slightly wider dimension 137a and a filling/insulating layer 137b (such as deposited silicon dioxide) is added. The abutment region is then masked again to a slightly wider dimension 138a and a conductive layer 138b (such as a deposition of heavily doped polysilicon matching the conductive traces 131a and 131b doping, or a metal connecting with metal or heavily doped traces 131a and 131b) is added. The edges of this conductive layer 138b contact the ends of the conductive traces 131a and 131b to be joined, and temporarily short circuit the adjacent trace ends on each monolithic circuit die being joined to each other, as well as to those on the abutting die. Standard photo-lithographic mask and etch techniques are used to remove the unwanted conductor between the adjacent trace ends which is now short circuiting the abutting conductive traces. This results in a physically integrated structure which is now electrically integrated as well, hence "semi-monolithic." If monolithic dice edges (such as 133a and 133b of the abutting dice) are beveled so as to slope down toward the lower substrate, and optionally with a gap between them on the lower substrate, then the filling requirements of layers 135b and 137b (which then continue down the bevelled edges and across any gap) may be less demanding. In this case, some applications may be able to eliminate one or both of these layers, and the 138b layer may make a sufficient connection from one trace, down the beveled edge, across the gap if any, up the other beveled edge, to the other trace, without the fillers underneath (followed by the aforementioned etching to separate the adjacent traces from each other). If the fillers are required, then they are deposited before the conductive layer across the beveled edge connection as with the abutting edge example. In either the abutting orthogonal edge embodiment or the beveled edge embodiment, conductive material may be deposited thickly and deeply etched by a process such as reactive ion etching, resulting in a thick trace which has increased physical integrity and durability.

When the SMI method is used to interconnect monolithic dice, it may optionally be desired to supplement the SMI connections with standard bonding connections as well, as shown around the periphery of the SMI connected dice of FIG. 5. This is left to designer preference regarding such considerations as fabrication cost, and in some cases, engineering requirements of power transfer.

Figure 9:
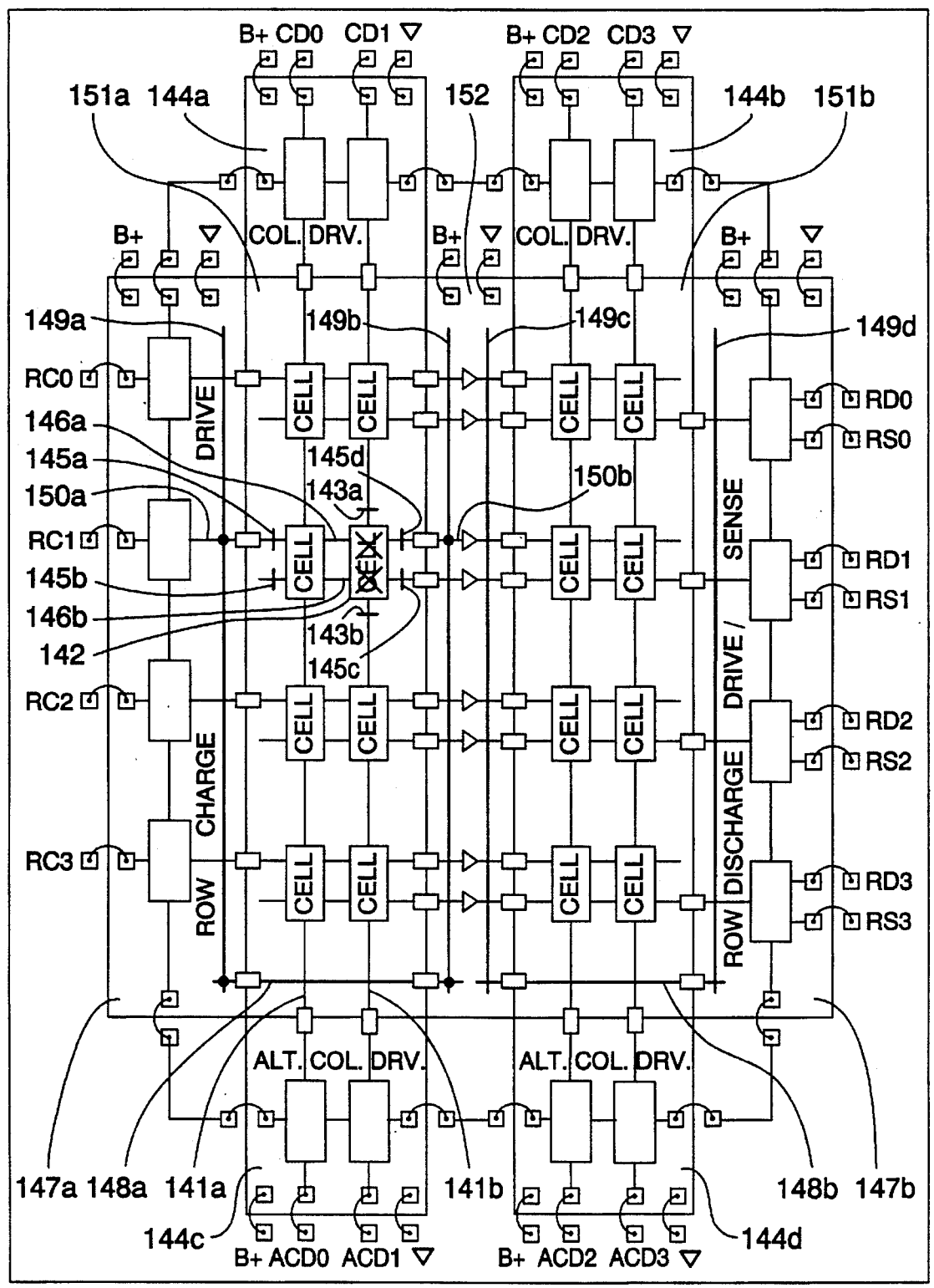
FIG. 9 is a top view of a region of a floating cell memory which contains a region of a row pair which has been isolated by laser evaporation, and feed-though traces which bypass it.
Figure 11A:
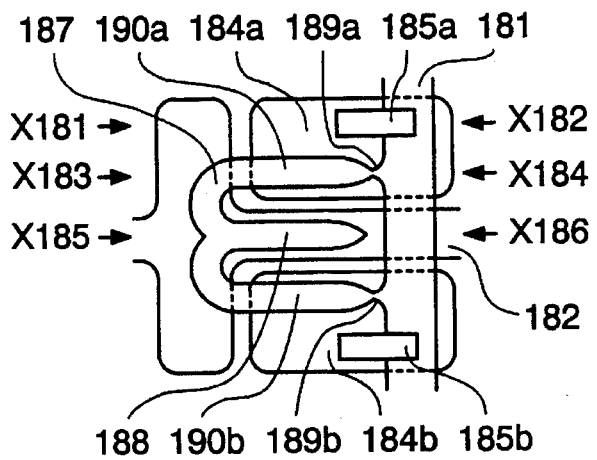
FIGS. 11a, 11b, 11c and 11d are respectively a top view and three vertically expanded sectional views of an electrically moved, cut and welded interconnection point using a cantilevered sprung contact.

Through use of techniques such as non-contact photo exposure combined with careful clean room particulate control, a fabrication environment is created where fabrication flaws may be primarily due to low aspect ratio shaped particulates, or regional non-uniformities which occur during the processing steps. Once this is the case, dice (particularly high aspect ratio shaped dice such as the ribbon shaped dice previously described as preferable for the floating cell memory cell dice) can conveniently be divided up into bad regions along the ribbons (i.e. one or more bad rows occurring in a group over the length of the columns). Once these bad regions are identified through inspection or testing, they are flagged to be excised from the usable portion of the die. As shown in FIG. 9, the columns 141a and 141b are constructed in what at the time is the top integrated circuit layer from a deposited conductive material (such as aluminum) which can be selectively evaporated while attached to the underlying integrated circuit. Surgical evaporation is then performed on small portions of the columns 141a and 141b directly above and below (in the column axis) a known fault region 142 using a focussed laser which is capable of producing sufficient heat and which has been appropriately directed to the location to be evaporated. This process creates "opens" 143a and 143b in the conductive columns to electrically isolate the fault region 142, so that subsequent isolation of the rows in the fault region 142 will completely electrically isolate the fault affected circuitry from the rest of the circuit. This creates a situation where good complete columns can exist to the left and (not shown) right of the fault region 142, and good partial columns exist leading to just above and just below the fault region 142, thus allowing all other floating cell memory cells to be accessible from column drivers 144a, b, c and d located at opposite ends of the columns, while the fault regions cease to be used. Metal traces 145a, b, c and d connecting the conductive rows 146a and 146b to the outside edges of the die (or to a continuation of the rows, not shown, which repeats the circuit(s) on the other side of the connections) are then surgically evaporated in a like manner to effectively excise the rows from the circuit. Locating the drivers 144a, b, c and d at both ends of the columns 141a and 141b allows the columns 141a and 141b to be driven (i.e. grounded or solid-state switched through to the row driver/sensors 147a and 147b) from both ends so that the excised region will not effectively eliminate the use of the rest of the column beyond it.

Figure 10A:
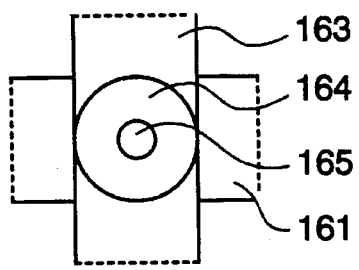
FIGS. 10a and 10b are respectively top and side views of a laser welded interconnection point using an annular ring which melts to connect to a lower trace.
Figure 11B:
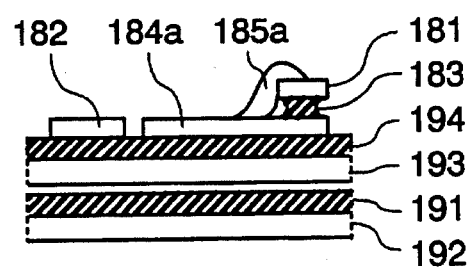
Figure 10B:
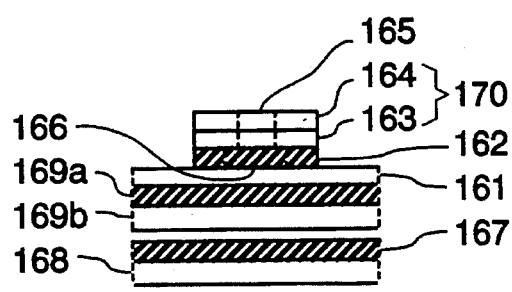
Figure 11C:
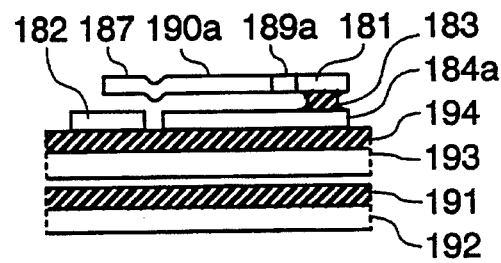
Figure 11D:
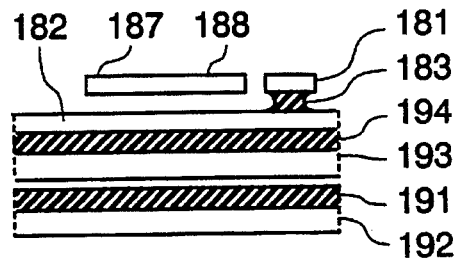

To support the fault correction process, a means is necessary to provide conductors to bypass the excised fault zones: To support this requirement, feed-through rows 148a and 148b can be placed intermittently down the column between the row pairs (not shown), or alternatively placed at the upper and/or lower (as shown with 148a and 148b) ends of the columns. Preferably a multiple of feed-through columns (as shown singly in 149a, b, c and d) and rows (as shown singly with 148a and 148b) are constructed on each memory monolithic die such as 151a and 151b, and/or on some other monolithic dice which are interfaced to the memory monolithic dice, such as the booster die 152, or on separate dice dedicated to this purpose. The objective of these columns 149a, b, c and d and the feed through rows 148a and 148b is to provide bypassing circuits for the rows 146a and 146b which have been excised. To accomplish this, a means of connecting feed-through rows 148a to the columns 149a and 149b, and the columns 149a and 149b to the row traces 150a and 150b leading to and from the excised rows is necessary. Two methods are provided to support this:

A first method as shown in FIGS. 10a and 10b is to provide weldable conductive (such as aluminum) traces for bypassing row conductors 161 below weldable conductive (such as aluminum) traces for bypassing columns 163, separated by an insulating material 162 such as silicon dioxide or silicon nitride, using standard integrated circuit fabrication methods. The bypassing column traces 163 include an annular ring 164 or equivalent over each overlap point with the rows 161 underneath. Each ring 164 extends above the column trace 163 (with the center hole 165 through the ring 164 and column trace 163 exposing the row trace 161 that the ring 164 is located above), where the additional level of conductive metal deposition 164 creating the ring is combined with the conductive metal material in the lower portion of the column trace 163 to effectively thicken the ring, per 170. Insulation material 162 below the hole 165 in the thickened ring 170 is etched away 166 to undercut the thickened ring 170 beyond the width of the hole 165 in the middle of the thickened ring 170. This results in a thickened ring 170 located over a flat layer of metal (part of the row 161). Heating this thickened ring 170 (and the lower trace 161 through the hole 165 at the same time) with a laser causes the thickened ring 170 to melt, drop down (due to gravity), and weld to the lower conductive trace 161 when heated in a shielding atmosphere (such as argon gas) or in a vacuum. Additional force (supplemental to gravity) can draw the molten conductive material of the thickened ring 170 down to the lower conductor 161 by exerting sufficient static potential between the column 163 and an insulated conductive backplate. The backplate may be substrate 169b, or a backplate (such as 168) added for the purpose, which is separated from the substrate by insulative layer 167. Unless substrate 169b is used as such a backplate, or unless it needs to be conductive for some other circuit purpose, substrate 169b may be made of an insulative material. Welding can be enhanced by placing a charge between the column 163 containing the thickened ring 170 and the lower row trace 161 so as to cause a spark and a small plasma flow to occur at the weld site.

Selection of welding parameters follows those used in standard shielded welding practice. The proper selection of thickened ring 170 size and thickness, hole 164 size, laser intensity and dwell time, welding enhancement charge, backplate 168 static potential and atmospheric environment can be combined to create a calculated ("programmed") weld, when this process is "tuned" to place the aforementioned parameters at the midpoint of the range that will allow them to work, thereby providing a margin of tolerance when the parametric settings drift somewhat.

A second method shown in FIGS. 11a, 11b, 11c and 11d for forming connections between two overlapping conductors 181 and 182 is as follows: The lower 182 and upper 181 trace (made from a weldable and bendable material such as aluminum) are separated by an insulator 183 (such as silicon dioxide or silicon nitride). On the lower level, horizontally adjacent to the vertical overlapping of the two traces, are conductive "lands" or "pads" 184a and 184b. When the upper trace 181 is originally formed by the etching process, it includes a suitably thin (flexible in the cantilever axis) structure 187 with cantilever-like extensions 190a and 190b which extend out over the region above the pads 184a and 184b, and also (per 188) over the lower trace 182 which is between the pads 184a and 184b. In greater detail, this cantilever structure 187 is actually a thin "W" shaped structure which extends out from the upper trace 181 over the lower pads 184a and 184b, and then doubles back 188 in between the pads 184a and 184b toward the upper trace 181 over the surface of the lower trace 182. The extensions 190a and 190b of the "W" 187 which are above the pads 184a and 184b and pointing toward the upper trace 181 are joined to the upper trace 181. The extension 188 of the "W" 187 above the lower trace 182 surface which is pointing toward the upper trace 181 approaches the upper trace 181, but does not quite reach it. This structure 187 is formed with narrow necks 189a and 189b at its connection to the upper trace 181. It is also desirable that the extensions 188 and 190a and 190b of the "W" 187 pointing toward the upper trace 181 be tapered as they approach the upper trace 181 (i.e. they get wider in the portions that are father away from the upper trace 181). Insulator 194 is used to separate the aforementioned circuitry from the substrate 193. Conductive material deposited when the upper trace 181 and "W" 187 are formed also creates connections 185a and 185b between the upper trace 181 and the lower pads 184a and 184b. To accomplish this, the insulator covering the regions of 185a and 185b to be connected is first etched away to allow the deposition at 185a and 185b to make contact between trace 181 and pads 184a and 184b. Once the conductive structures of the FIG. 11 group have been formed, the insulative material separating "W" 187 in the upper layer from pads 184a and 184b and trace 182 of the lower layer is undercut-etched away from the region directly beneath "W" 187 and its immediately surrounding region, as required to accomplish the etch. (This includes necks 189a and 189b, and the tapered portions of 190a and 190b and 188.) As an option depicted in the FIG. 11 group, a subsequent conductive deposition can create connectors 185a and 185b after the undercut etching step, if this step is also used to clear the area where connectors 185a and 185b are formed, particularly if it is desired that connections 185a and 185b be made of an alternate material such as doped polysilicon.

As an additional option, "W" 187 may be constructed with a modified form, the necessary features being the ability to deflect, and the ability to deform after a first contact so as to make a second contact and thus cause an electrical connection by contact, preferably with spark welding. A single "U" representing one-half of the "W" shown, but with just one pad, represents a variation on the embodiment shown in the FIG. 11 group which does not include the torsion compensating aspects of the "W" shown, but can still be made to contact under more difficult circumstances. Changing the relationship of the necks 189a and 189b and cantilevers 190a and 190b can also still allow deflection of cantilever 188, but without necessarily providing the same degree of lateral torsion control as in the depicted embodiment.

To cause an electrical connection to be formed, a charge is placed between the upper 181 and lower 182 traces, optionally combined with a much higher charge placed between the upper trace 181 and an insulated 191 static backplate 192 below the die substrate 193. The free extension 188 of the suitably thin "W" 187 above the lower trace 182 is drawn down by force of static attraction to touch the lower trace 182. Because of the difference in potential between the upper 181 and lower 182 traces, and thus between the free extension 188 contacting portion and the lower trace 182, a spark is created as the free extension 188 of the "W" 187 draws into contact with the lower trace 182. At the same time, current flowing through the necks 189a and 189b connecting the other extensions 190a and 190b of the "W" 187 to the upper trace 181 causes the necks 189a and 189b to be melted (in the manner of a blown fuse). The charge between the upper 181 and the lower 182 traces is calibrated so that a predictable part of it is initially dissipated during the bending, contact and fusing process. When the originally free extension 188 of the "W" 187 makes contact with the lower trace 182 and the thin upper necks 189a and 189b melt, the now free portions 190a and 190b of the "W" 187 above the pads 184a and 184b are drawn down into contact with the pads 184a and 184b through spring tension in the "W" 187, and static attraction between the "W" 187 (which is now at the lower static potential) and the pads 184a and 184b (which are always at the upper trace 181 potential). When the portion of the "W" 187 where the melted necks 189a and 189b were makes contact with the lower pads 184a and 184b, the remaining potential difference between the upper 181 and lower 182 traces is discharged in a subsequent spark or pair of sparks as the temporarily free melted neck 189a and 189b ends of the "W" 187 make contact with the pads 184a and 184b. The spark(s) allow(s) the tapered extension ends of 190a and/or 190b and 188 of the "W" 187 to weld to the lower trace 182, and then to the pads 184a and 184b (when performed in a shielding gas or vacuum environment as required for some weldable materials, such as aluminum). Subsequent deposition of an insulating material (not shown) such as silicon dioxide effectively seals and pots the connection. Preferably, the charge causing the welding and necks 189a and 189b melting is controlled and metered by a programmed active source, preferably with sensing of changes in current, so that it can be increased or attenuated at each rapidly progressing step of the process. More crudely, a single resistive/capacitive source can discharge an appropriate charge at an appropriate rate so that the physical design of the circuit will utilize it effectively as the welds, makes and breaks occur. Selection of welding parameters follows those used in standard shielded welding practice. Static attraction of the cantilever portions can be supplemented by placing a much larger voltage between the upper 181 or lower 182 trace and an insulated lower conductive plane such as the insulated 191 lower plate 192, or insulated substrate 193 (which may be an insulated 194 conductor 193, or substrate 193 may itself be made of an insulative material) in the manner of the prior connection method. (If the potential difference is great enough, attraction will occur to cantilevers at either the upper 181 or lower 182 trace potentials.)

The structure of FIGS. 13a, b and c (which, as indicated, uses many of the techniques of the structure of FIGS. a, b and c) describes a type of electronic integrated circuit memory element structure comprising (a) at least a plurality of electronic integrated circuit components which are semiconductor devices, said electronic integrated circuit memory element structure occupying an integrated circuit die having a general plane which is predominate, (b) where fabrication process steps to create said electronic integrated circuit memory element structure include at least one mask which is substantially in said general plane of said integrated circuit die, and substantially perpendicular extension of each said at least one mask, (c) said at least one mask and each said substantially perpendicular extension being substantially oriented around a central axis which is substantially perpendicular to each said at least one mask, (d) said electronic integrated circuit components being stacked in a column which is perpendicular to said general plane, and said central axis of each said electronic integrated circuit component being substantially centered around a central columnar axis which is substantially perpendicular to said general plane which is predominate on said integrate circuit die, (e) said electronic integrated circuit components being stacked in component relationship of an architectural column comprising at least one upper capital component, at least one central component, and at least one lower base component, (f) said electronic integrated circuit memory element structure being an element of a memory composed of one or more such electronic integrated circuit memory element structures, said electronic integrated circuit memory element structures being memory cells, and (g) said electronic integrated circuit memory element structure comprising conductive means for both reading and writing to said electronic integrated circuit memory element structure.

The structure of FIGS. 13a, b and c (which, as indicated, uses many of the techniques of the structure of FIGS. 3a, b and c) further describes an electronic integrated circuit memory element structure as defined above, (a) where central structural portions of said components are bounded at least at some point in said fabrication process by trenches extending in at least one axis of said general plane which is predominate, (b) where said trenches define each said substantially perpendicular extension of each said at least one mask, said trenches bounding an extension which is solid material, (c) where said trenches act as edges which define a center of each said central structural portion, (d) where said edges also extend in said at least one axis of said general plane which is predominate, (e) where said centers substantially coincide with or substantially cross through said central columnar axis, (f) and where said trenches are filled with solid material in subsequent fabrication process steps.

The columnar cell structure of FIGS. 13a, b and c can also be constructed using pillar cell technology. In either case, as before, standard masks can be used where required to define planar cross sections of structures and substructures being fabricated, and the structures or substructures formed by trench etching below the masks. This technique was specifically described in the fabrication description of the FIGS. 3a, b and c group structure. It was likewise used in the the fabrication of the FIGS. 13a, b and c group structure, as indicated at the start of the description of the FIG. 13 group structure where the reference was made to the FIG. 3 group structure being modified to the form of the FIG. 13 group structure, hence the FIG. 13 group structure was fabricated using the described techniques of the FIG. 3 group structure except where fabrication techniques were noted because they were specifically different. A method for fabricating this pillar cell version of the FIG. 13 group structure is described subsequently in a fabrication sequence which results in a structure which also has the characteristics described in the preceding two paragraphs. In the subsequent fabrication description, conventional wet etch methods may be substituted for RIE methods, except where trench etching or similar anisotropy is required.

Also included in the subsequent fabrication description is a method for expanding a pillar capacitor's peripheral surface area, thereby facilitating trench etching around the pillar by allowing trenches etched to be wider with respect to their depth than they would otherwise be if said central pillar structure had been wider to begin with. In the subsequent fabrication description, expanding of the pillar capacitor's peripheral surface area is accomplished by first trench etching a region surrounding a central pillar structure of the pillar capacitor, followed by coating the central pillar structure with a supplemental coating which thickens the central pillar structure. The supplemental coating is then severed at its upper and lower horizontal surfaces so as to break continuity between the supplemental coatings covering adjacent central pillar structures. The supplemental coating is severed by etching away the exposed tops and bottoms so as to leave a structure which conveniently simply has the appearance of a wider pillar. This technique is typically applicable wherever a pillar capacitor is part of a pillar-type integrated circuit memory cell where the pillar capacitor acts as a data storage element in such a cell by storing charge or lack of charge. It is particularly applicable to standard FET type DRAM cells where the second (outer or non-pillar center) poles of the capacitors do not need to be divided from one another (i.e. they are all electrically linked and typically grounded to the substrate). In such a case, no severing of the subsequent conductive coating for the second pole is required, thereby eliminating the need for the extra processing steps and complexity directed toward this.

In the subsequent fabrication description, the associated FIGS. represent the region from the mid-point between cells on one side to the mid-point between cells on the other side, rather than showing a full trench to each side of the cell center as with the FIG. 13 group.

In the subsequent fabrication description, steps 1 through 21 correspond to FIGS. 14a, b and c through 34a, b and c, sequentially. The a, b and c FIGS. designators correspond to top cross-sectional and two side views, respectively for a given step. The step number for a given FIG. is noted in a label located between the two side views, just above where "FIG. (number) b" and "FIG. (number) c" are shown. These step numbers are preceded by a letter "S" (i.e. "S1" through "S21"), and correspond to the steps 1 through 12 discussed below.

Fabrication for the pillar cell version of the cell described in the FIG. 13 group (assuming more than one cell is fabricated at a time) is as follows:

START: Processing is begun on a P-type silicon substrate shown as 558 P.

1: P-N-P EPITAXIAL LAYERS. Three epitaxial layers of alternating P (541b P, N (548 N) and P (550 P) doped silicon are grown over the surface of the wafer above the P type substrate (558 P). (FIGS. 14a, b & c.)

2: ETCH AND FILL TRENCHES IN FIRST AXIS TO CREATE LOWER CONTROL LINES. Continuous trenches 541e and 541d are etched so as to extend in a first axis using standard techniques such as reactive ion etching (RIE) to a depth sufficient to isolate the preceding P-N-P epitaxial layers, and filled with an insulator such as chemical vapor deposition (CVD) of silicon dioxide, followed by back etch or planarization of the silicon dioxide on top, down to the level of the top of layer 550 P. (FIGS. 15a, b & c.)

Figure 16A:
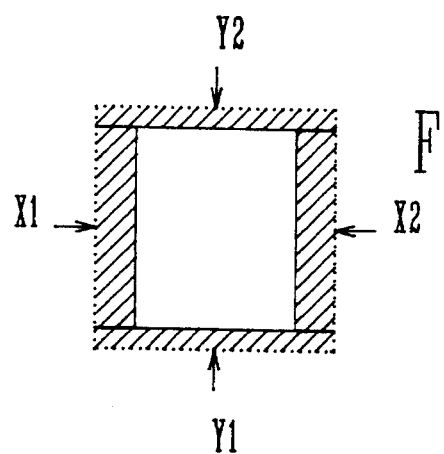
FIGS. 16a, 16b and 16c are respectively a top sectional and two side sectional views of the results of a next subsequent step in the fabrication of the columnar cell structure, where additional trenches have been etched and filled.
Figures 16B, 16C:
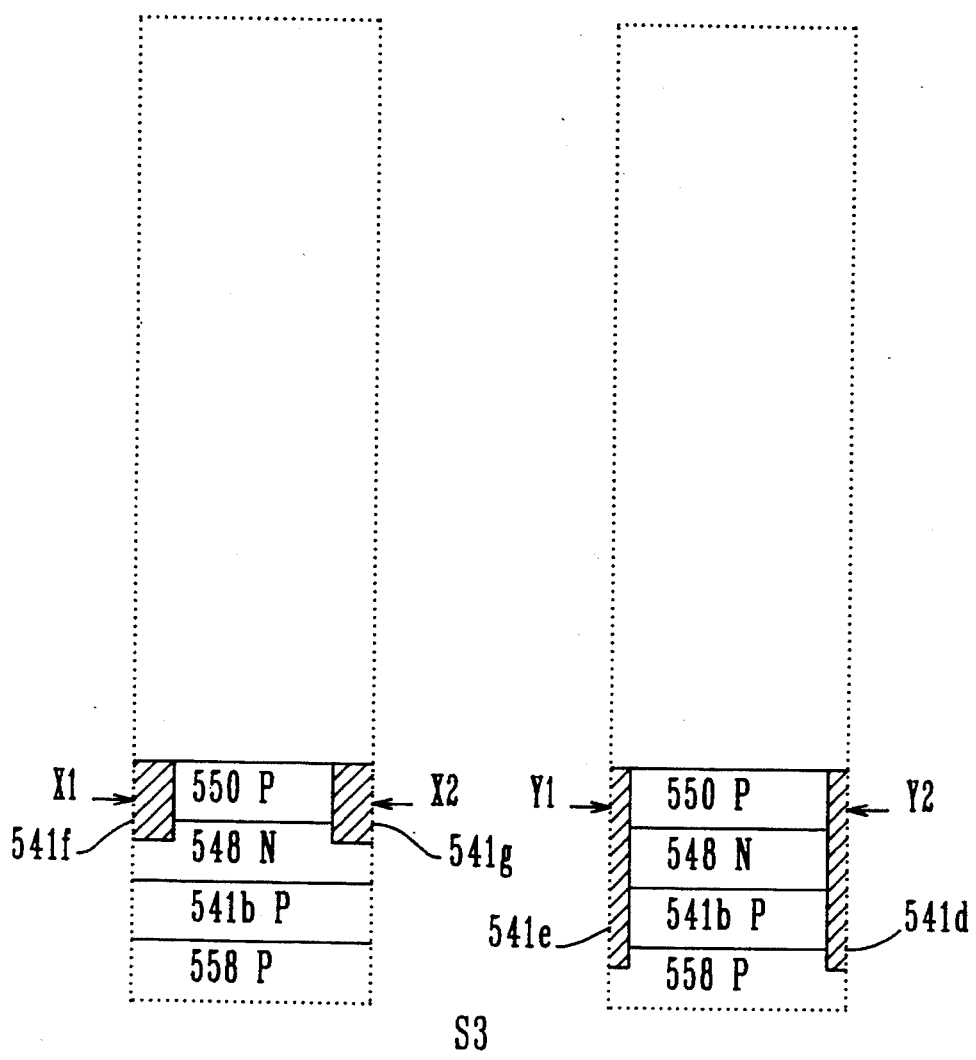

3: ETCH AND FILL TRENCHES IN SECOND AXIS. Continuous trenches 541f and 541g extending in a second orthogonal axis are etched to a depth just below the top of layer 548 N, and filled and back-etched or planarized, all as in step 2. These trenches are created so as to not interrupt the continuity of the lower control lines 548N and 541bP. (FIGS. 16a, b & c.)

4: DEPOSIT, PATTERN AND ISOLATE METAL LAYER. Layer 542a1' of a material which can make ohmic contact to P and N type silicon is deposited over the wafer surface. Tungsten is a preferred material, however other materials such as aluminum may be used when selected structure dimensions are sufficient to account for normal design considerations required with aluminum use such as spiking and migration. The deposited material is patterned so as to cap the 550 P structures, the surrounding material etched away, and the resulting surrounding trench regions 571a, b, c and d filled and back-etched or planarized as in step 2. An indentation is preferably also patterned and etched as shown in the center of 542a1 to aid in retention of the pillar 542b to be formed above. (FIGS. 17a, b & c.)

Figure 18A:
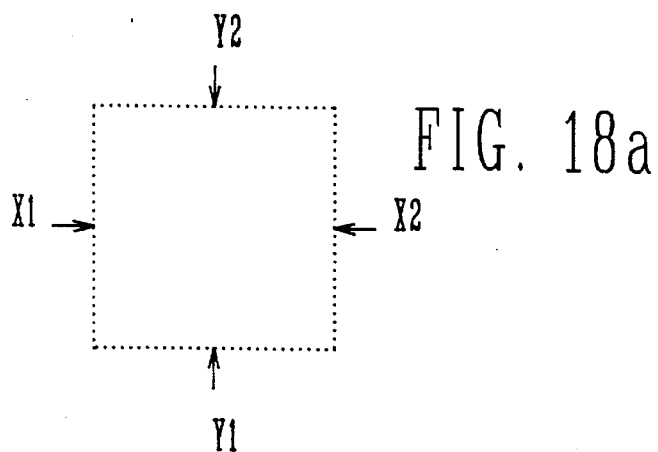
FIGS. 18a, 18b and 18c are respectively a top sectional and two side sectional views of the results of a next subsequent step in the fabrication of the columnar cell structure, where an additional layer of conductive material has been added.
Figures 18B, 18C:
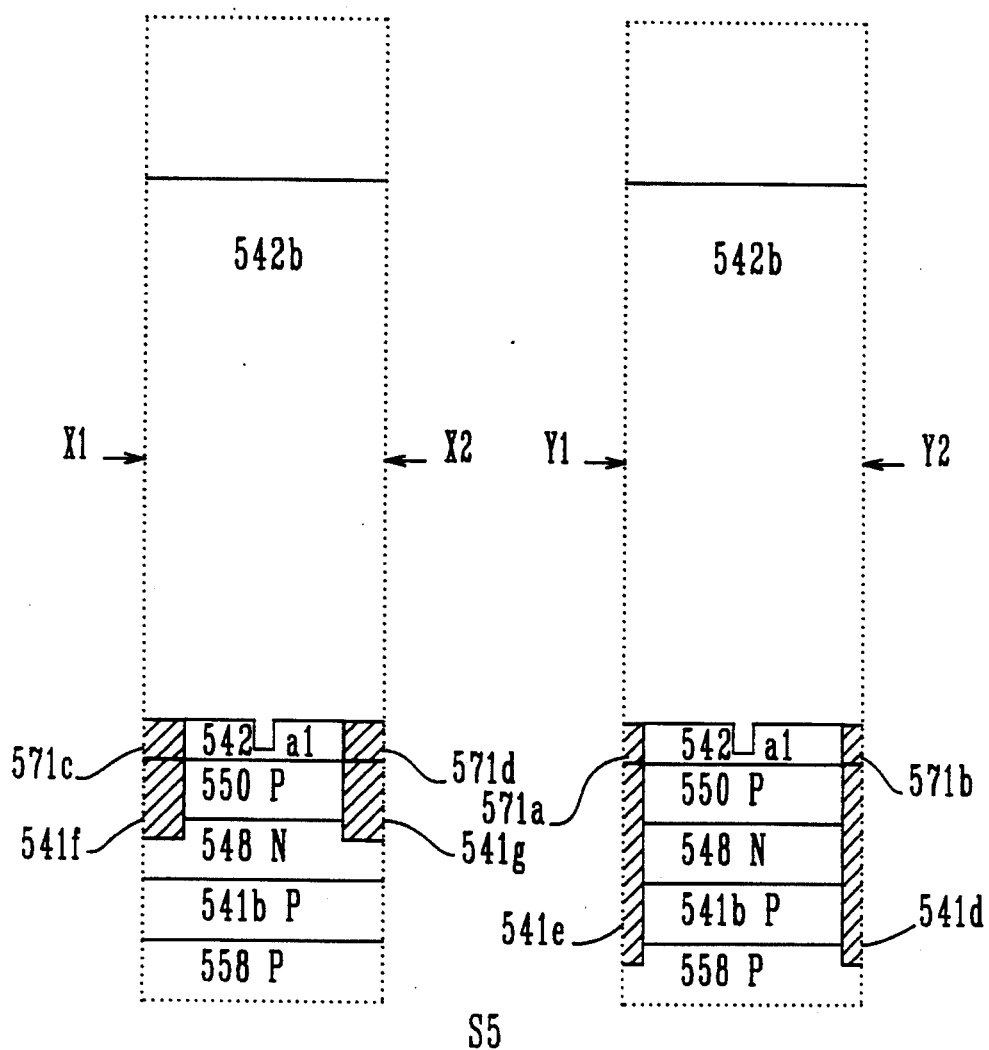

5: DEPOSIT MATERIAL FOR EACH CAPACITOR ELECTRODE CENTER. Polysilicon (or other suitable patternable conductive material) is then deposited over the wafer surface to a thickness slightly greater than the desired eventual height of the capacitor center electrode. (FIGS. 18a, b & c.)

Figure 19A:
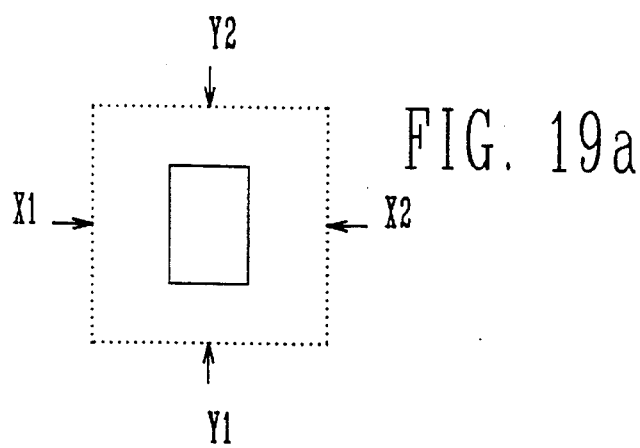
FIGS. 19a, 19b and 19c are respectively a top sectional and two side sectional views of the results of a next subsequent step in the fabrication of the columnar cell structure, where the most recently added layer of conductive material has been patterned and trench etched.
Figures 19B, 19C:
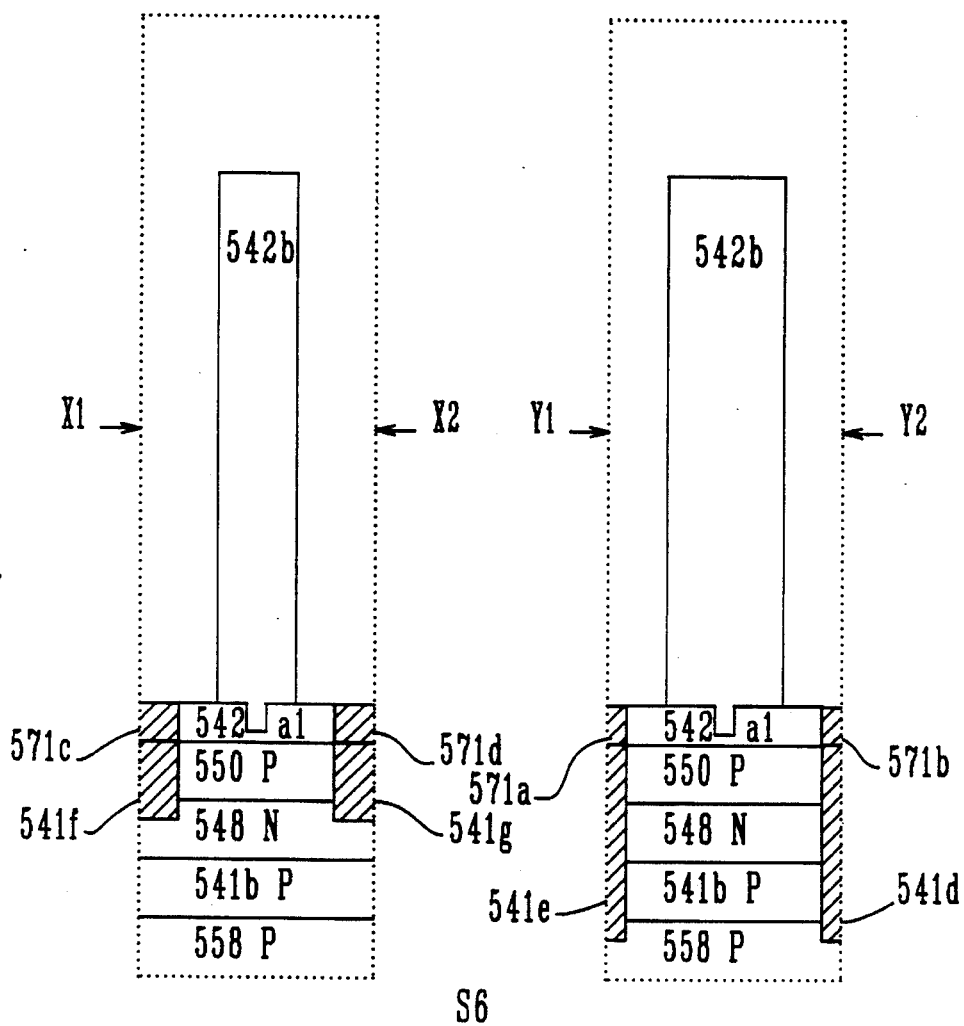

6: PATTERN AND ETCH EACH CAPACITOR ELECTRODE TRENCH SURROUND. The material of step 5 is then patterned and trench etched by standard means such as RIE to form pillars 542b as shown. It will be noted that the trenches surrounding these pillars are wider in one axis than in the other axis, as shown in FIGS. 19a, b and c. These pillars are preferably as tall as possible when the structure is downscaled to increase the capacitance value of the capacitor structure being formed. The material of 542a1 and adjacent insulator is preferably used as an etch stop. (FIGS. 19a, b & c.)

Figure 20A:
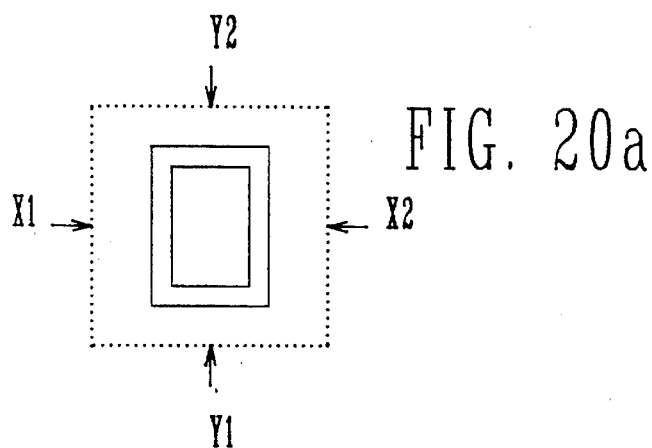
FIGS. 20a, 20b and 20c are respectively a top sectional and two side sectional views of the results of a next subsequent step in the fabrication of the columnar cell structure, where a layer of conductive material has been deposited so as to expand the center structure.
Figures 20B, 20C:
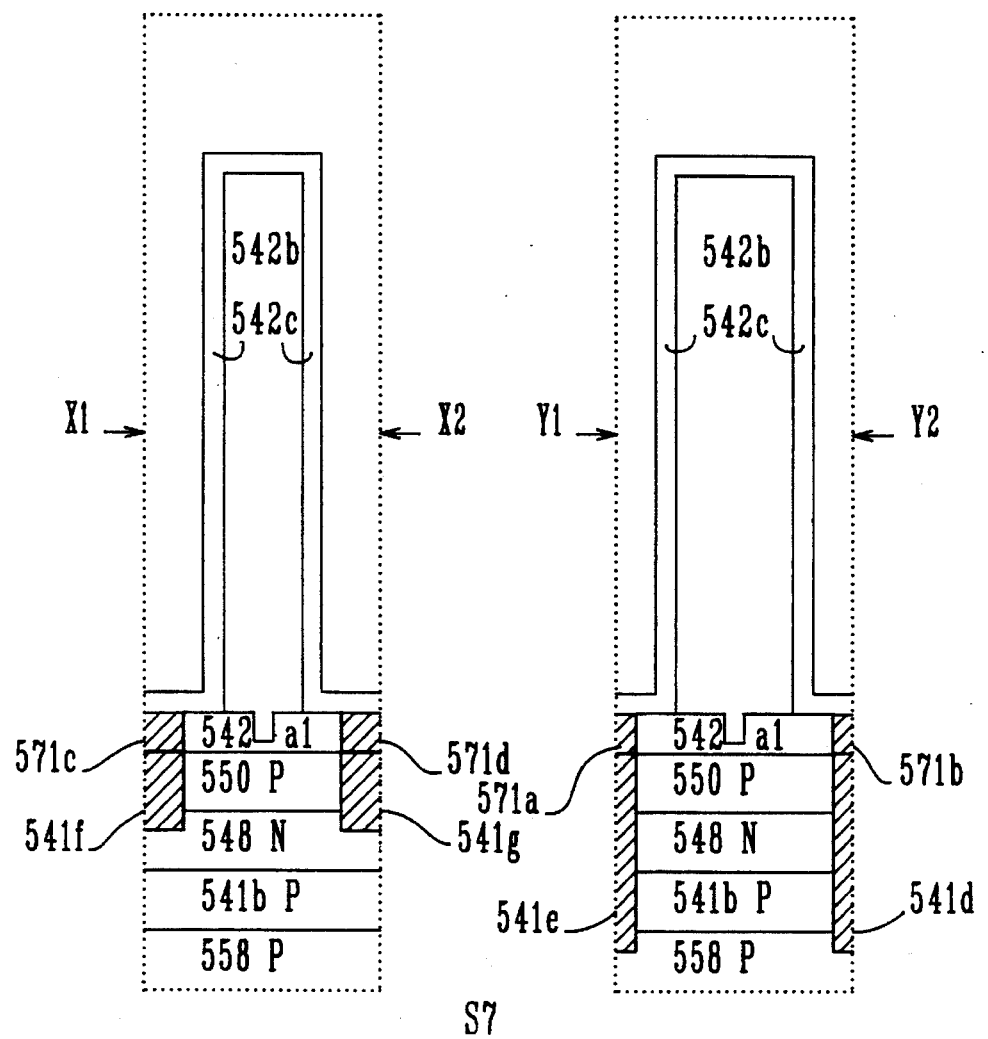

7: DEPOSIT CENTER ELECTRODE EXPANSION MATERIAL. A layer of conductive material 542c which may be doped polysilicon for example, when the center electrode material is also polysilicon, is then deposited omnidirectionally over all surfaces so as to expand the diameter of the capacitor electrode centers 542b. (FIGS. 20a, b & c.)

8: REMOVE TOPS AND BOTTOMS OF EXPANSION MATERIAL. This conductive material 542c is vertically etched by such standard means as ion milling so as to remove its exposed horizontal surfaces, but leave its vertical surfaces remaining. (FIGS. 21a, b & c.)

Figure 22A:
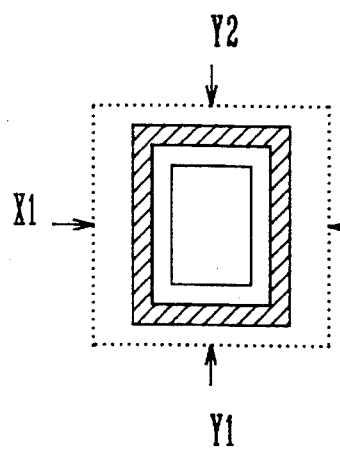
FIGS. 22a, 22b and 22c are respectively a top sectional and two side sectional views of the results of a next subsequent step in the fabrication of the columnar cell structure, where an insulator has been deposited over the upper surfaces.
Figures 22B, 22C:
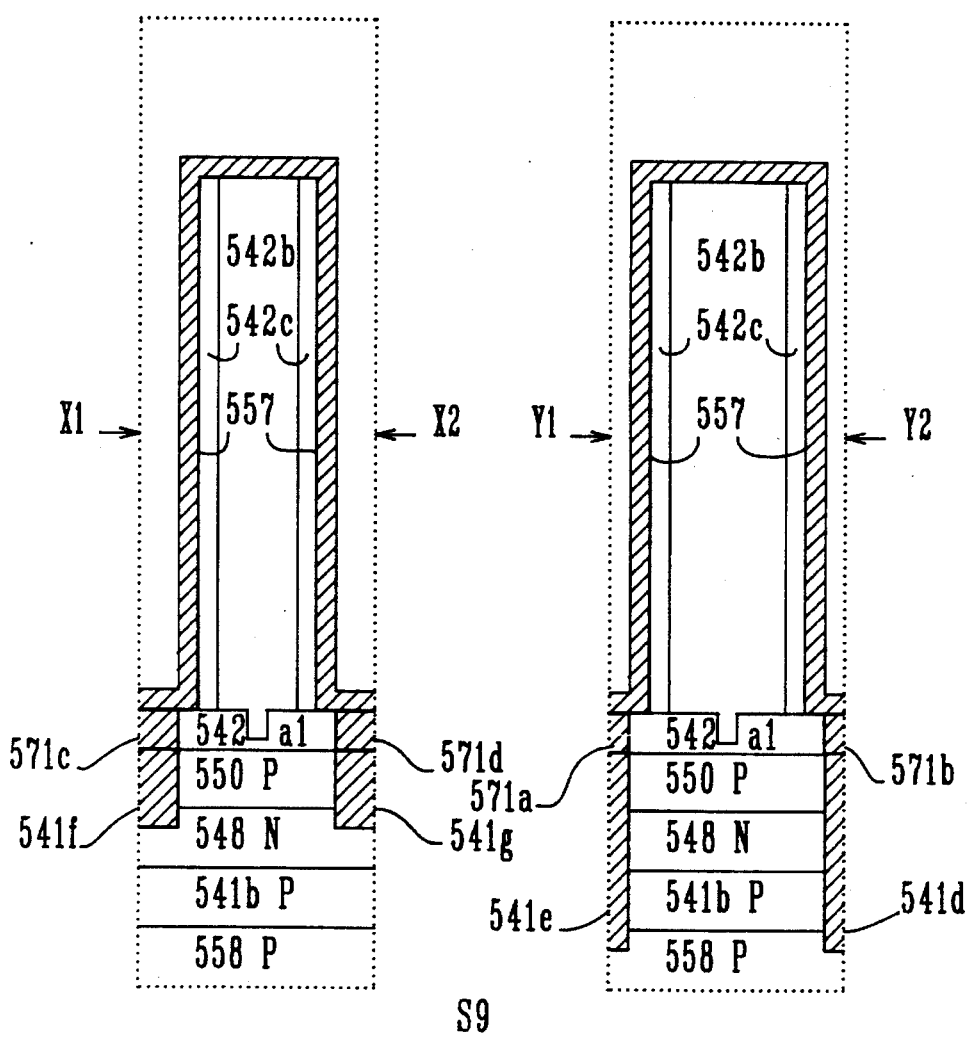

9: DEPOSIT CAPACITOR INSULATOR. A thin layer of insulator material 557 such as silicon dioxide is then deposited omindirectionally by such means as CVD to a suitable thickness for the capacitor insulation. (FIGS. 22a, b & c.) Alternatively, the polysilicon may be thermally oxidized to create a thinner insulative layer.

Figure 23A:
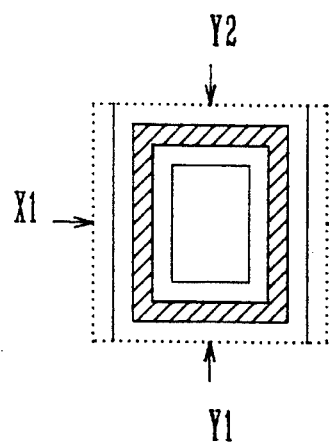
FIGS. 23a, 23b and 23c are respectively a top sectional and two side sectional views of the results of a next subsequent step in the fabrication of the columnar cell structure, where a conductive material has been deposited over the upper surfaces.
Figures 23B, 23C:
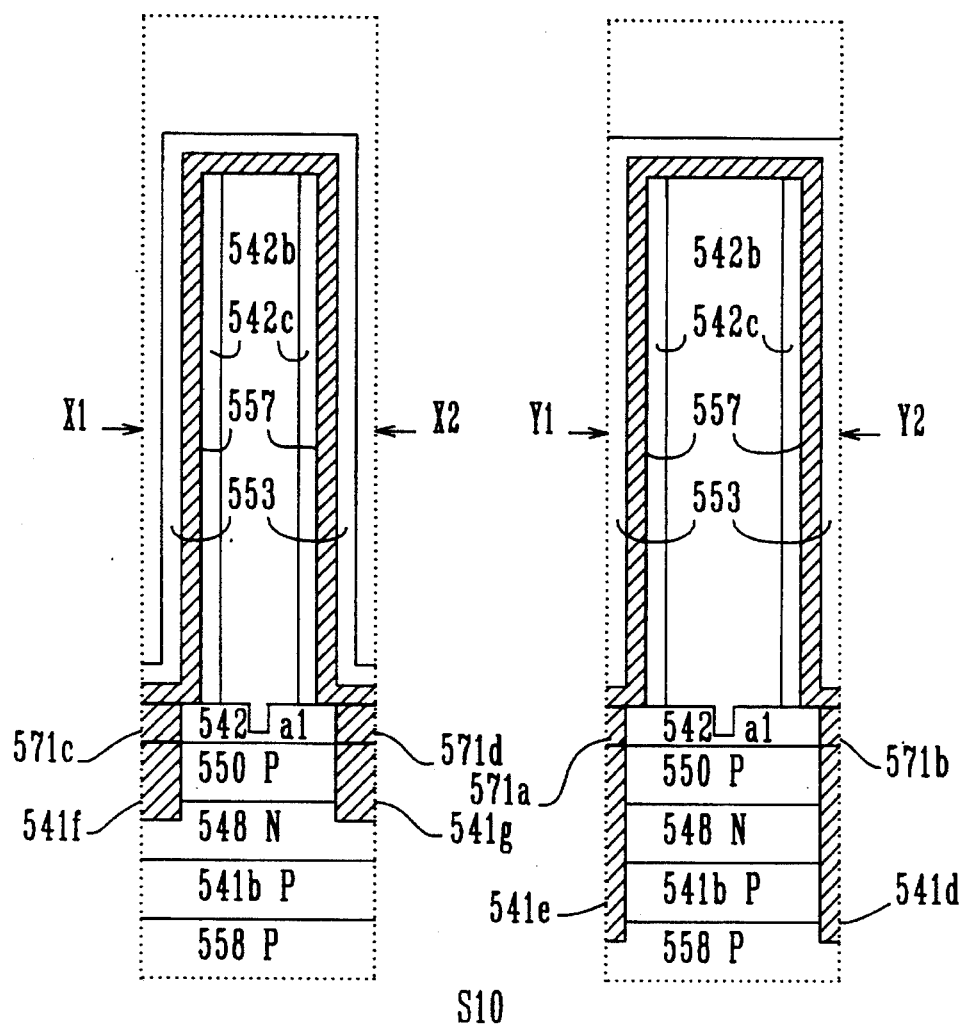

10: DEPOSIT CAPACITOR OUTER ELECTRODE. A layer of conductive material 553 such as tungsten is then deposited omnidirectionally by such means as CVD so as to coat all surfaces, so as to cause the coatings to close together along the first orthogonal axis, but remain gapped along the second orthogonal axis. (FIGS. 23a, b & c.)

Figure 24A:
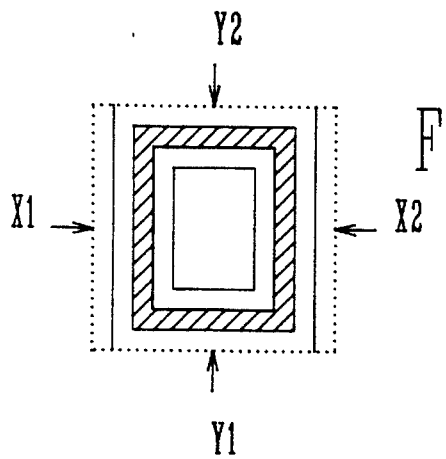
FIGS. 24a, 24b and 24c are respectively a top sectional and two side sectional views of the results of a next subsequent step in the fabrication of the columnar cell structure, where the two most recently added layers have been vertically etched.
Figures 24B, 24C:
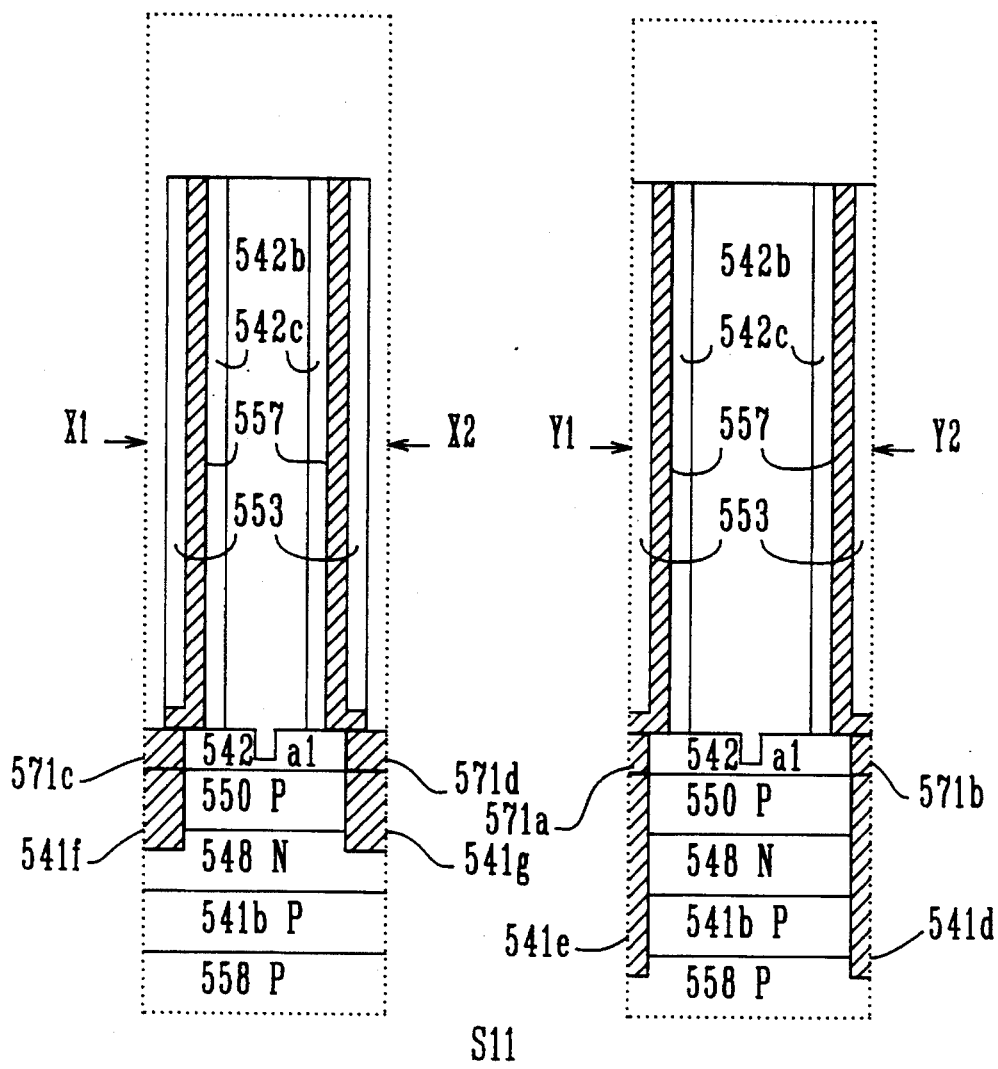

11: REMOVE TOPS AND BOTTOMS OF OUTER ELECTRODE AND INSULATOR. Layers 557 and 553 are then vertically etched by such standard means as ion milling so as to remove their exposed horizontal surfaces, but leave their vertical surfaces remaining, however, with a lower tab of layer 557 insulating the bottom of layer 553, as shown. (FIGS. 24a, b & c.)

12: FILL SINGLE-AXIS GAP WITH INSULATOR. The remaining gap 572a and 572b extending in the axis of isolation trenches 541f and 541g is then filled with an insulator such as silicon dioxide by such means as CVD to create a thinner upward extension of isolation trenches 541f and 541g, thereby creating control lines for the capacitors in the second orthogonal axis. The insulator covering the upper surface is then etched away to the height of 542b by standard directional means such as ion milling or planarization. (FIGS. 25a, b & c.)

Figure 26A:
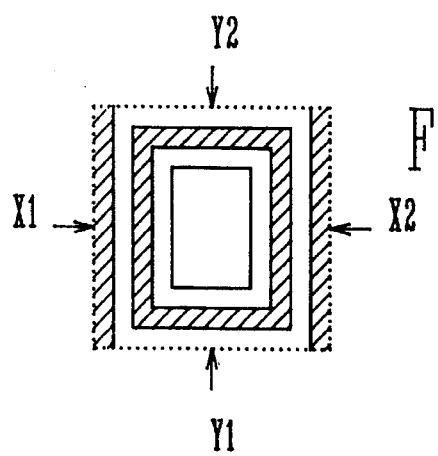
FIGS. 26a, 26b and 26c are respectively a top sectional and two side sectional views of the results of a next subsequent step in the fabrication of the columnar cell structure, where one of the exposed vertical layers has been recessed.
Figures 26B, 26C:
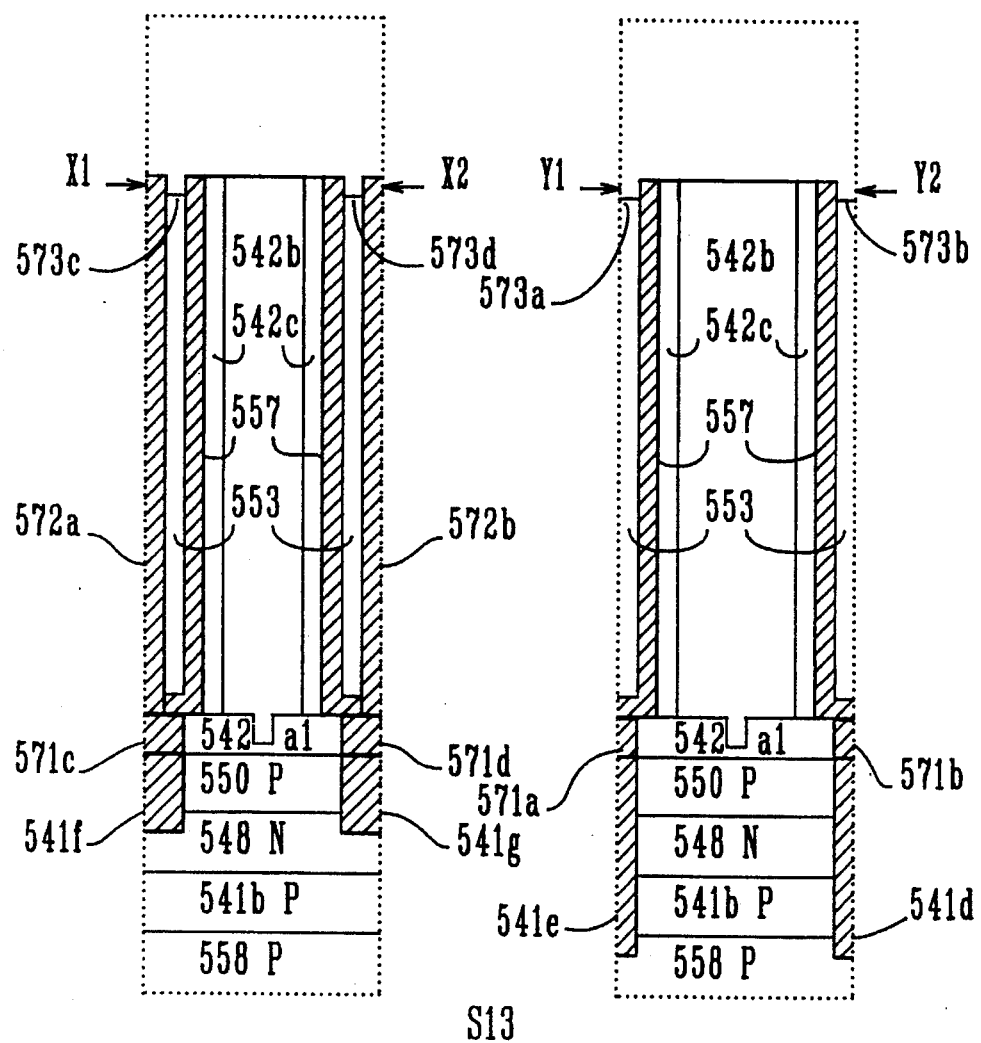

13: ETCH PILLAR SURROUNDS. The conductive material 553 surrounding the pillars after step 12 is then selectively etched down slightly as shown in 573a, b, c and d. (FIGS. 26a, b & c.)

Figure 27A:
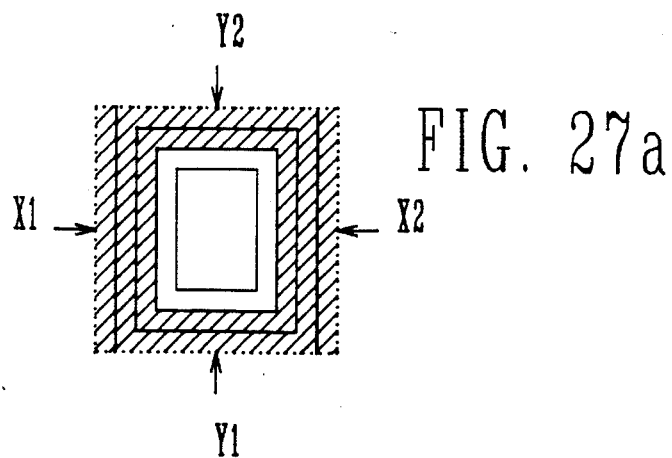
FIGS. 27a, 27b and 27c are respectively a top sectional and two side sectional views of the results of a next subsequent step in the fabrication of the columnar cell structure, where the previously created recess has been filled with insulator.
Figures 27B, 27C:
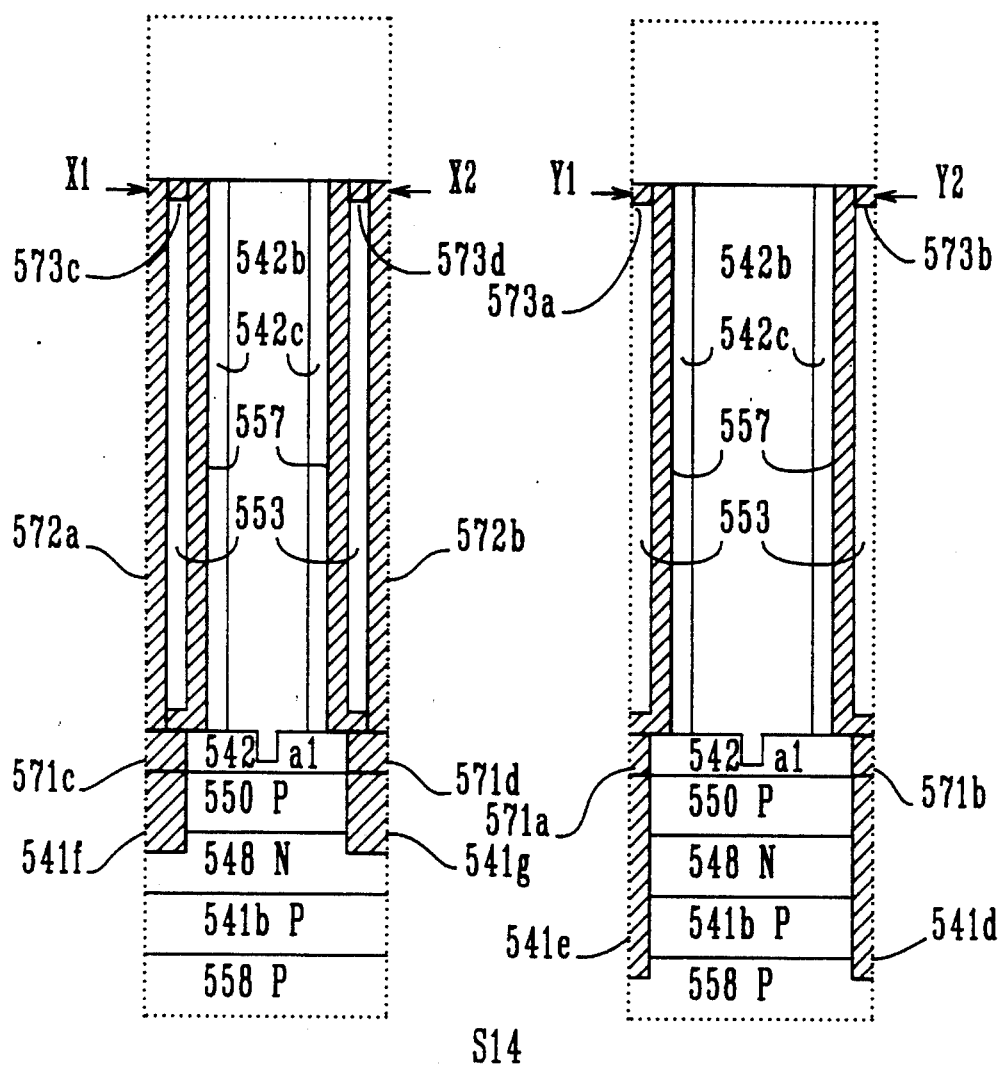

14: FILL PILLAR SURROUNDS. The trench above the conductive material 553 surrounding the pillars is then filled with insulator, then back etched or planarized in the manner of step 2 as shown in 573a, b, c and d. (FIGS. 27a, b & c.)

Figure 28A:
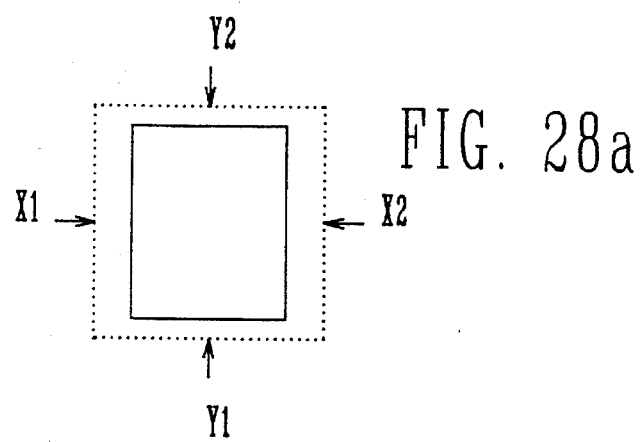
FIGS. 28a, 28b and 28c are respectively a top sectional and two side sectional views of the results of a next subsequent step in the fabrication of the columnar cell structure, where an ohmic contact layer has been added, then patterned and etched.
Figures 28B, 28C:
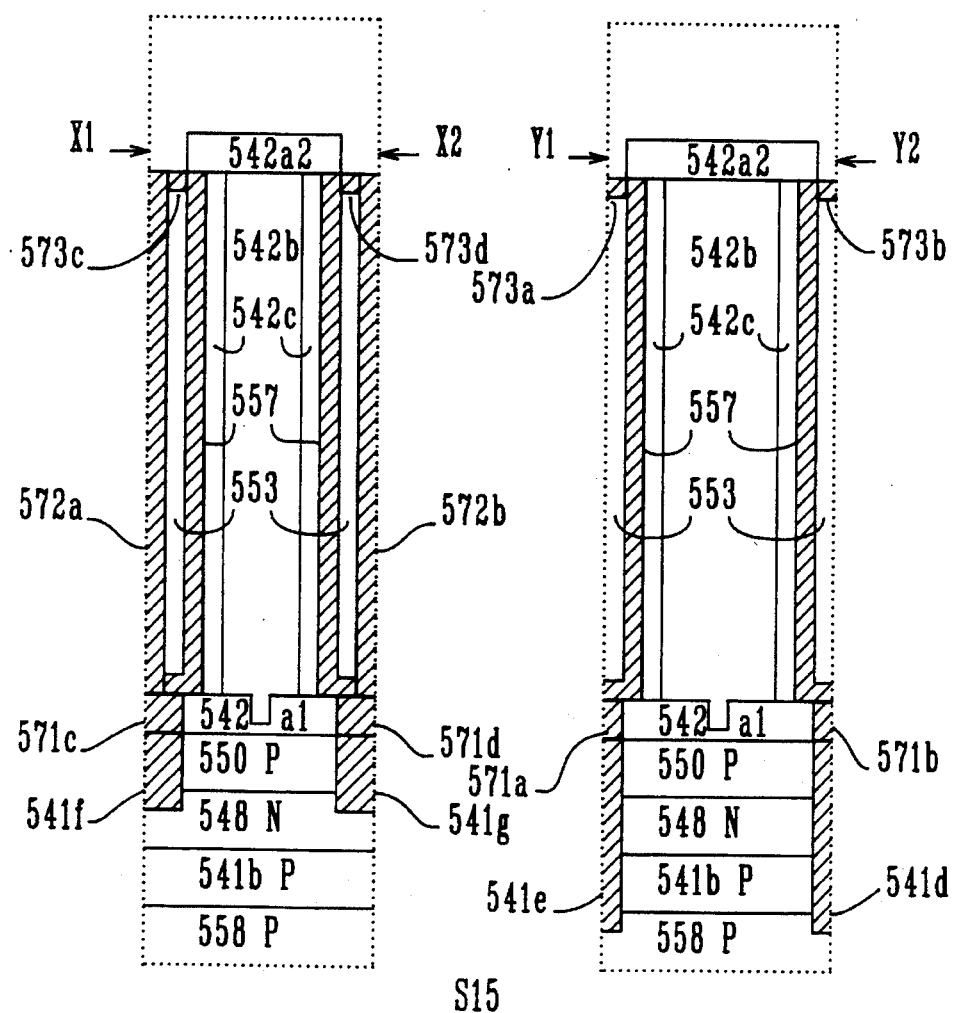

15: DEPOSIT AND PATTERN THE METAL LAYER. A layer of material for ohmic contact is again deposited and patterned in the manner of step 4 so as to create contact structures 542a2. It should be noted that if the center electrode material 542b/c is of doped polysilicon, then either 542a1 or 542a2 need not be included as long as the 542b/c material matches the doping type of the adjacent (contacted) silicon. If material 542b/c is an ohmic contacting metal, then both 542a1 and 542a2 can be eliminated. (FIGS. 28a, b & c.)

Figure 29A:
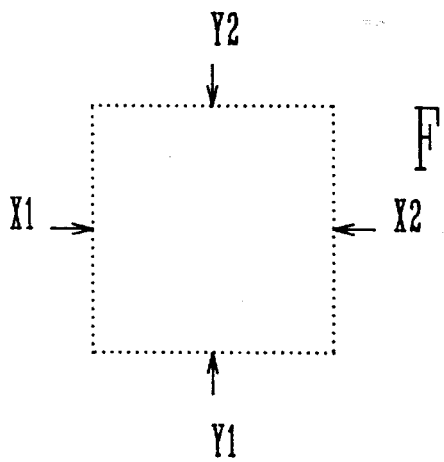
FIGS. 29a, 29b and 29c are respectively a top sectional and two side sectional views of the results of a next subsequent step in the fabrication of the columnar cell structure, where a polysilicon diode has been added above the ohmic contact.
Figures 29B, 29C:
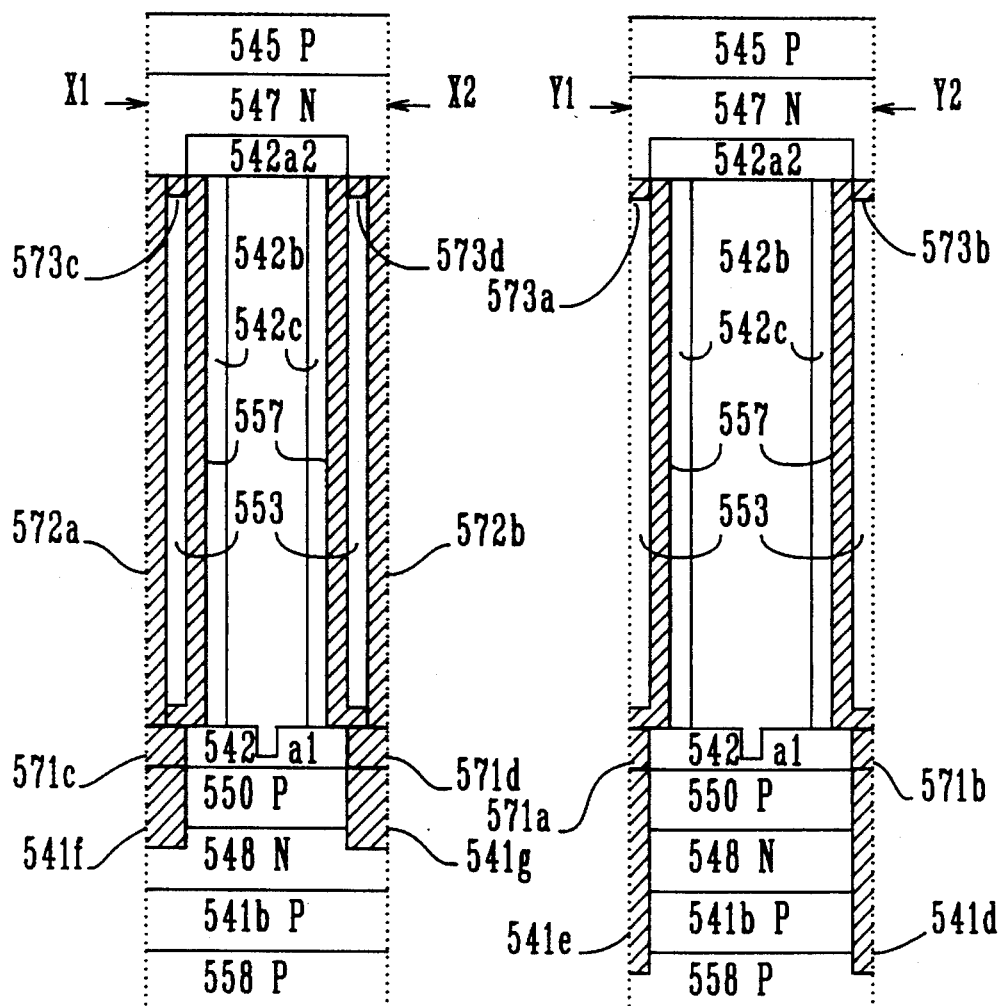

16: CREATE POLYSILICON UPPER DIODE. Continuous polysilicon layers 547 N and 545 P (of the indicated dopings) are then deposited so as to create polysilicon diodes above the pillar tops by standard means for creating polysilicon diodes. If laser recrystalization techniques are used, recrystalization can be caused at the regions above each pillar where the materials used below can accept the associated momentary heat. If alumiminum has been used below rather than a preferred more refractory metal such as CVD tungsten (particularly if nearby such as at contact 542a2) then normal prudence would encourage making N type layer 547 N thicker, or perhaps recrystalizing a thinner initial sublayer of P type layer 545 P so as to minimize heat dissipation. The rest of layer 545 P would then be added above this layer. Short laser dwell times (sufficient to recrystalize a single diode) followed by an off period (at least in the local region just heated) are preferred if laser recrystalization is used. Use of standard large crystal grain polysilicon diodes such as the variety common in solar cells can potentially be used without further recrystalization if well known limitations of this type of diode are acceptable in the end use application of the cell. (FIGS. 29a, b & c.)

It should be noted here that conventional thin film transistor (TFT) technology offers a useful alternative technique for forming the upper diode structures, for those skilled in this art.

Figure 30A:
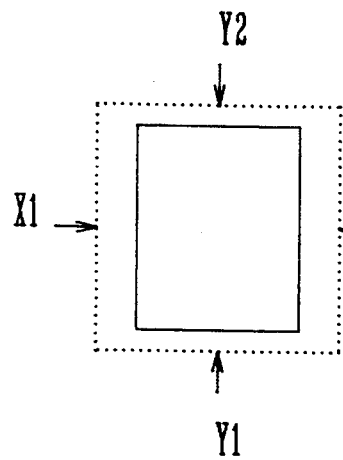
FIGS. 30a, 30b and 30c are respectively a top sectional and two side sectional views of the results of a next subsequent step in the fabrication of the columnar cell structure, where trenches have been etched around the central portions of the polysilicon diode structures.
Figures 30B, 30C:
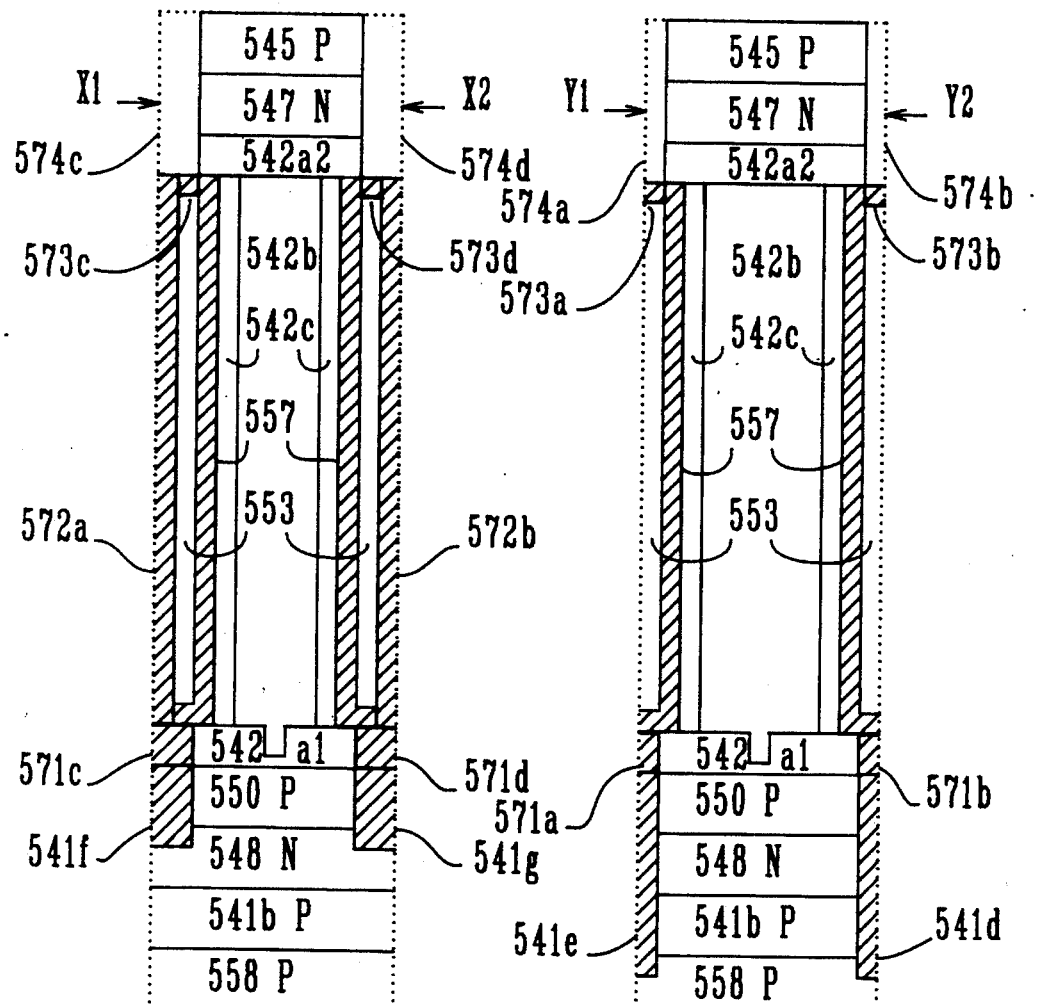

17: TRENCH-ISOLATE UPPER DIODES. Trenches 547a, b, c and d surrounding upper diodes 547 N - 545 P are etched simultaneously using the etching techniques of the preceding lower trench etching. (FIGS. 30a, b & c.)

Figure 31A:
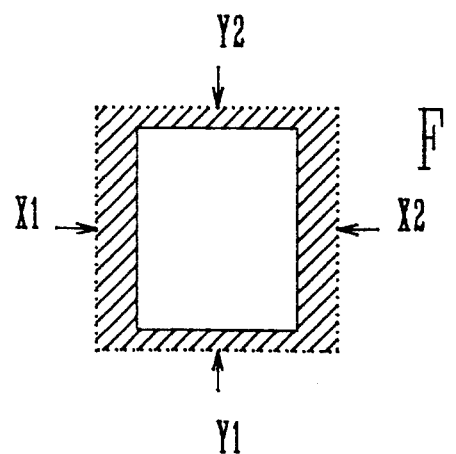
FIGS. 31a, 31b and 31c are respectively a top sectional and two side sectional views of the results of a next subsequent step in the fabrication of the columnar cell structure, where the previously created trenches have been filled with a deposited insulator, and this insulator has been etched back.
Figures 31B, 31C:
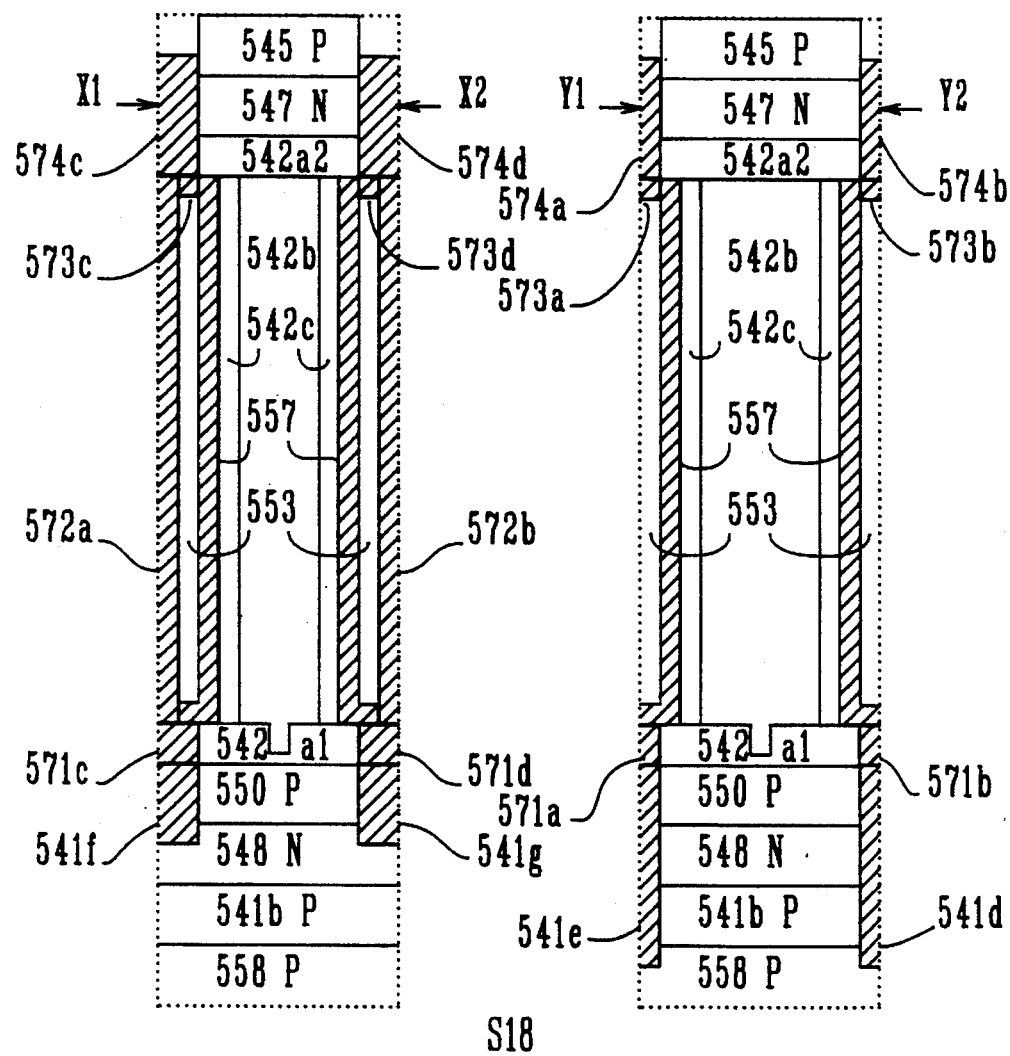

18: FILL ISOLATING TRENCHES. Trenches 547a, b, c and d are then filled with insulator such as CVD silicon dioxide as with the preceding trench fills. This insulator is then selectively etched back down to a height just above the top of layer 547 N. (FIGS. 31a, b & c.)

19: DEPOSIT ADDITIONAL CONDUCTOR. Additional conductive material such as P type polysilicon or preferably CVD tungsten is deposited to omnidirectionally coat the top of the structures above the wafer, thus filling the isolating trenches of step 18. This material is then etched back or planarized in the manner of the preceding steps so that the remaining material 575a and b fills the trenches of step 18, and so that it is equal in height to the top of P type region 545 P. (FIGS. 32a, b & c.)

Figure 33A:
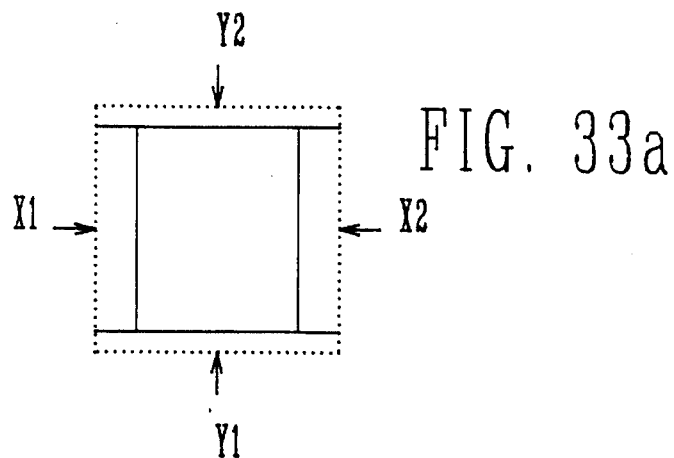
FIGS. 33a, 33b and 33c are respectively a top sectional and two side sectional views of the results of a next subsequent step in the fabrication of the columnar cell structure, where the previously deposited conductor as been patterned and trench etched.
Figures 33B, 33C:
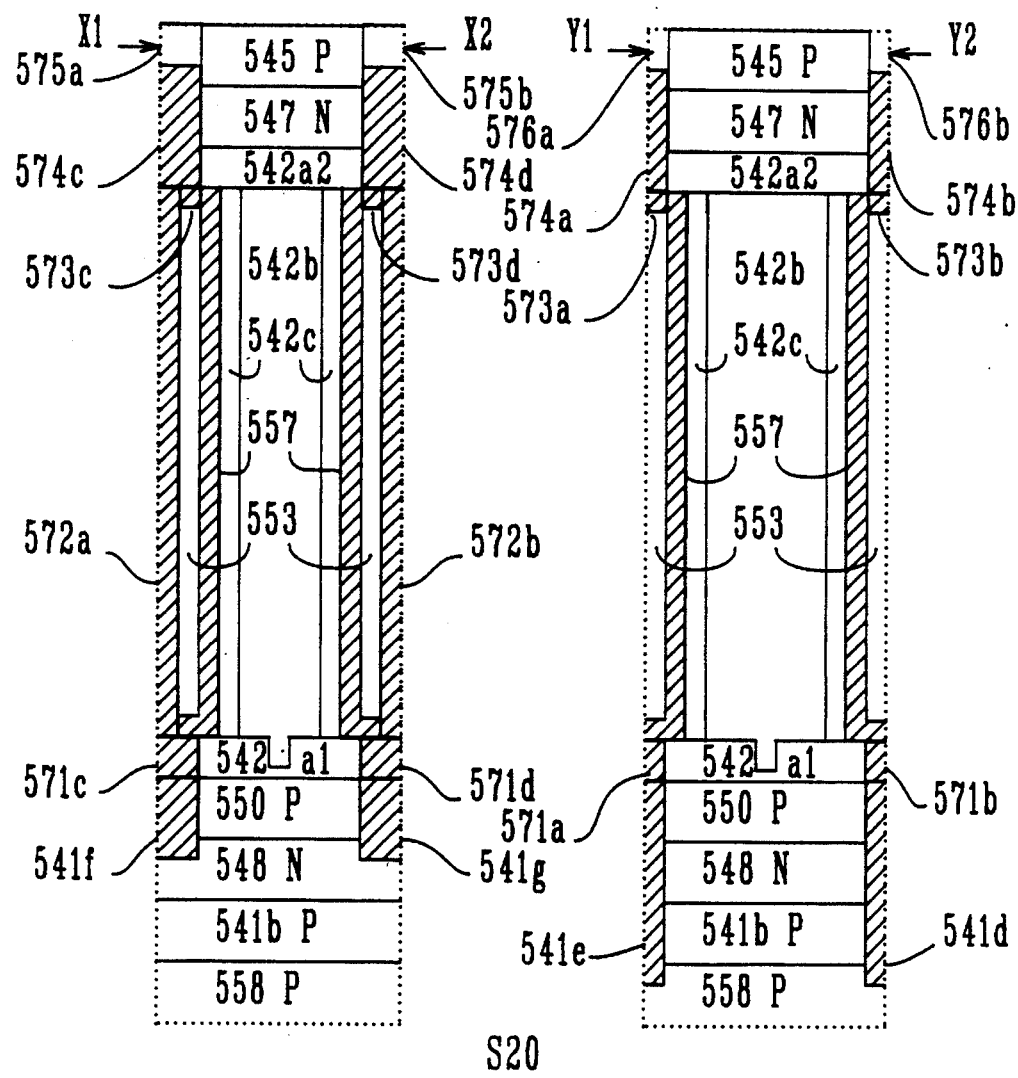

20: PATTERN AND ETCH UPPER CONTROL LINES. The conductive material of step 19 is then patterned and etched by standard means such as RIE so as to define control lines extending in the first axis, and effectively extending isolation trenches 574a and b upward, as shown at 576a and b. (FIGS. 33a, b & c.)

Figure 34A:
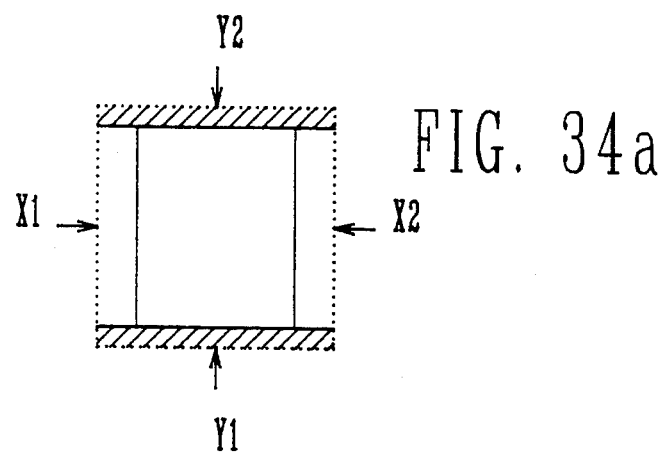
FIGS. 34a, 34b and 34c are respectively a top sectional and two side sectional views of the results of a next subsequent step in the fabrication of the columnar cell structure, where previously etched trenches have been filled with insulator.
Figures 34B, 34C:
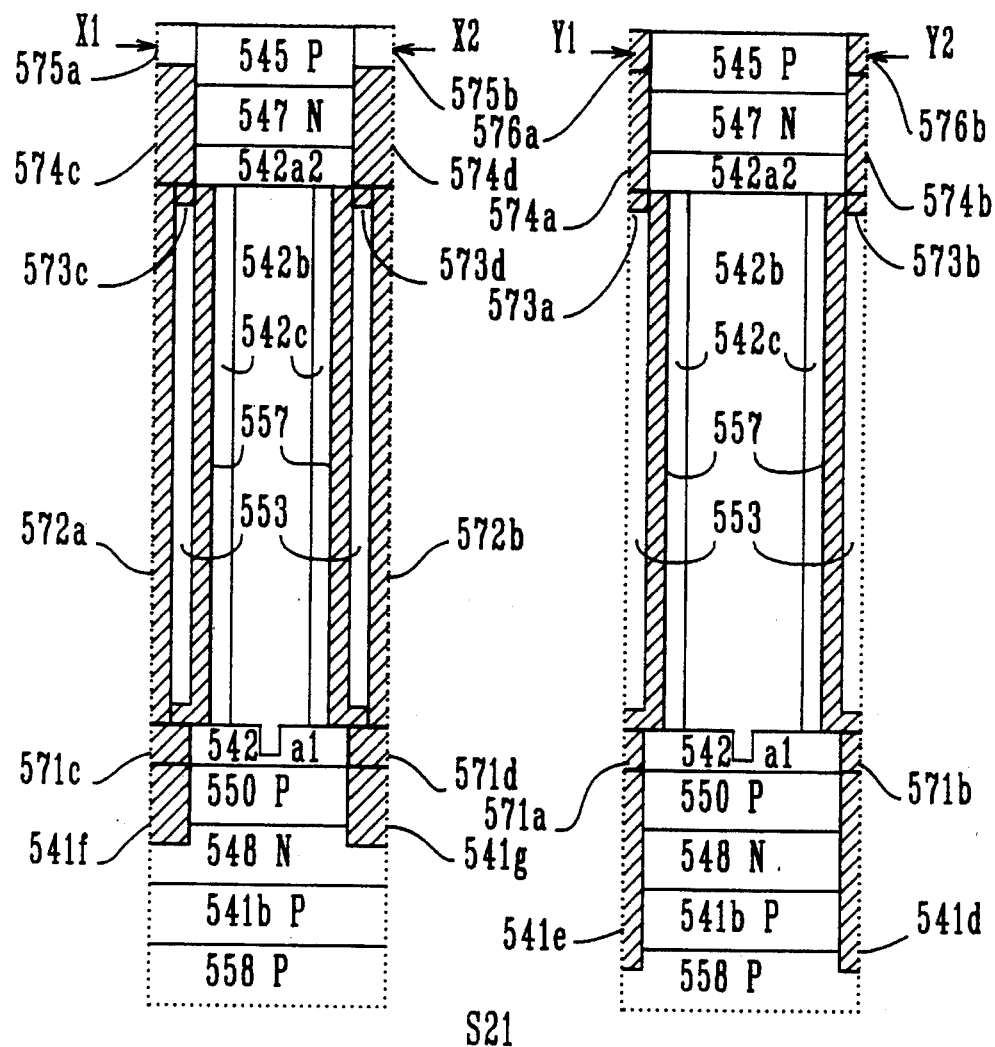

21: FILL ISOLATING TRENCHES. These upper extensions 576a and b of isolation trenches 574a and b are then filled with insulating material such as CVD silicon dioxide in the manner of the prior insulating fills, and then etched back or planarized as before. (FIGS. 34a, b & c.)

22: PASSIVATION. A final passivation coating would normally be added (not shown), or the material of the prior step 21 can be left without etch back or planarization (not shown) so as to serve this purpose.

In the foregoing steps: Contemporary polished planarization techniques are preferred for planarization. Polysilicon depositions shown to be conductively doped are preferred to be in situ doped depositions. As a reminder to the processing engineer, contemporary standard etchants which select silicon, metal or oxide individually against the other two should be used where such combinations can be seen on inspection to be exposed to the etching process. Parylene (such as Parylene N) offered by Specialty Coating Systems (Union Carbide), Clear Lake, Wis., is a useful alternative method for use where insulator was previously described as deposited by CVD,, particularly when the fabricator is not familiar with means of eliminating voids between silicon dioxide depositions on vertical walls, and where such voids are desired to be without potentially degrading trapped reactant gases, so as to prolong the life of the cell. As with dry etch removal of photomasks, oxygen (O2) is the preferred etchant for Parylene.

What is claimed is:

1. An electronic data memory containing an array of cells wherein all such cells each have one connection to a conductive nominal column, and one connection to each of a pair of conductive nominal rows, each cell comprising:

(a) a capacitor, a first plate of which is connected to the conductive column;

(b) a first columnar stack of semiconductive doped regions fabricated without detail specification across the cross-section of the column except for column surrounding insulation where required, where one end of the column is connected to the first row of the pair, and where the other end of the column is connected to a second plate of the capacitor, where one or more semiconductive doped regions may be connected laterally through the sides of the column to adjacent like regions as part of a continuing trace;

(c) a second columnar stack of semiconductive doped regions fabricated without detail specification across the cross-section of the column except for column surrounding insulation where required, where one end of the column is connected to the second plate of the capacitor, and where the other end of the column is connected to the second row of the pair, where one or more semiconductive doped regions may be connected laterally through the sides of the column to adjacent like regions as part of a continuing trace;

(d) the columns of the array each being controlled by a drive circuit which causes charge to be conducted to and from cells in the array;

(e) the first row of each row pair being connected to a drive circuit which causes charge to be conducted to cells of the array;

(f) a discharge drive circuit connected to the other row of each row pair which causes charge to be conducted away from the cells of the array;

(g) sensing circuits which can sense differences in the amount of charge either charging or discharging the cells in the array;

(h) wherein selection of a given column and charging row or rows causes the capacitor or capacitors of the selected cell or cells at the column-row intersection or intersections to be selectively charged;

(i) wherein the selection of a given column and a given discharging row or rows causes the capacitor or capacitors of a selected cell or cells in the array to be selectively discharged or reverse charged;

(j) where the discharge and/or charge voltage or voltages, or current or currents, can be selectively sensed so as to ascertain charge status of a selected cell's capacitor;

(k) status result of that sensing or those sensings being made available outside the aforementioned memory circuit;

(l) wherein groups of columns in the array are formed by columnar shaped monolithic integrated circuit dice, and wherein interconnections which allow continuation of rows and columns between monolithic dice are formed from added circuit jumper traces by deposition and etching of material which forms or materials which form isolated conductive links, these links forming interconnections between adjacent traces of the dice;

(m) wherein fault regions within the array are excised by removal of conductive column material above and below a faulty cell or cells in a row or group of rows, and wherein conductive material at or between ends of a faulty row or rows is excised to isolate the faulty cell or cells between the column excise points and the row excise points;

(n) wherein row traces leading to and from excised rows are interconnected to bypass traces by melting and joining overlapping conductors to form electrical interconnections which create each bypass.

2. A memory structure as defined in claim 1 fabricated on a die having a substantially planar primary surface, wherein said memory structure comprising said first columnar stack of semiconductive doped regions, said capacitor, and said second columnar stack of semiconductive doped regions are all arranged to substantially center on a single columnar axis which is substantially perpendicular to said substantially planar primary surface.

3. An electronic integrated circuit memory element structure comprising (a) at least a plurality of electronic integrated circuit components which are semiconductor devices, said electronic integrated circuit memory element structure occupying an integrated circuit die having a general plane which is predominate, (b) where fabrication process steps to create said electronic integrated circuit memory element structure include at least one mask which is substantially in said general plane of said integrated circuit die, and substantially perpendicular extension of each said at least one mask, (c) said at least one mask and each said substantially perpendicular extension being substantially oriented around a central axis which is substantially perpendicular to each said at least one mask, (d) said electronic integrated circuit components being stacked in a column which is perpendicular to said general plane, and said central axis of each said electronic integrated circuit component being substantially centered around a central columnar axis which is substantially perpendicular to said general plane which is predominate on said integrated circuit die, (e) said electronic integrated circuit components being stacked in component relationship of an architectural column comprising at least one upper capital component, at least one central component, and at least one lower base component, (f) said electronic integrated circuit memory element structure being an element of a memory composed of one or more such electronic integrated circuit memory element structures, said electronic integrated circuit memory element structures being memory cells, and (g) said electronic integrated circuit memory element structure comprising conductive means for both reading and writing to said electronic integrated circuit memory element structure.

4. An electronic integrated circuit memory element structure as defined in claim 3.

(a) where central structural portions of said components are bounded at least at some point in said fabrication process by trenches extending in at least one axis of said general plane which is predominate, (b) where said trenches define each said substantially perpendicular extension of each said at least one mask, said trenches bounding an extending which is solid material, (c) where said trenches act as edges which define a center of each said central structural portion, (d) where said edges may also extend in said at least one axis of said general plane which is predominate, (e) where said centers substantially coincide with or substantially cross through said central columnar axis, (f) and where said trenches may be filled with solid material in subsequent fabrication process steps.

5. An electronic integrated circuit memory element structure as defined in claim 3 where said conductive means for both reading and writing are located at both upper and lower portions of said architectural column.

6. An electronic integrated circuit memory element structure as defined in claim 4 where said conductive means for both reading and writing are located at both upper and lower portions of said architectural column.

7. An electronic integrated circuit memory element structure as defined in claim 3 which is an element of an array which takes the form of a matrix of such electronic integrated circuit memory element structures.

8. An electronic integrated circuit memory element structure as defined in claim 4 which is an element of an array which takes the form of a matrix of such electronic integrated circuit memory element structures.

9. An electronic integrated circuit memory element structure as defined in claim 7 where said conductive means for both reading and writing are located at both upper and lower portions of said architectural column.

10. An electronic integrated circuit memory element structure as defined in claim 8 where said conductive means for both reading and writing are located at both upper and lower portions of said architectural column.

* * * * *